(12) United States Patent
Whetsel

(10) Patent No.: US 8,145,962 B2
(45) Date of Patent: Mar. 27, 2012

(54) TAP INTERFACE SELECT CIRCUIT WITH TMS/RCK OR RCK LEAD

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/102,742

(22) Filed: May 6, 2011

(65) Prior Publication Data

US 2011/0258506 A1 Oct. 20, 2011

Related U.S. Application Data

(62) Division of application No. 12/985,876, filed on Jan. 6, 2011, now Pat. No. 7,962,818, which is a division of application No. 12/840,928, filed on Jul. 21, 2010, now Pat. No. 7,890,829, which is a division of application No. 12/563,775, filed on Sep. 21, 2009, now Pat. No. 7,793,182, which is a division of application No. 11/954,403, filed on Dec. 12, 2007, now Pat. No. 7,613,970, which is a division of application No. 11/293,061, filed on Dec. 2, 2005, now Pat. No. 7,328,387.

(60) Provisional application No. 60/634,842, filed on Dec. 10, 2004.

(51) Int. Cl.
*G01R 31/28* (2006.01)

(52) U.S. Cl. ........................ 714/727; 714/729

(58) Field of Classification Search ................. 714/726, 714/727, 729, 731, 733, 734

See application file for complete search history.

(56) References Cited

U.S. PATENT DOCUMENTS

| 5,222,068 | A  | * | 6/1993  | Burchard ............... 714/727 |
| 6,430,718 | B1 | * | 8/2002  | Nayak ................... 714/727 |
| 6,631,504 | B2 | * | 10/2003 | Dervisoglu et al. ..... 716/136 |
| 7,793,182 | B2 | * | 9/2010  | Whetsel ................. 714/729 |
| 2004/0044491 | A1 | * | 3/2004 | Yonaga et al. .......... 702/118 |
| 2004/0177300 | A1 | * | 9/2004 | Biewenga et al. ....... 714/727 |

OTHER PUBLICATIONS

"IEEE Standard for Reduced-Pin and Enhanced-Functionality Test Access Port and Boundary-Scan Architecture," IEEE Std 1149.7-2009, vol., No., pp.cl-985, Feb. 10, 2010.*

Bhattacharya, D.;, "Hierarchical test access architecture for embedded cores in an integrated circuit," VLSI Test Symposium, 1998. Proceedings. 16th IEEE, vol., No., pp. 8-14, Apr. 26-30, 1998.*

* cited by examiner

*Primary Examiner* — Cynthia Britt

(74) *Attorney, Agent, or Firm* — Lawrence J. Bassuk; W. James Brady; Frederick J. Telecky, Jr.

(57) ABSTRACT

This disclosure describes a reduced pin bus that can be used on integrated circuits or embedded cores within integrated circuits. The bus may be used for serial access to circuits where the availability of pins on ICs or terminals on cores is limited. The bus may be used for a variety of serial communication operations such as, but not limited to, serial communication related test, emulation, debug, and/or trace operations of an IC or core design. Other aspects of the disclosure include the use of reduced pin buses for emulation, debug, and trace operations and for functional operations. In a fifth aspect of the present disclosure, an interface select circuit, FIGS. 41-49, provides for selectively using either the 5 signal interface of FIG. 41 or the 3 signal interface of FIG. 8.

3 Claims, 35 Drawing Sheets

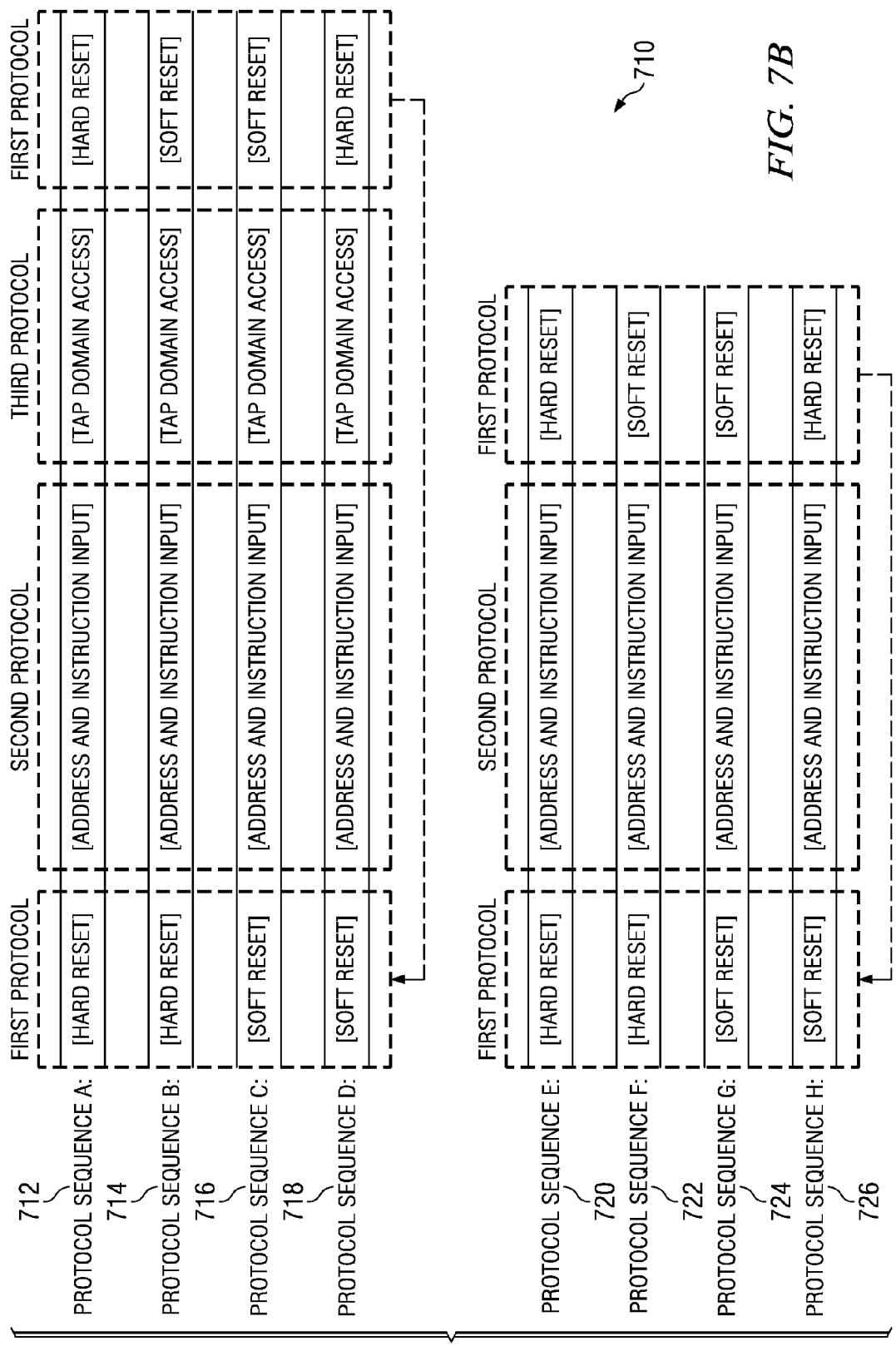

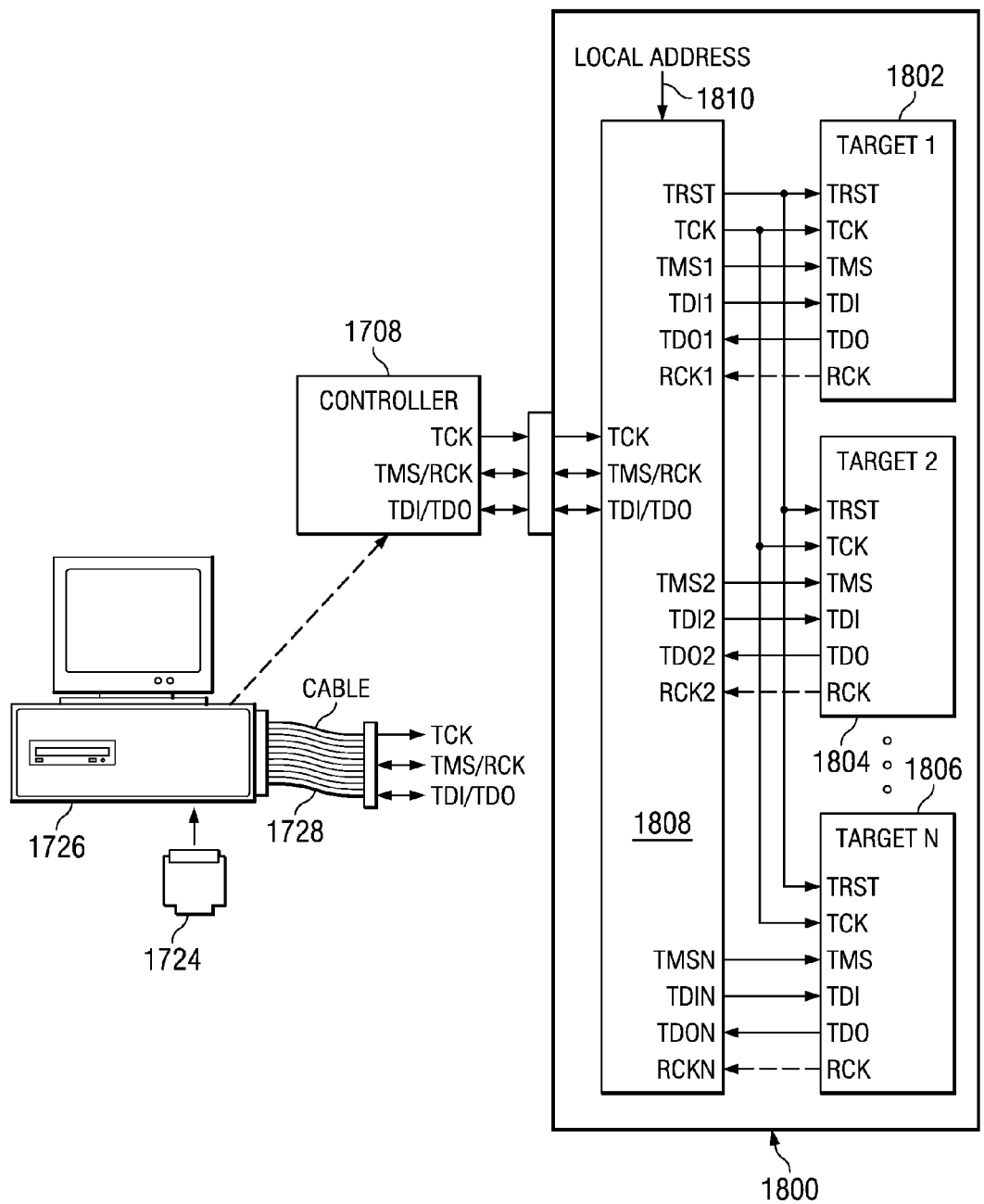

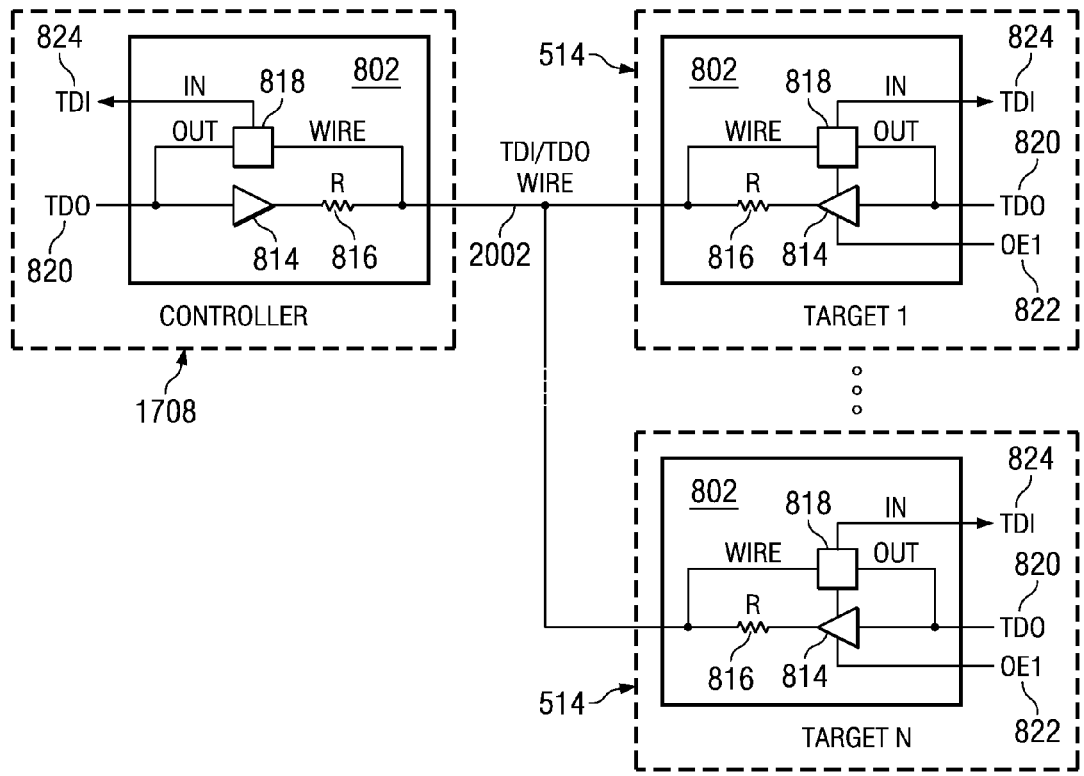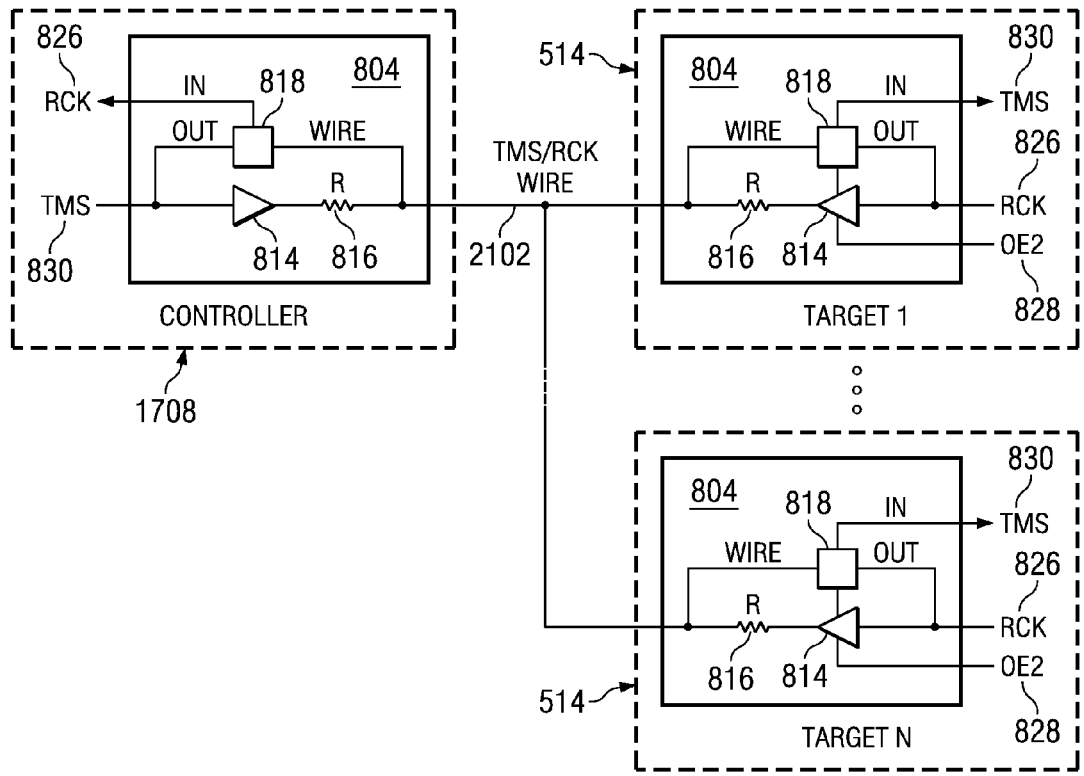

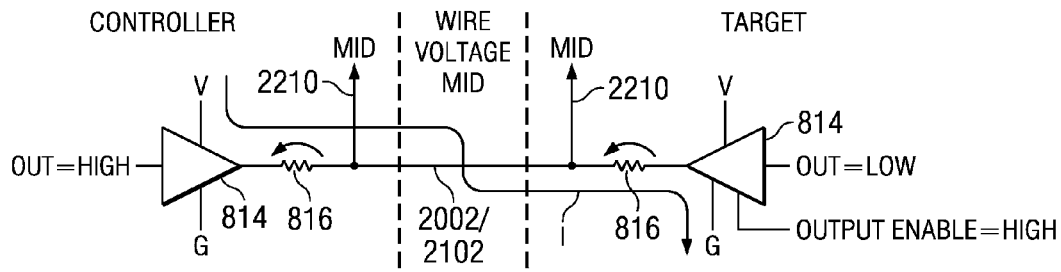
FIG. 23C
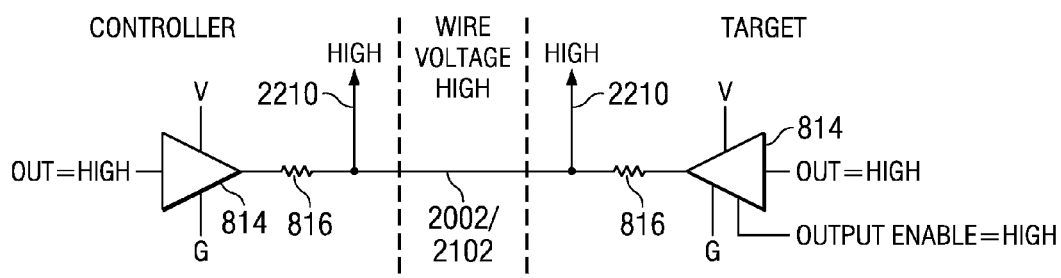
FIG. 23D
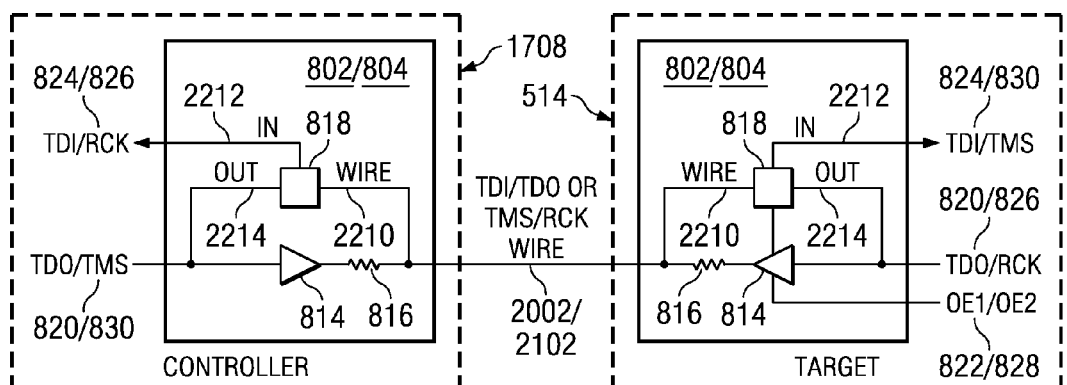
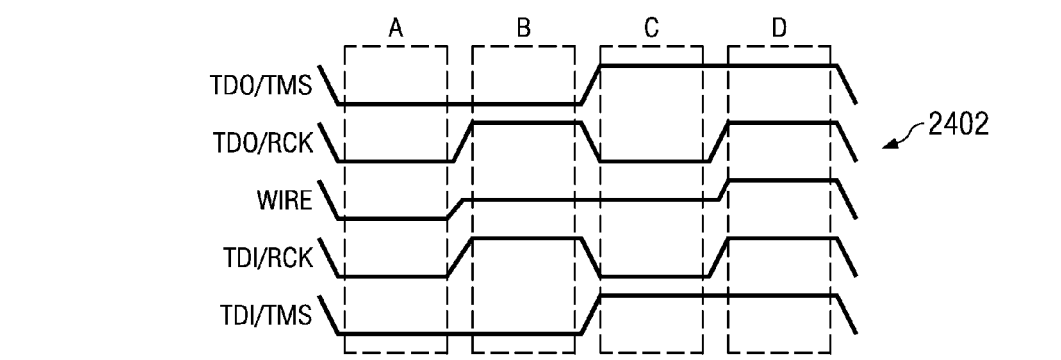
FIG. 24

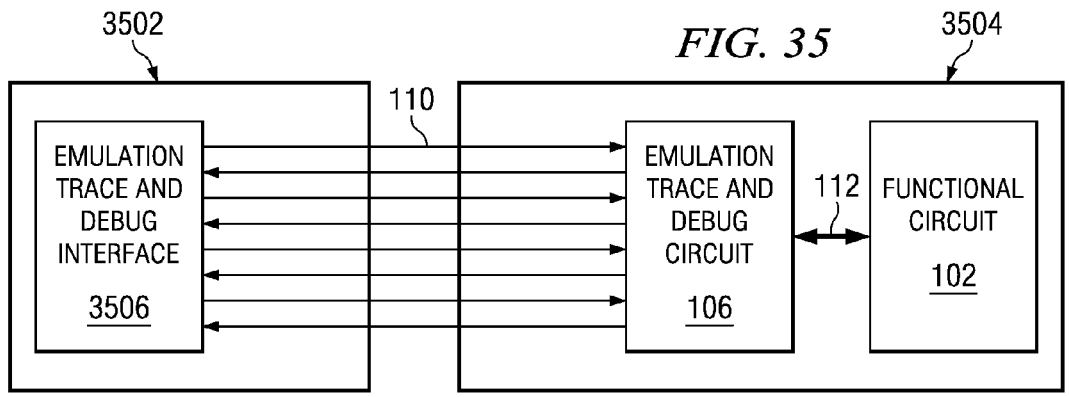
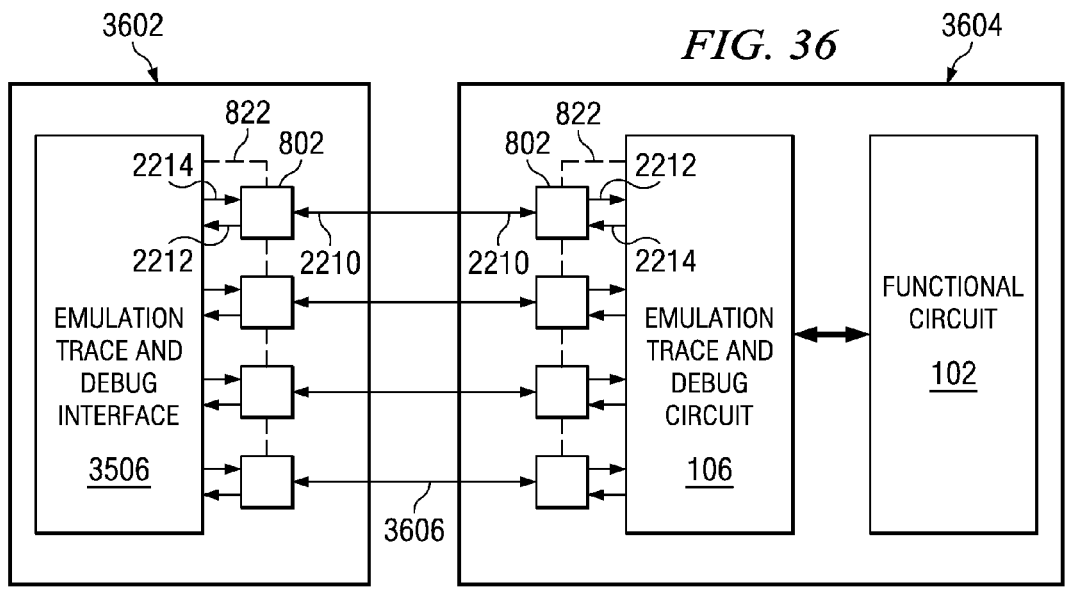
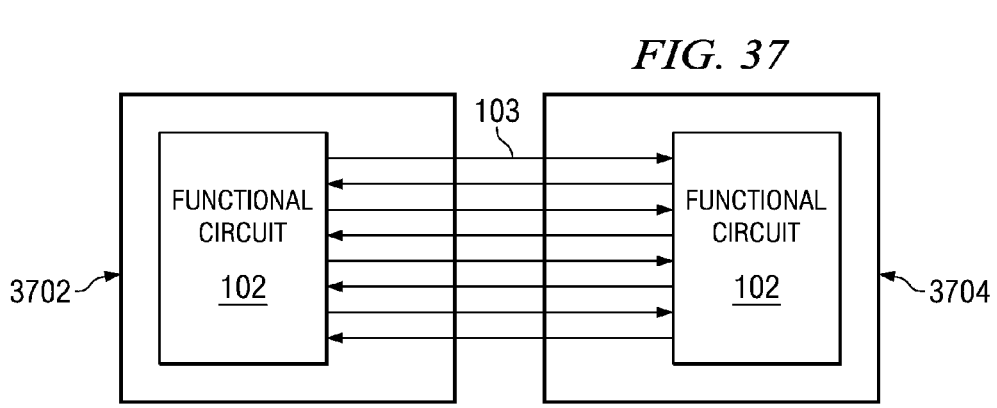

TAP INTERFACE SELECT CIRCUIT WITH TMS/RCK OR RCK LEAD

CROSS-REFERENCE TO RELATED APPLICATION

This application is a divisional of prior application Ser. No. 12/985,876, filed Jan. 6, 2011, now U.S. Pat. No. 7,962,818, issued Jun. 14, 2011;

Which was a divisional of prior application Ser. No. 12/840,928, filed Jul. 21, 2010, now U.S.; 7,890,829, issued Feb. 15, 2011;

Which was a divisional of prior application Ser. No. 12/563,775, filed Sep. 21, 2009, now U.S. Pat. No. 7,793,182, issued Sep. 7, 2010;

Which was a divisional of prior application Ser. No. 11/954,403, filed Dec. 12, 2007, now U.S. Pat. No. 7,613,970, issued Nov. 3, 2009;

Which was a divisional of prior application Ser. No. 11/293,061, filed Dec. 2, 2005, now U.S. Pat. No. 7,328,387, issued Feb. 5, 2008.

Which claims priority from Provisional Application No. 60/634,842, filed Dec. 10, 2004.

This application is related to U.S. patent application Ser. No. 10/983,256, filed Nov. 4, 2004, titled "Removable and Replaceable Tap Domain Selection Circuitry," and U.S. patent application Ser. No. 11/258,315, filed Oct. 25, 2005, titled "2 Pin Bus."

BACK GROUND OF THE DISCLOSURE

This disclosure relates in general to IC or core signal interfaces and particularly to IC or core signal interfaces related to test, emulation, debug, trace, and function operations.

DESCRIPTION OF THE RELATED ART

FIG. 1 illustrates an IC or embedded core circuit 100 containing functional circuits 102, IEEE 1149.1 (JTAG) circuit 104, and emulation, debug, and/or trace circuit 106. The functional circuit 102 communicates externally of the IC or core via bus terminals 103. The 1149.1 circuit communicates externally of the IC or core via bus terminals 108 and internally to the functional circuit 102 via bus 114. The emulation, debug, and/or trace circuit communicates externally of the IC or core via bus terminals 110 and internally to the functional circuit 102 via bus 112. As seen, the 1149.1 circuit 104 comprises data registers 116, instruction register 118, mux 122, falling clock edge FF 124, tristate buffer 128, and test access port (TAP) controller 120. The 1149.1 circuit 104 has external terminals on bus 108 for a test data input (TDI) 132, a test mode select (TMS) 134, a test clock (TCK) 136, a test reset (TRST) 138, and test data output (TDO) 140 signals. The data registers 116 comprise a set of serially accessible registers, some providing input and output to functional circuit 102 via bus 114. The registers can be used for performing boundary scan test operations on functional bus terminals 103, performing internal scan testing of the functional circuit 102, and/or supporting debug, trace, and/or emulation operations on the functional circuit 102. As indicated, a power up clear (PUC) circuit 130, which is a circuit for resetting or initializing a given circuit upon application of power, may be used instead of or in combination with the TRST terminal to set the state of the Tap 120 in the 1149.1 circuit 104.

FIG. 2 illustrates an IC 200 containing four JTAG circuits 104. One JTAG circuit 104 is associated with non-core circuitry in the chip and is referred to as the Chip Tap Domain 202. The other JTAG circuits 104 are each associated with circuitry of an embedded core and are referred to as Core Tap Domains 204-208. The Tap domains 202-208 are shown in Tap domain region 201. The JTAG circuit 104 bus terminals 108 of each Tap domain 202-208 may be coupled to chip terminals 212-220 via a Tap Domain Selection circuit 210. Once coupled, the JTAG circuit 104 of a selected Tap domain 202-208 may be accessed via chip terminals 212-220 for test, debug, trace, and/or emulation operations by an external controller. A variety of Tap domain selection circuits 210 that could be used in this example are described in a referenced paper entitled "An IEEE 1149.1 Based Test Access Architecture for ICs with Embedded Cores" authored by Whetsel and presented at the IEEE International Test Conference in November of 1997.

When using a Tap Domain Selection circuit as shown in FIG. 2 it is best to remove the TDO tristate buffer 128 of JTAG circuits 104, if possible, to allow the flip flop 124 of the JTAG circuit 104 to directly drive the TDO signal on the interface 108 between the JTAG circuit 104 and the Tap Domain Selection circuit. This practice prevents floating (i.e. tristate) TDO signal lines inside the IC/core.

FIG. 3 illustrates an IC or embedded core circuit 300 containing functional circuits 102, JTAG circuit 302, and emulation, debug, and/or trace circuit 106. The IC 300 is identical to IC 100 of FIG. 1 with the exception that JTAG circuit 302 is different from JTAG circuit 104. The difference is that the JTAG circuit 302 includes a flip flop (FF) in the TCK path to the Tap 120. The D input of the FF is coupled to the TCK signal 136, the Q output of the FF is coupled to the TCK input of the Tap 120, and the clock input of the FF is coupled to a functional clock (FCK) output 306 from function circuit 102. The Q output of the FF is also output as a return clock (RCK) output on terminal 308 of bus 310. The difference between bus 108 of FIG. 1 and bus 310 of FIG. 3 is the additional RCK signal 308. The use of FF 304 in JTAG circuit 302 forces the TCK signal from an external controller to be sampled by the FCK 306 before it is allowed to be input to the Tap 120. The RCK output 308 to the external controller indicates to the external controller when the TCK signal has been sampled by the FCK. For example, if the external controller sets TCK 136 high, the RCK signal 308 output will go high when the FCK 306 clocks the TCK into FF 304. When the controller sees a high on RCK, it can set TCK low and again wait for the RCK to indicate when the low on TCK has been clocked into the FF 304 by the FCK 306. This method of operating the JTAG circuit 302 allows the external controller to synchronize the operation of the TCK signal to the frequency of the FCK signal, using the handshaking operation provided by the RCK signal. This TCK handshaking technique, while not compliant to the IEEE 1149.1 standard, is being designed into embeddable cores provided by ARM Ltd. Thus the technique must be adopted in ICs that use embedded cores from ARM Ltd.

FIG. 4 illustrates an IC 400 containing four JTAG circuits 302. One JTAG circuit 302 is associated with non-core circuitry in the chip and is referred to as the Chip Tap Domain 402. The other JTAG circuits 302 are each associated with circuitry of an embedded core and are referred to as Core Tap Domains 404-408. The Tap domains 402-408 are shown in Tap domain region 401. The JTAG circuit 302 bus terminals 310 of each Tap domain 402-408 may be coupled to chip terminals 412-422 via a Tap Domain Selection circuit 410. Once coupled, the JTAG circuit 302 of a selected Tap domain 402-408 may be accessed via chip terminals 412-422 for test, debug, trace, and/or emulation operations by an external controller. The Tap domain selection circuit 410 is similar to the Tap domain selection circuit 210 of FIG. 2 with the exception that it includes additional circuitry for coupling the RCK 308 output of a selected Tap domain 402-408 to the RCK chip terminal 422.

SUMMARY OF THE DISCLOSURE

In a first aspect of the present disclosure, a method and apparatus is described in FIGS. 5-30 for addressing, instructing, and accessing Tap Domains in ICs or core circuits using a reduced number of signal terminals. In a second aspect of the present disclosure, a method and apparatus is described in FIGS. 31-34 for accessing a target Tap domain in an IC or core circuit using a reduced number of signal terminals. In a third aspect of the present disclosure, a method and apparatus is described in FIGS. 35-36 for reducing the number of IC or core signal terminals involved with emulation, debug, and trace operations. In a fourth aspect of the present disclosure, a method and apparatus is described in FIGS. 37-40 for reducing the number of IC or core signal terminals involved in function I/O operations. In a fifth aspect of the present disclosure, a method and apparatus is described in FIGS. 41-49 for selectively using either the 5 signal interface of FIG. 41 or the 3 signal interface of FIG. 8.

DESCRIPTION OF THE VIEWS OF THE DRAWINGS

FIG. 7B illustrates sequences of first, second, and third protocols of the present disclosure.

FIG. 18 illustrates the connection between an external controller and a circuit containing the present disclosure that is interfaced to standard legacy JTAG circuits in ICs or cores.

FIG. 20 illustrates the TDI/TDO connection between I/O buffers of the present disclosure existing in an external controller and in target ICs or cores.

FIG. 21 illustrates the TMS/RCK connection between I/O buffers of the present disclosure existing in an external controller and in target ICs or cores.

FIG. 23A-23D illustrates the operation of the output buffer of the I/O circuits of the present disclosure existing in an external controller and a target IC or core.

FIG. 24 illustrates the four cases of signal flow between the I/O buffer of an external controller and the I/O buffer of a target IC or core.

FIG. 32 illustrates an interface between an external controller and a non-standard JTAG circuit within an IC or core.

FIG. 35 illustrates an interface between an external controller and emulation, debug, and trace circuits within an IC or core.

FIG. 36 illustrates a reduced interface between an external controller and emulation, debug, and trace circuits within an IC or core according to the present disclosure.

FIG. 37 illustrates a functional interface between first and second functional circuits of an IC or core.

DETAILED DESCRIPTION

Figure 5:
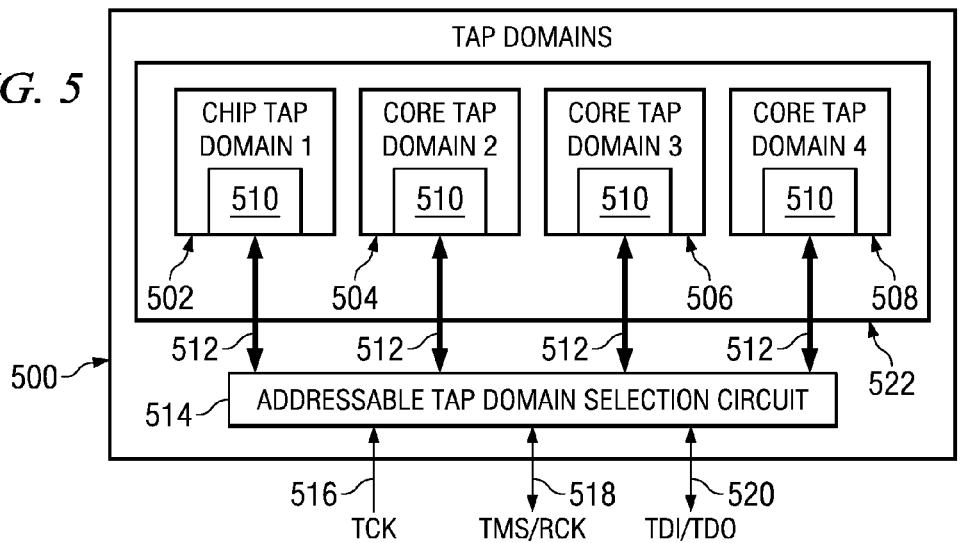
FIG. 5 illustrates an IC or core including the addressable Tap Domain Selection circuit of the present disclosure.

FIG. 5 illustrates an IC 500 including the test, debug, trace, and/or emulation architecture of the present disclosure. The architecture includes a Tap domain region 522 comprising individual Tap domains 502-508. Each Tap domain 502-508 includes a JTAG circuit 510, which can be either the conventional JTAG circuit 104 or the modified JTAG circuit 302. Each JTAG circuit 510 is coupled to an Addressable Tap Domain Selection circuit 514 via buses 512. If a JTAG circuit 510 is a conventional JTAG circuit 104, its bus 512 will be the same as bus 104. If JTAG circuit 510 is a modified JTAG circuit 302, its bus 512 will be the same as bus 310.

Figure 2:
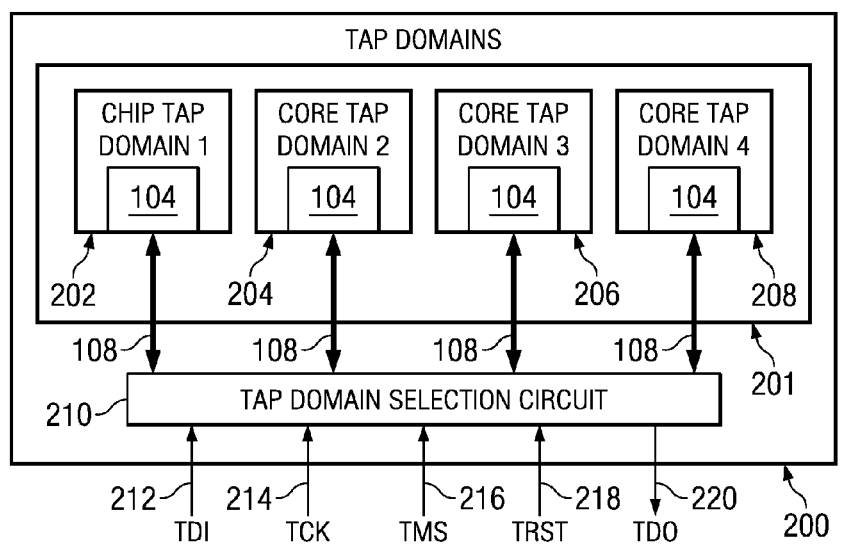
FIG. 2 illustrates an IC or core having plural standard JTAG circuit Tap Domains and Tap Domain selection circuitry.
Figure 4:
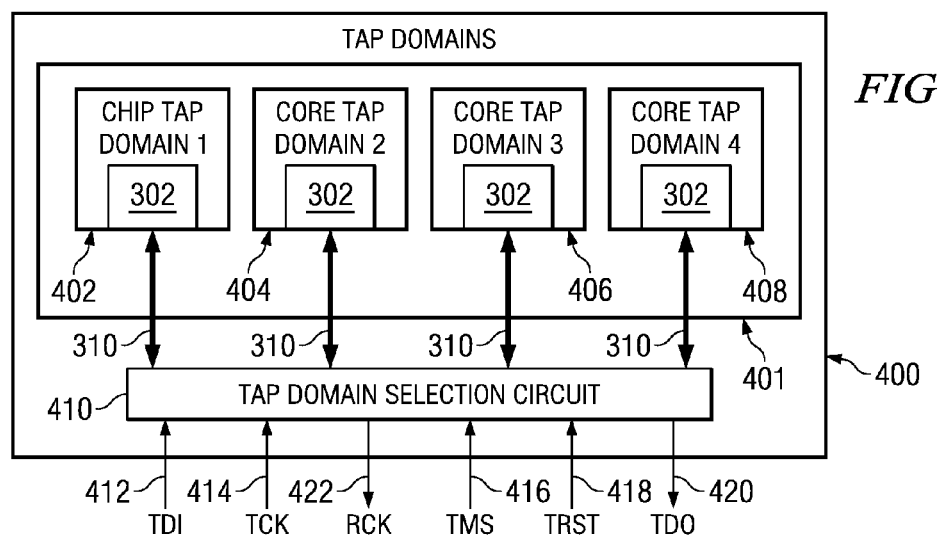
FIG. 4 illustrates an IC or core having plural non-standard JTAG circuit Tap Domains and Tap Domain selection circuitry.

Addressable Tap domain selection circuit 514 is coupled to external IC terminal signals TCK 516, TMS/RCK 518, and TDI/TDO 520. The TCK 516 signal is the same as the TCK 214 signal shown in FIGS. 2 and 4, with the exception that, in addition to operating as a clock input to the IC 500 from an external controller, the TCK 516 of FIG. 5 can also be operated as a data input and a control input from the external controller, according to a first protocol defined by the present disclosure. The TMS/RCK 518 signal is a signal defined by the present disclosure to operate as a signal that can serve as either an input signal to the IC 500 from an external controller or as a simultaneous input/output between the IC 500 and the external controller. Similarly, the TDI/TDO 520 signal is a signal defined by the present disclosure to operate as a signal that can serve as either an input signal to the IC from an external controller or as a simultaneous input/output between the IC and the external controller.

Figure 6:
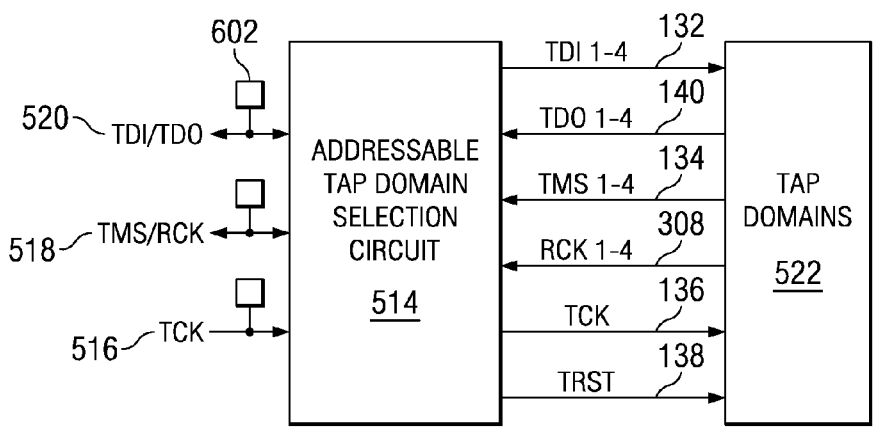
FIG. 6 illustrates more detail view of the addressable Tap Domain Selection circuit of the present disclosure.

FIG. 6 illustrates in more detail the connections between the Addressable Tap Domain Selection circuit 514 and the Tap Domains 510 in Tap domain region 522. Selection Circuit 514 is coupled externally of the IC via signal terminals TCK 516, TMS/RCK 518, and TDI/TDO 520. As seen, pull up elements, pull down elements, or other state holding elements 602 such as bus holders are preferably connected to these terminals to allow them to be set to a known state when they are not externally driven. Selection circuit 514 is coupled to the Tap domains 1-4 in Tap region 522 via TDI 1-4 signals 132, TDO 1-4 signals 140, TMS 1-4 signals 134, RCK 1-4 signals 308, TCK signal 136, and TRST signal 138.

In this example, the Tap region 522 is assumed to contain four Tap domains 510 with all four Tap domains 510 being modified Tap domain 302 types. Thus each of the four Tap domains 510 will have a RCK 308 output (1-4) to the Selection circuit 514. In another example, the Tap region 522 may contain four Tap domains 510, each being conventional Tap domain 104 types, which would eliminate the need for the RCK signal connections to the Selection circuit 514. In still another example, the Tap region 522 may contain mixtures of modified Tap domains 302 requiring RCK signal connections and conventional Tap domains 104 not requiring RCK signal connections. Also while this example shows four Tap domains 510 in Tap region 522, a lesser or greater number of Tap domains 510 (104 or 302 types) may exist in Tap region 522.

The purpose of the Addressable Tap Domain Selection circuit 514 is to allow for an external controller coupled to terminals 516-520 to input an address to the Selection circuit 514 of the IC then load an instruction into the Selection circuit 514 of the IC. The loaded instruction may provide a plurality of control functions within the IC, at least one control function being to control which one or more Tap domains 510 in Tap region 522 is selected for access by the external controller.

Figure 17:
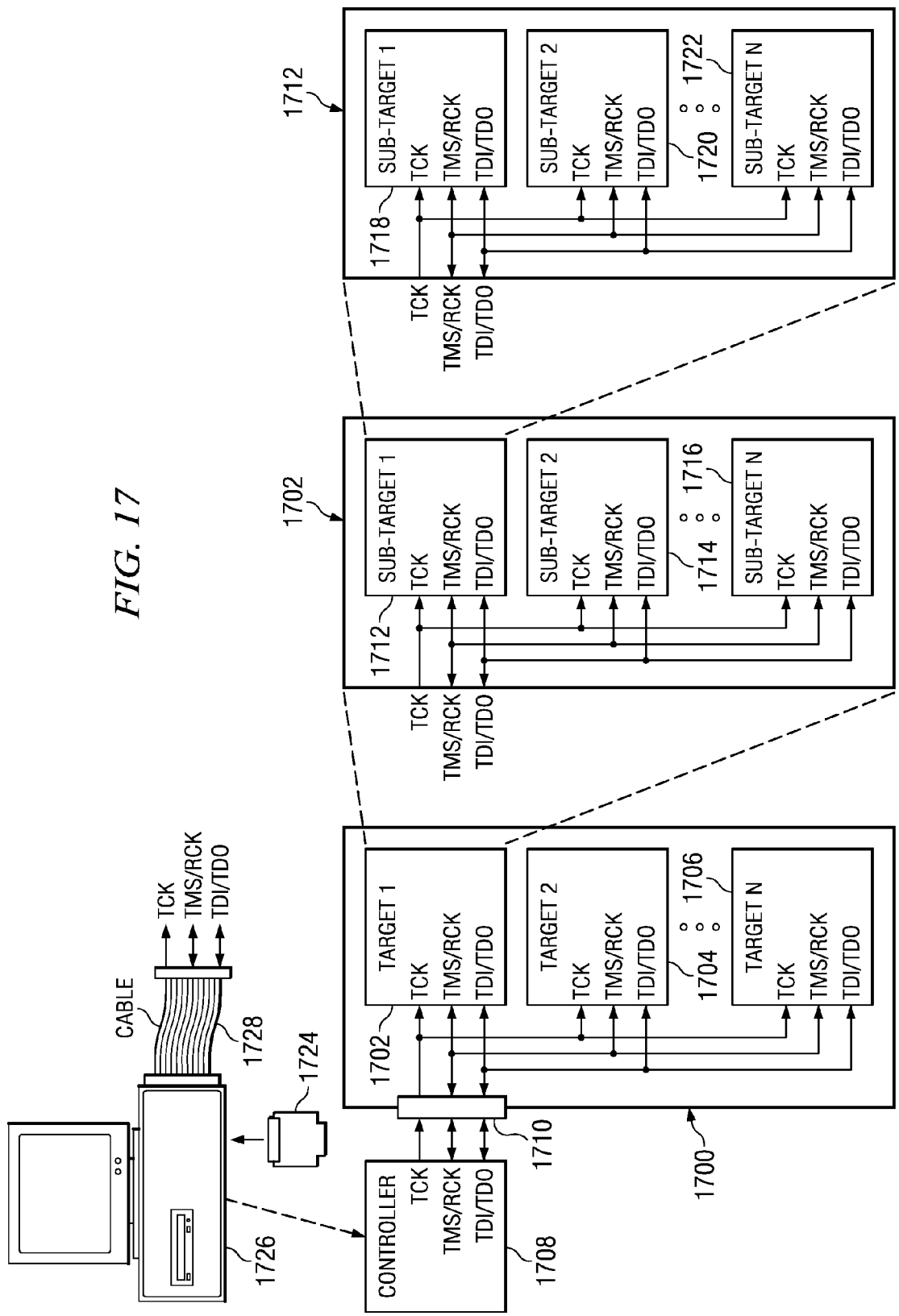
FIG. 17 illustrates the connection between an external controller and the circuitry of the present disclosure existing in ICs or core circuits.

In applications of the present disclosure, a plurality of ICs may be coupled, at some point, to an external controller via terminals 516-520, as depicted in FIG. 17. Each Selection circuit 514 of each IC will have a local and a global address that enables it to input an instruction. The local address, as defined by the present disclosure, is an address capable of uniquely identifying one Selection circuit 514 within a given IC from any other Selection circuit 514 within the same or different IC. The global address is defined as an address that commonly identifies all Selection circuits 514 within any number of ICs. All the Selection circuits 514 of ICs will input the address from the external controller, but only the Selection circuit 514 having an address that matches either the local or global address input will be enabled to further input the instruction. Thus Selection circuits 514 not matching the address input will not input the instruction. These non-addressed Selection circuit 514 will be placed in an idle condition until the next address and instruction input sequence occurs.

Figure 7A:
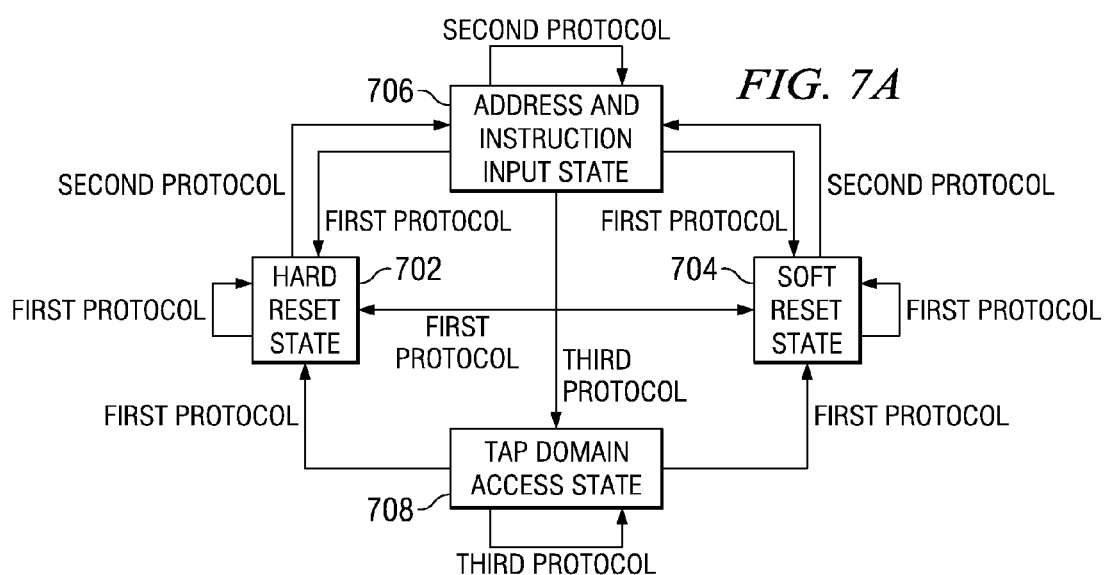
FIG. 7A illustrates the operation of the Tap Domain Selection Circuit of the present disclosure in response to first, second, and third protocols.

FIG. 7A illustrates the high level operation of the Addressable Tap Domain Selection circuit 514 in response to first, second, and third protocols applied to the Selection circuit 514 via terminals TCK 516, TMS/RCK 518, and TDI/TDO 520. The first protocol uses terminals TCK 516 and TMS/RCK 518 to; (1) move the Selection circuit 514 from the Tap Domain Access state 708 to either the Hard Reset state 702 or Soft Reset state 704, (2) move between the Hard Reset state 702 and the Soft Reset state 704, (3) move from the Address & Instruction input state 706 to either the Hard 702 or Soft 704 Reset states, or (4) remain in either the Hard 702 or Soft 704 Reset state. The second protocol uses terminals TCK 516, TMS/RCK 518, and TDI/TDO 520 to move the Selection circuit 514 from the Hard or Soft reset states into the Address & Instruction input state 706 or, if in the Address & Instruction input state 706, to remain in the Address & Input state 706. The third protocol uses terminals TCK 516, TMS/RCK 518, and TDI/TDO 520 to move the Selection circuit 514 from the Address & Instruction Input state 706 into the Tap Domain Access state 708 or, if in the Tap Domain Access state 708, to remain in the Tap Domain Access state 708.

Entry into the Hard reset state 702 fully resets all circuits in both the Selection circuit 514 and the Tap domains 510 in Tap region 522. Entry into the Soft reset state 704 does not fully reset the Selection circuit 514 or Tap domains 510. The Hard and Soft reset states 702-704 serve as starting points for communication sessions using the second protocol in state 706. The Hard and Soft reset states 702-704 also serve as ending points for communication sessions using the second protocol in state 706 and using the third protocol in state 708. Entry into the Address & Instruction input state 706 starts a communication session using the second protocol for inputting the above mentioned address and instruction. Entry into the Tap Domain Access state 708 starts a communication session using the third protocol for accessing the selected Tap Domain(s) 510.

FIG. 7B illustrates examples of "starting and stopping" sequences of first, second, and third, and sequences of first and second protocols.

Protocol sequence A 712 illustrates the sequence of; (1) initially performing a first protocol to enter into or remain in the Hard Reset state 702, (2) switching from performing the first protocol to performing the second protocol to cause entry into the Address & Instruction input state 706 to input an address and instruction, the instruction in this case selecting one or more Tap Domain(s) 510 for access, (3) switching from performing the second protocol to performing the third protocol to enter the Access Tap Domain state 708, for accessing the Tap domain(s) 510 selected by the loaded instruction, and (4) switching from performing the third protocol, after the Tap domain access has been completed, to performing the first protocol to enter the Hard Reset state 702, which terminates the protocol sequence and resets the Selection circuit 514 and the Tap Domains 510.

Protocol sequence B 714 illustrates the sequence of; (1) initially performing a first protocol to enter into or remain in the Hard Reset state 702, (2) switching from performing the first protocol to performing the second protocol to cause entry into the Address & Instruction input state 706 to input an address and instruction, the instruction in this case selecting one or more Tap Domain(s) 510 for access, (3) switching from performing the second protocol to performing the third protocol to enter the Tap Domain Access state 708, for accessing the Tap domain(s) 510 selected by the loaded instruction, and (4) switching from performing the third protocol, after the Tap domain access has been completed, to performing the first protocol to enter the Soft Reset state 704, which terminates the protocol sequence.

Protocol sequence C 716 illustrates the sequence of; (1) initially performing a first protocol to enter into or remain in the Soft Reset state 704, (2) switching from performing the first protocol to performing the second protocol to cause entry into the Address & Instruction input state 706 to input an address and instruction, the instruction in this case selecting one or more Tap Domain(s) 510 for access, (3) switching from performing the second protocol to performing the third protocol to enter the Tap Domain Access state 708, for accessing the Tap domain(s) 510 selected by the loaded instruction, and (4) switching from performing the third protocol, after the Tap domain access has been completed, to performing the first protocol to enter the Soft Reset state 704, which terminates the protocol sequence.

Protocol sequence D 718 illustrates the sequence of; (1) initially performing a first protocol to enter into or remain in the Soft Reset state 704, (2) switching from performing the first protocol to performing the second protocol to cause entry into the Address & Instruction input state 706 to input an address and instruction, the instruction in this case selecting one or more Tap Domain(s) 510 for access, (3) switching from performing the second protocol to performing the third protocol to enter the Tap Domain Access state 708, for accessing the Tap domain(s) 510 selected by the loaded instruction, and (4) switching from performing the third protocol, after the Tap domain access has been completed, to performing the first protocol to enter the Hard Reset state 702, which terminates the protocol sequence and resets the Selection circuit 514 and the Tap Domains 510.

Protocol sequence E 720 illustrates the sequence of; (1) initially performing a first protocol to enter into or remain in the Hard Reset state 702, (2) switching from performing the first protocol to performing the second protocol to cause entry into the Address & Instruction input state 706 to input an address and instruction, and (3) switching from performing the second protocol to performing the first protocol to enter the Hard Reset state 702, which terminates the protocol sequence and resets the Selection circuit 514 and Tap Domains 510.

Protocol sequence F 722 illustrates the sequence of; (1) initially performing a first protocol to enter into or remain in the Hard Reset state 702, (2) switching from performing the first protocol to performing the second protocol to cause entry into the Address & Instruction input state 706 to input an address and instruction, and (3) switching from performing the second protocol to performing the first protocol to enter the Soft Reset state 704, which terminates the protocol sequence.

Protocol sequence G 724 illustrates the sequence of; (1) initially performing a first protocol to enter into or remain in the Soft Reset state 704, (2) switching from performing the first protocol to performing the second protocol to cause entry into the Address & Instruction input state 706 to input an address and instruction, and (3) switching from performing the second protocol to performing the first protocol to enter the Soft Reset state 704, which terminates the protocol sequence.

Protocol sequence H 726 illustrates the sequence of; (1) initially performing a first protocol to enter into or remain in the Soft Reset state 704, (2) switching from performing the first protocol to performing the second protocol to cause entry into the Address & Instruction input state 706 to input an address and instruction, and (3) switching from performing the second protocol to performing the first protocol to enter the Hard Reset state 702, which terminates the protocol sequence and resets the Selection circuit 514 and Tap Domains 510.

Figure 8:
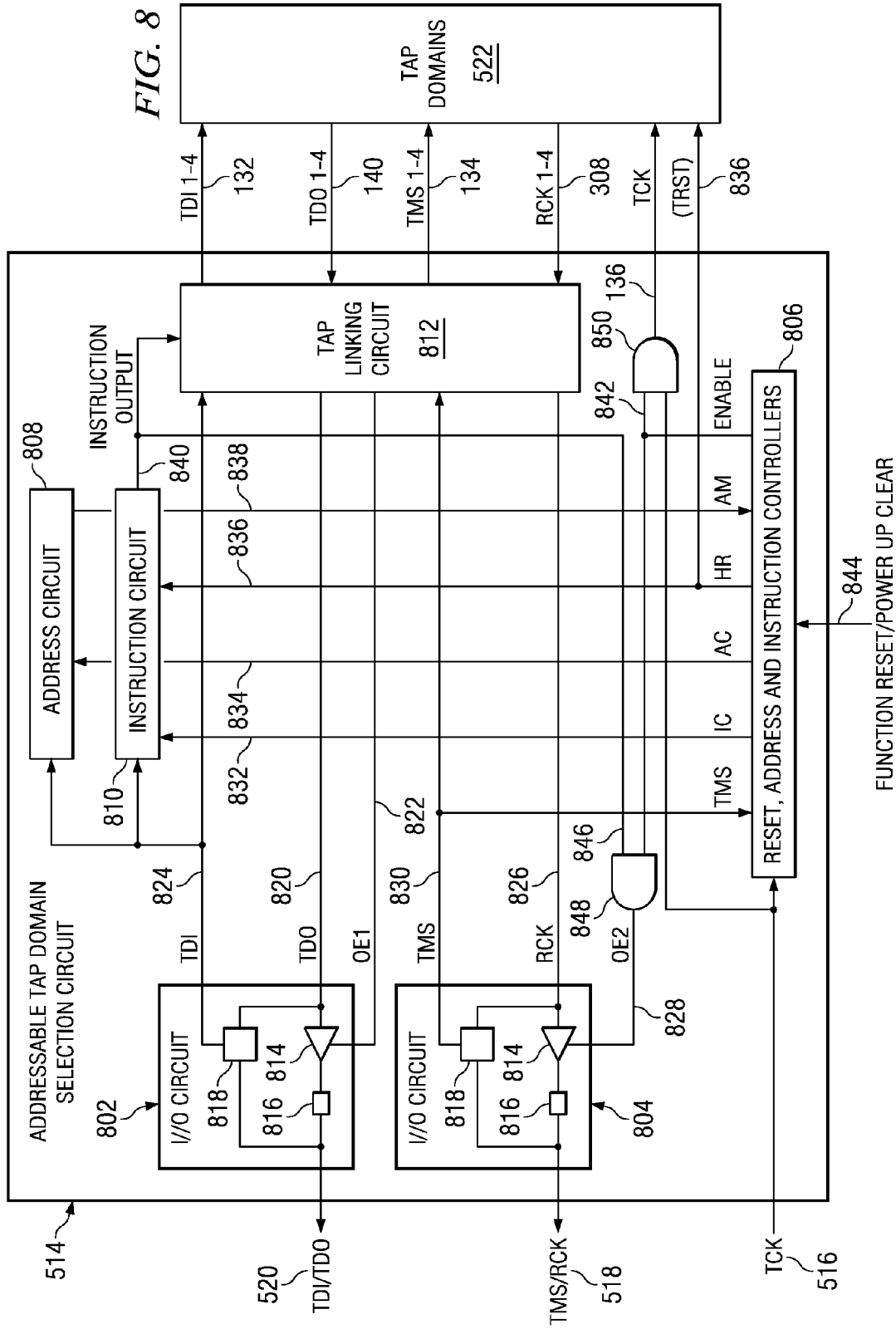
FIG. 8 illustrates a detail view of the Addressable Tap Domain Selection Circuit interfaced to plural Tap Domains.

FIG. 8 illustrates the Addressable Tap Domain Selection circuit 514 in more detail. The Selection circuit 514 includes a TDI/TDO I/O circuit 802, a TMS/RCK I/O circuit 804, Reset, Address & Instruction controllers 806, an address circuit 808, an instruction circuit 810, and a Tap Linking circuit 812. The I/O circuits 802 and 804 each include an output buffer 814, a resistor 816, and a data input circuit 818.

The output buffer 814 of I/O circuit 802 has an input coupled to the TDO output signal 820 from Linking circuit 812, an output coupled to one lead of resistor 816, and a 3-state control input coupled to the output enable 1 (OE1) signal 822 from Linking circuit 812. The other lead of resistor 816 is coupled to the TDI/TDO terminal 520. The data input circuit 818 has a first input coupled to the TDI/TDO terminal 520, a second input coupled to the TDO signal 820, and an TDI output signal 824 coupled to inputs of the Address circuit 808, Instruction circuit 810, and Linking circuit 812.

The output buffer 814 of I/O circuit 804 has an input coupled to the RCK output signal 826 from Linking circuit 812, an output coupled to one lead of resistor 816, and a 3-state control input coupled to the output enable 2 (OE2) signal 822 from And gate 846. The other lead of resistor 816 is coupled to the TMS/RCK terminal 518. The data input circuit 818 has a first input coupled to the TMS/RCK terminal 518, a second input coupled to the RCK signal 826, and an TMS output signal 830 coupled to inputs of the Linking circuit 812 and Controllers 806.

The Reset, Address, and Instruction Controllers 806 has inputs coupled to TCK terminal 516, TMS signal 830, an Address Match (AM) signal 838 output from Address circuit 808, and to a function reset and/or power up clear signal 844. The Controller 806 outputs instruction control (IC) signals 832 to Instruction Circuit 810, an address clock (AC) signal 834 to Address Circuit 808, a hard reset (HR) signal 836 to Instruction Circuit 810 and to the TRST input of Tap Domains 510 in Tap Region 522, and an Enable signal 842 to And gates 848 and 850.

And gate 850 inputs the Enable signal 842 and the TCK 516 signal and outputs a TCK 136 signal to Tap Domains 510 in Tap Region 522. When Enable signal 842 is high, And gate 850 couples TCK signal 516 to TCK signal 136. When Enable is low, TCK signal 136 is forced low.

And gate 848 inputs the Enable signal 842 and a signal 846 from instruction output bus 840 and outputs the OE2 signal 828 to output buffer 814 of I/O circuit 804. When Enable signal 842 is high, And gate 848 couples instruction output signal 846 to the OE2 signal 828. When Enable is low, OE2 828 is forced low, disabling output buffer 814 of I/O circuit 804. If the Tap Domain 510 selected for access is a conventional Tap Domain, i.e. no RCK, the loaded instruction will output a low on instruction signal 846 to disable output buffer 814 from outputting RCK signals 826 onto TMS/RCK 518 when Enable signal 842 is set high. If the Tap Domain 510 selected for access is a Tap Domain that uses the RCK signal, the loaded instruction will output a high on instruction signal 846 to enable output buffer 814 for outputting RCK signals 826 onto TMS/RCK 518 when Enable signal 842 is set high.

The Linking Circuit 812 is coupled to the I/O circuits 802-804 and to the Controllers 806 as mentioned above. The Linking Circuit is further coupled to instruction output bus 840 of Instruction Circuit 810 to input instruction control, and to the Tap Domains 510 of Tap Region 522, via signals TDI1-4 132 output, TDO1-4 140 input, TMST-4 134 output, and RCK1-4 308 input signals.

Figure 9:
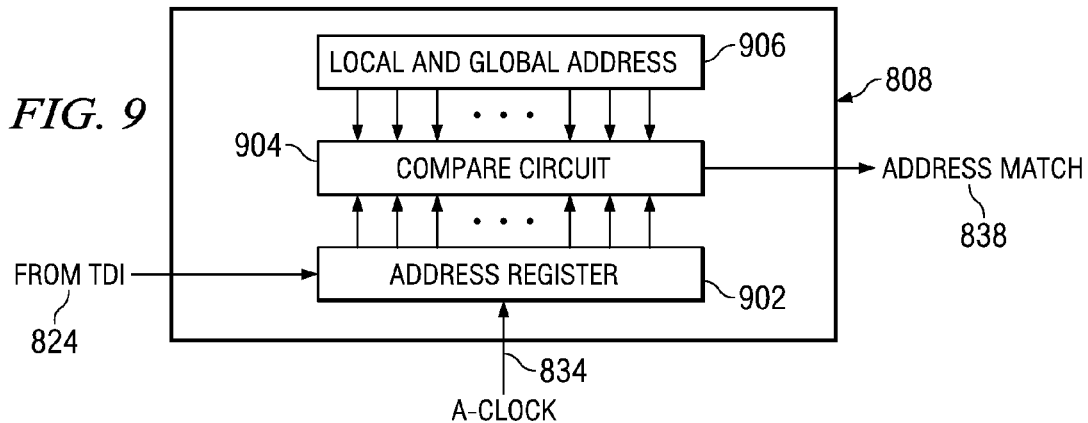
FIG. 9 illustrates a detail view of the Address circuit of the present disclosure.

FIG. 9 illustrates an example of how the Address Circuit 808 may be designed. The address circuit consists of an address shift register 902, an address compare circuit 904, and a local and global address circuit 906. The shift register 902 responds to the address clock signal 834 to shift in an address from the TDI 824. The compare circuit 904 operates to compare the address shifted into the shift register 902 to the local and global addresses output from local and global address circuit 906. The compare circuit outputs the result of the compare on the address match signal 838. Since the global address will be the same for all Selection circuits 514, it will be fixed by design. The unique local address may be provided by the blowing of electronic fuses, an address programmed into a programmable memory, an address functionally written into a memory, an address shifted into a shift register, an address established on externally accessible device (IC/core) terminals, or by any other suitable address supplying means. A local address may not share the same address as the global address. The compare circuit is capable of comparing the data shifted into the address register 902 against both the local address and the global address output from address circuit 906. If a match occurs between the data in the address register 902 and the local or global address, the address match signal 838 will be set high. If desired, two address match outputs, one for indicating a local address match and another for indicating a global address match, could be used instead of the single address match signal 838.

Figure 10:
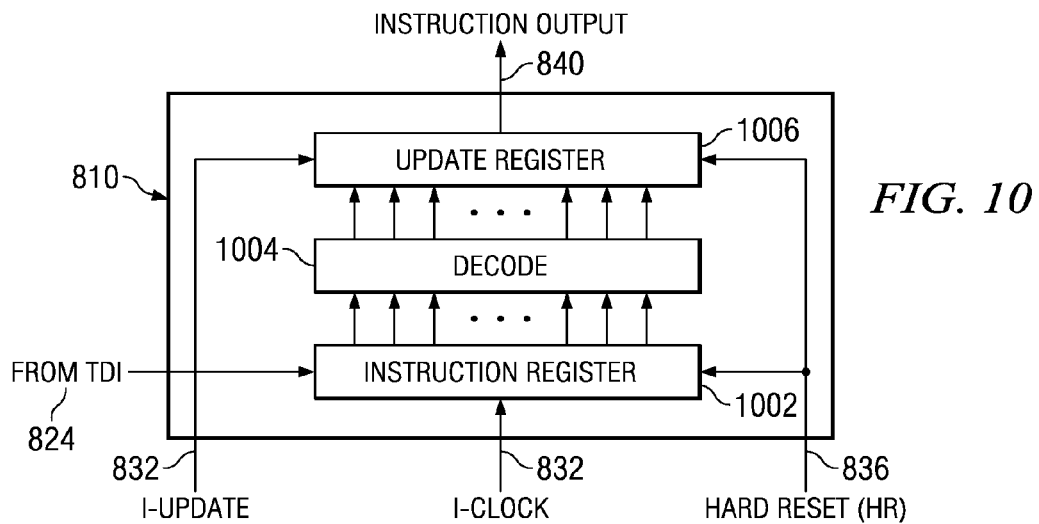
FIG. 10 illustrates a detail view of the Instruction circuit of the present disclosure.

FIG. 10 illustrates an example of how the instruction circuit 810 may be designed. The instruction circuit consist of an instruction shift register 1002, instruction decode logic 1004, and an instruction update register 1006. The shift register 1002 responds to an instruction clock (I-Clock) signal from IC bus 832 to shift in an instruction from the TDI 824 input. The decode logic 1004 operates to decode the instruction shifted into the shift register 1002 and to output the decode to the update register 1006. The update register 1006 stores the instruction decode in response to an instruction update (I-Update) signal from IC bus 832. The stored instruction decode is output from the update register 1006 on instruction output bus 840. The hard reset (HR) signal 836 is input to both the shift register 1002 and update register 1006 to reset the registers to known states when the hard reset signal from Controller 806 is active low.

Figure 11:
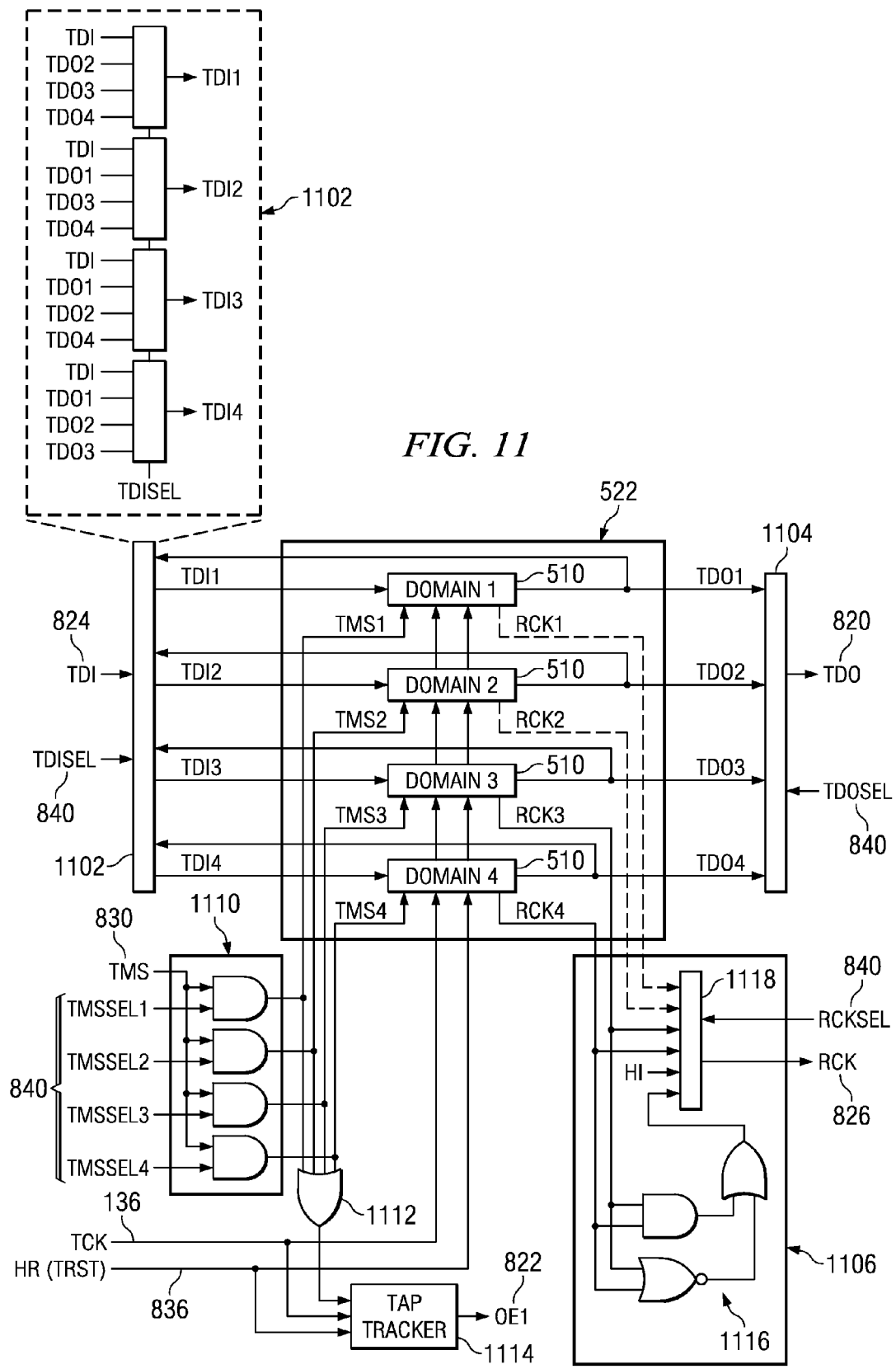
FIG. 11 illustrates a detail view of the Tap Linking circuit of the present disclosure.

FIG. 11 illustrates an example of how the Linking Circuit 812 is interfaced to the Tap Domains 510 of Tap Region 522. The Linking Circuit 812 comprises TDI multiplexer circuitry 1102, TDO multiplexer 1104, TMS gating circuit 1110, RCK selection circuit 1106, and a Tap Tracker circuit 1114.

The TDI multiplexer circuitry 1102 comprises four individual multiplexers for TDI1, TDI2, TDI3, and TDI4 as shown in the dotted line box. Each individual multiplexer is coupled to TDISEL signals from instruction output bus 840. The TDI output of each multiplexers (TDI1-TDI4) is coupled to a respective TDI input of Tap domains 1-4 510. In response to the TDISEL input, the TDI multiplexers allow any of the Tap domains to be coupled to the TDI signal 824, or to the TDO outputs (1-4) of any other Tap Domain 1-4 510. The TDO multiplexer 1104 is a single multiplexer that can select any of the TDO outputs (TDO1-4) from a Tap Domains 1-4 510 to be coupled to the TDO signal 820 in response to TDOSEL signals from the instruction output bus 840. As can be seen, using the above described TDI and TDO multiplexer circuits, the Tap Domains 1-4 510 may be individually selected between TDI 824 and TDO 820, or selectively linked serially together between TDI 824 and TDO 820.

TMS gating circuit 1110 receives TMSSEL1-4 signals from instruction output bus 840 to allow any of the TMS1-4 inputs of Tap Domain 1-4 510 to be coupled to the TMS signal 830. A high on a TMSSEL signal will couple TMS 830 to a respective TMS input of a Tap Domain 510. A low on a TMSSEL signal will force a respective TMS input of a Tap Domain 510 low.

The TCK signal 136 is coupled to all TCK inputs of Tap Domains 510. When the Enable signal 842 from Reset, Address, and Instruction Controllers 806 is high, TCK 136 is coupled to the TCK terminal 516 via And gate 850 of FIG. 8.

The HR input 836 from Reset, Address, and Instruction Controllers 806 is input to the TRST input of the Tap Domains 510 of Tap Region 522.

RCK selection circuit 1106 receives RCKSEL signals from instruction output bus 840 to allow any one or a combination of RCK 1-4 outputs of Tap Domains 1-4 510 to be coupled to the RCK signal 826. In response to the RCKSEL signals, an RCK 1-4 from any Tap Domain 1-4 510 may be coupled to RCK 826, a combination of RCK signals may be coupled to RCK 826 from voting circuit 1116, or the RCK signal 826 may be coupled to a static logic level (a HI in this example) when no RCK is used by a Tap Domain 510. The absence of an RCK signal from a Tap Domain is indicated by dotted line. The voting circuit 1116 is used whenever two or more Tap Domains each having an RCK are linked together for serial access. In this example, the AND gate of the voting circuit 1116 detects the condition where both RCKs are high and the OR gate of the voting circuit 1116 detects the condition where both RCKs are low. As mentioned previously, RCKs are handshaking signals fed back to the external controller to indicate when a Tap Domain of a core have synchronized the TCK signal level input from the external controller with a functional clock of the core.

The Tap Tracker circuit 1114 is an IEEE 1149.1 Tap state machine that is used in Linking Circuit 812 to track the states of the Tap Domain(s) being accessed in the Tap Region 522. The main function of the Tap Tracker 1114 is to control the output enable 1 (OE1) signal to the output buffer 814 of I/O circuit 802. The Tap Tracker will output a signal on OE1 to enable the output buffer to output onto terminal TDI/TDO 520 whenever the Tap Tracker (and selected Tap Domain(s)) are in the Shift-DR or Shift-IR states (see Tap Diagram of FIG. 16). In these states, the selected Tap Domains will be shifting data from TDI 824 to TDO 820 and the I/O circuit 802 will be in its mode of simultaneously inputting and outputting this shift data on TDI/TDO terminal 520. When not in the Shift-DR or Shift-IR states, the Tap Domains will not be shifting data and the OE1 signal will be set to disable output buffer 814 of I/O circuit 802 from operating in the simultaneous input and output mode on TDI/TDO terminal 520. While output buffer 814 is disabled, I/O circuit 802 operates in an input only mode to input data appearing of the TDI/TDO terminal 520. As seen in FIG. 11, the Tap Tracker inputs the TCK signal 136, the HR signal 836 (as its TRST input), and TMST-4 signals via OR gate 1112.

Figure 12:
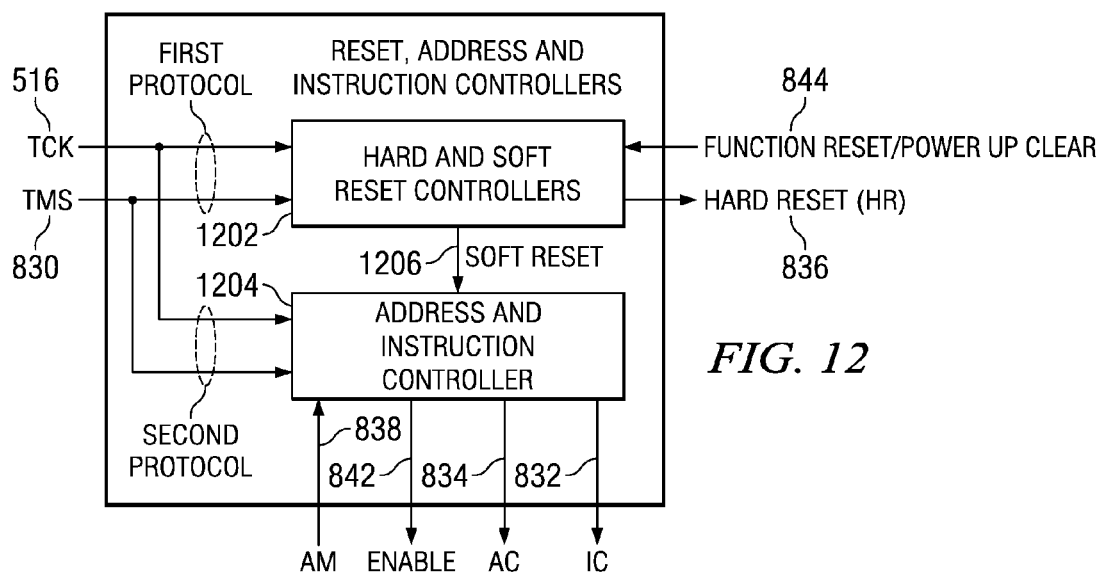
FIG. 12 illustrates the Reset, Address, and Instruction Controllers of the present disclosure.

FIG. 12 illustrates a block diagram of the Hard and Soft Reset controller 1202 and the Address and Instruction Controller 1204 within the Reset, Address, and Instruction Controllers Circuit 806. The Hard and Soft Reset controller 1202 inputs the TCK signal 516, the TMS signal 830, and the functional reset and/or power up clear signal 844, and outputs the Hard Reset (HR) 836 signal and a Soft Reset signal 1206. The Hard Reset (HR) 836 signal is input to the Instruction Circuit 810 of FIG. 8 and the Tap Domains 510 of Tap Region 522. The Address and Instruction Controller 1204 inputs the TCK signal 516, the TMS signal 830, the Address Match (AM) signal 838, and the Soft Reset signal 1206 from controller 1202, and outputs the instruction control (IC) signals 832 to instruction circuits 810, address clock (AC) signal 834 to address circuit 808, and the Enable signal 842 to And gates 848 and 850. As indicated by dotted line, the Hard and Soft Reset controllers 1202 respond to the TCK 516 and TMS 830 inputs according to the previously mentioned first protocol, and the Address and Instruction controller 1204 responds to the TCK 516 and TMS 830 inputs according to the previously mentioned second protocol.

Figure 13:
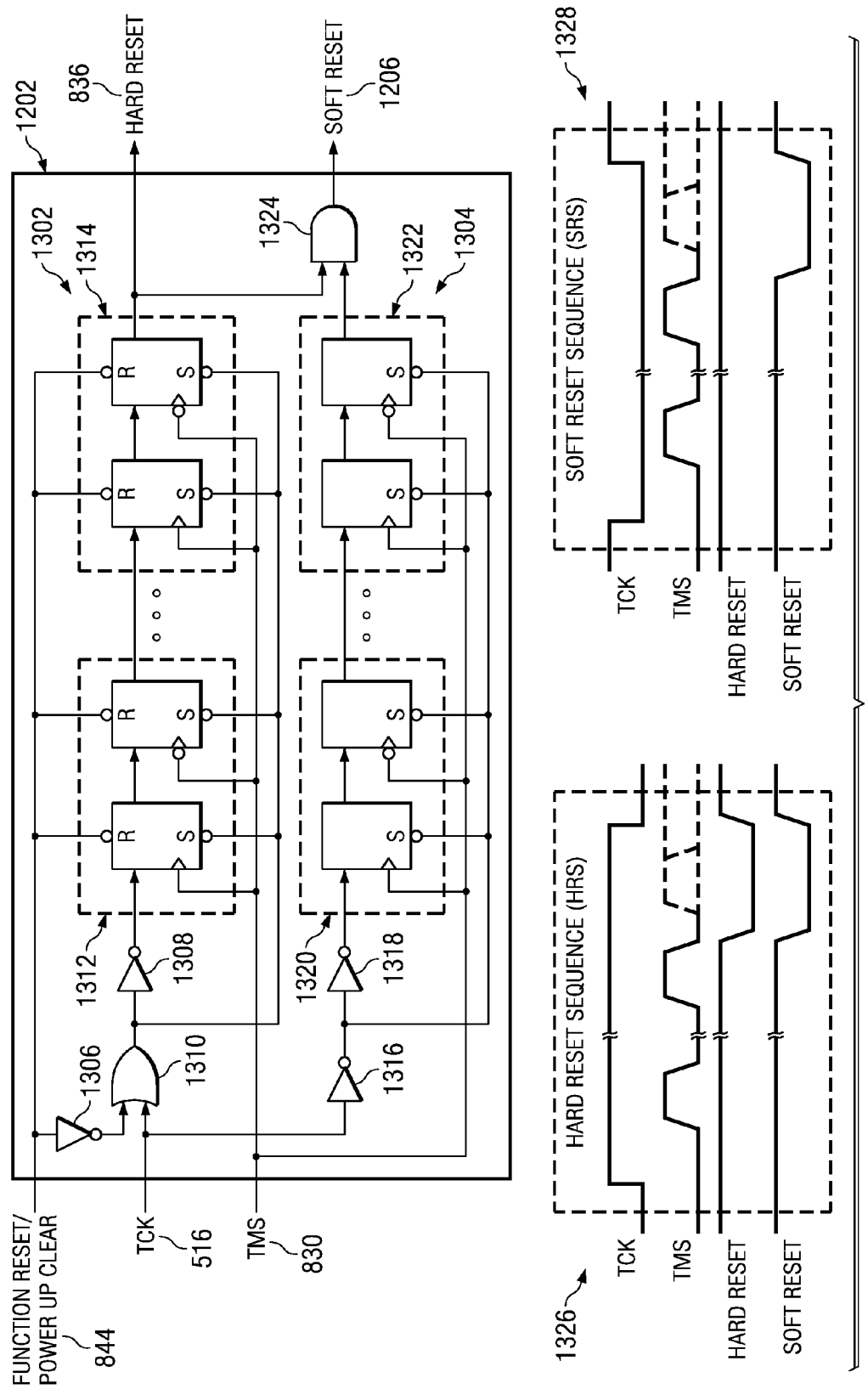
FIG. 13 illustrates a detail view of the Hard and Soft reset controllers and sequences of the present disclosure.

FIG. 13 illustrates an example of how the Hard and Soft Reset controller 1202 may be designed. The Hard and Soft Reset controller 1202 consists of two separate controllers, a hard reset controller 1302 and a soft reset controller 1304. The hard reset controller 1302 consists of inverters 1306 and 1308, Or gate 1310, and flip flop pairs 1312 and 1314 connected as shown. Flip flop pairs 1312 and 1314 each include a rising edge clock flip flop feeding data to a falling edge flip flop, so it takes both a rising and falling clock edge to propagate an input to the output of the pair. The soft reset controller 1304 consists of inverters 1316 and 1318, flip flop pairs 1320 and 1322, and And gate 1324 connected as shown. Again the flip flop pairs 1320 and 1322 include a rising edge clock flip flop feeding data to a falling edge clock flip flop. In response to a low input on the function reset and/or power up clear input 844, flip flop pairs 1312 and 1314 are reset, which sets the Hard Reset output 836 low and the Soft Reset output 1206 low, via And gate 1324. In response to the function reset/power up clear 844 returning high, the Hard Reset controller 1302 will remain in the reset state (Hard Reset 836 output low) if the TCK 516 input is high and the TMS 830 input is in a stable low or high state. The Soft Reset controller flip flop pairs 1320 and 1322 are set while the TCK 516 input is high.

During the operation of a second or third protocol, the TCK 516 input is active, forcing the flip flop pairs of the Hard and Soft Reset controllers to be continuously forced to their set state due to the TCK 516 signal being coupled to the set (S) input of the pair's flip flops. In the set state, the Hard and Soft Reset controllers output highs on the Hard 836 and Soft 1206 Reset outputs, respectively. At the end of a second or third protocol operation, the Hard and Soft Reset controllers may be reset by a first protocol sequence applied on the TCK 516 and TMS 830 inputs. The Soft Reset controller 1304 is always reset following a second or third protocol operation so that a new second protocol operation may be initiated. The Soft Reset output 1206 of the Soft Reset controller 1206 is used to force the Address and Instruction controller 1204 to a Home state (see FIG. 14). From the Home state, another address and instruction input operation can be performed using the second protocol. The Hard Reset controller 1302 is reset (Hard Reset output 836 goes low) using the first protocol whenever all required second and third protocol operations have been performed. A low on the Hard Reset output 836 resets the instruction circuit 810 to a known state, forces the Address and Instruction Controller 1204 to the Home state, and resets the Tap Domains 510 via their TRST input.

Timing diagram 1326 of FIG. 13 illustrates a first protocol sequence on TCK and TMS that will reset the Hard Reset controller 1302 and output a low on the Hard Reset signal 836 and Soft Reset signal 1206. The sequence includes the steps of holding the TCK signal 516 high while inputting a clock pulse or pulses on the TMS signal 830. This Hard Reset controller design example requires two clock pulses on the TMS signal due to the choice of using two serially connected flip flop pairs 1312 and 1314. With the TCK signal high, the rising and falling edges of the first TMS clock pulse sets the output of flip flop pair 1312 low and the rising and falling edges of the second TMS clock pulse sets the output of flip flop pair 1314 low, which forces the Hard Reset and Soft Reset outputs low. The low on the Hard and Soft Reset outputs will be maintained until the TCK signal goes low, which will set the outputs of flip flop pairs 1312 and 1314 high and the Hard and Soft Reset outputs 836 and 1206 high. As indicated in dotted line, if desired, additional TMS clock signals can occur after the Hard Reset controller 1302 has received the two TMS clock pulses required to set the Hard Reset output 836 low.

Timing diagram 1326 of FIG. 13 illustrates a first protocol sequence on TCK and TMS that will reset the Soft Reset controller 1304 and output a low on the Soft Reset output 1206. The sequence includes the steps of holding the TCK signal low and inputting two clock pulses on the TMS signal. Like the Hard Reset controller 1302 design example above, the Soft Reset controller 1304 design example uses two serially connected flip flop pairs 1320 and 1322 for use with two TMS clock pulses. With TCK low, the rising and falling edges of the first TMS clock pulse sets the output of flip flop pair 1320 low and the rising and falling edges of the second TMS clock pulse sets the output of flip flop pair 1322 low, which forces the Soft Reset output 1206 low. The low on the Soft Reset output 1206 will be maintained until the TCK signal goes high, which sets the outputs flip flop pairs 1320 and 1322 high and the Soft Reset output 1206 high. As indicated in dotted line, if desired, additional TMS clock signals can occur after the Soft Reset controller 1304 has received the two TMS clock pulses required to set the Soft Reset output low.

While two TMS clock pulses were used in the Hard and Soft Reset controller design examples, a lesser or greater number of TMS clock pulses, and corresponding number flip flop pairs, may be used as well. Two TMS clock pulses were used in these examples because it reduces the probability that noise or signal skew problems might accidentally produce the hard and soft first protocol sequences on TCK and TMS, causing the Hard and Soft controllers to inadvertently enter their reset states. The first protocol sequence of TCK and TMS shown in the timing diagrams 1326-1328 are TCK and TMS sequences that are never produced during second and third protocol operations. The first protocol sequences are only detectable by the Hard and Soft Reset controllers.

Figure 14:
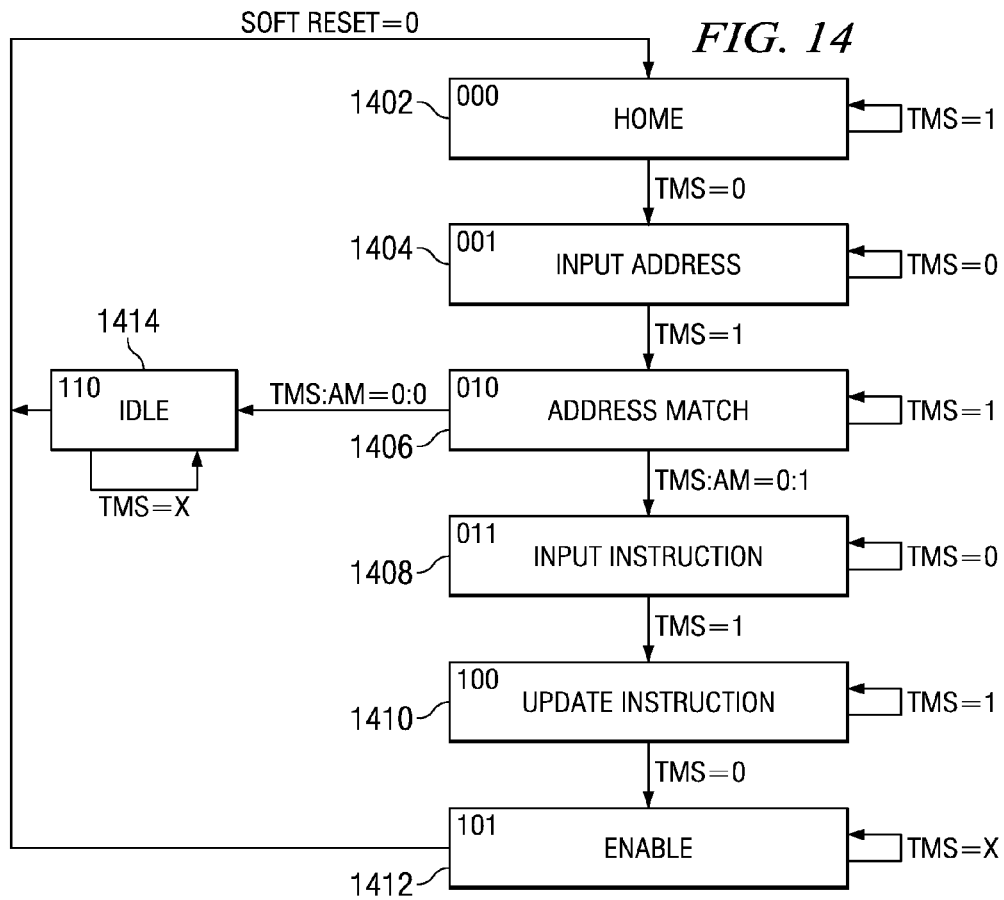
FIG. 14 illustrates the state diagram of the Address and Instruction controller of the present disclosure.

FIG. 14 illustrates the state diagram of the Address and Instruction Controller 1204. In response to a Soft Reset output 1206 from the Hard and Soft Reset controller 1202 the Address and Instruction controller 1204 will enter the Home state 1402. The Home state is maintained while TMS is high. The controller transitions to the Input Address state 1404 when TMS goes low and remains there while TMS is low. During the Input Address state, the A-Clock 834 is active to shift in an address from TDI into the Address circuit 808. When TMS goes high, the controller 1204 transitions to the Address match state 1406 to test for a match between the address shifted in and the local or global address. If the address does not match the local or global address, the controller will transition into the Idle state 1414 and remain there until a hard or soft first protocol sequence sets the Soft Reset output 1206 low, forcing the controller to return to the Home state. If the address matches the local or global address, the controller 1204 transitions into the Input Instruction state 1408 and remains there while TMS is low. In the Input Instruction state, the I-Clock signal on IC bus 832 will become active to shift in an instruction from TDI to the Instruction Circuit 810. When TMS goes high, the controller will transition to the Update Instruction state 1410 an output the I-Update signal on IC bus 832 to update and output the instruction from the Instruction Circuit. When TMS goes low, the controller transitions to the Enable state 1412. The Enable output 842 is set high during the Enable state to enable TCKs to be applied to the selected Tap Domains 510. The controller will remain in the Enable state independent of logic levels on TMS. The TMS sequences shown in FIG. 14 that move the controller through its states define the second protocol. While the controller 1204 is in the Enable state 1412, the TMS signal is operable to perform the third protocol operations to access the Tap Domains 510 without effecting the Enable state 1412 of controller 1204. The controller returns to the Home state 1402 only when the Soft Reset signal 1206 goes low.

Figure 15A:
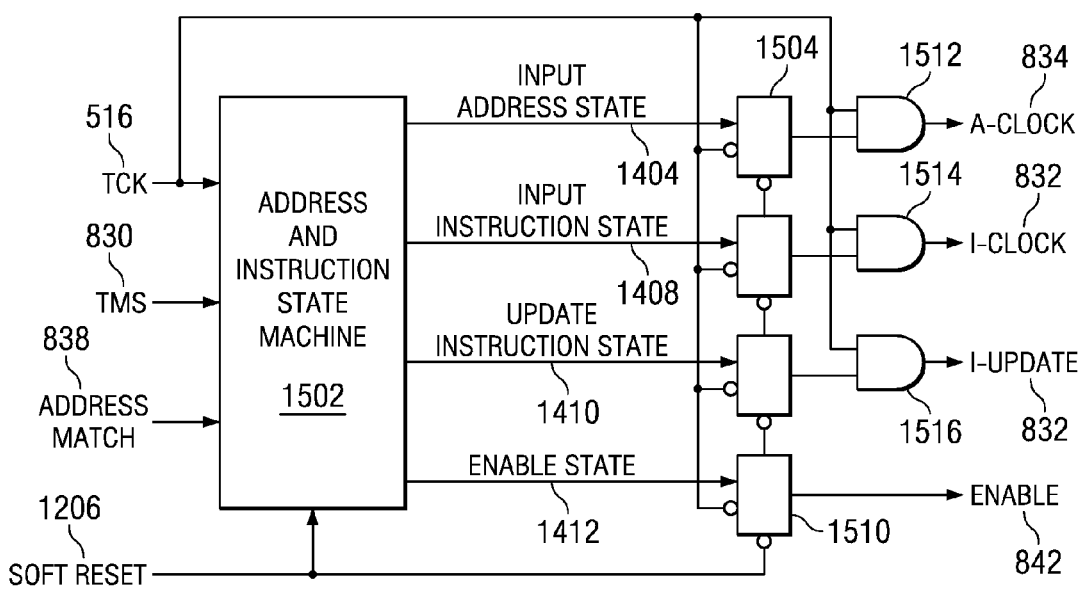
FIGS. 15A and 15B illustrate detail views of the Address and Instruction controller of the present disclosure.

FIG. 15A illustrates an example of how the Address and Instruction controller 1204 of FIG. 12 may be designed. The controller 1204 consists of; (1) a state machine 1502 having inputs for TCK 516, TMS 830, Address Match 838, and Soft Reset 1206, and outputs for indicating when the state machine is in the input address state 1404, input instruction state 1408, update instruction state 1410, and Enable state 1412, and (2) flip flops 1504-1510, and And gates 1512-1516. The state machine 1502 responds to the TMS and Address Match inputs on the rising edge of TCK 516 to move though its states. The flip flops 1512-1516 respond to the falling edge of TCK 516 to gate the A-Clock, I-Clock, I-Update output signals on an off, and to set the Enable output signal.

In response to a low on the Soft Reset input 1206, the state machine is forced to the Home state 1402. While the state machine is in the Input Address state 1404, the A-Clock signal 834 will be gated on to clock an address into the Address Circuit 808. While the state machine is in the Input Instruction state 1408, the I-Clock signal 832 will be gated on to clock an instruction into the Instruction Circuit 810. While the state machine is in the Update Instruction state 1410, the I-Update signal 832 will be gated on to update the instruction from the Instruction Circuit's output bus 840. While the state machine is in the Enable state 1412, the Enable output will be set high to enable Tap Domain access.

Figure 15B:
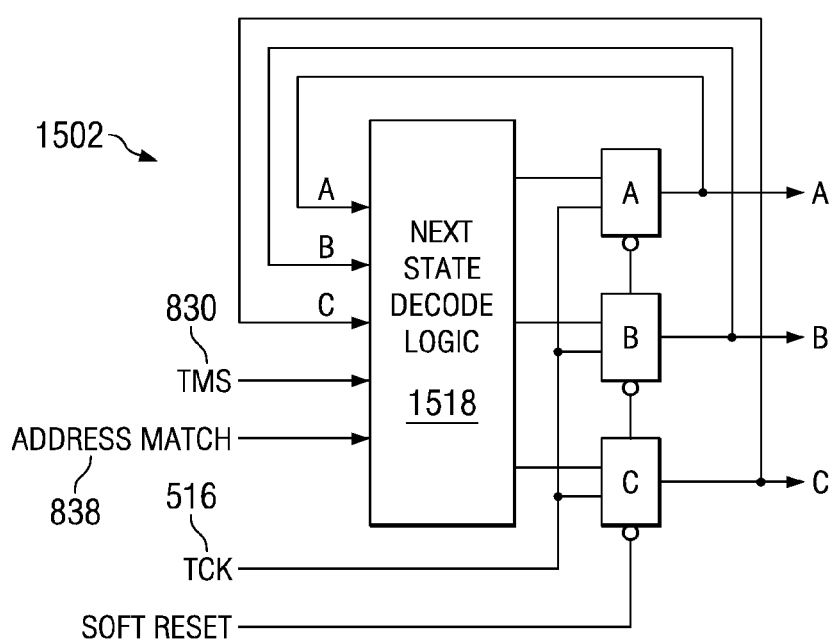

FIG. 15B illustrates an example of how the state machine 1502 may be designed. The state machine consists of next state decode logic 1518, state flip flops A, B, C, and output state decode logic 1520. The ABC state assignments are shown in the FIG. 14 state diagram. If the Soft Reset 1206 input is low, the state machine 1502 is reset to the Home state (ABC=000). If the Soft Reset 1206 input is high, the state machine responds to the rising edge of TCK to transition through its states according to the state diagram of FIG. 14. The output state decode logic 1520 indicates when the state machine is in the input address state 1404 (ABC=001), the input instruction state 1408 (ABC=011), the update instruction state 1410 (ABC=100), and Enable state 1412 (ABC=101).

Figure 16:
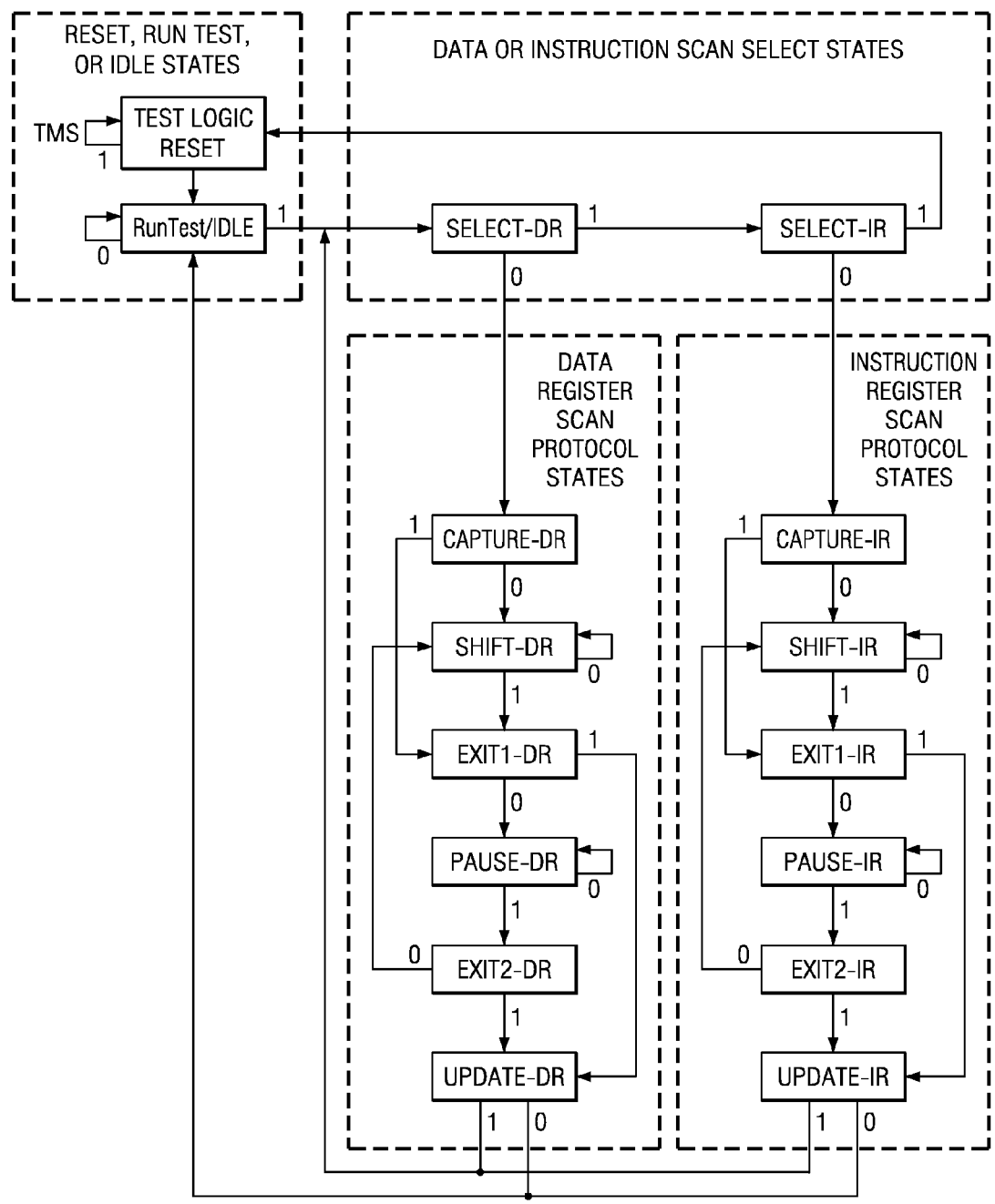
FIG. 16 illustrates the state diagram of the standard IEEE 1149.1 Tap controller.

FIG. 16 illustrates the state diagram of the standard IEEE 1149.1 Tap controller. This state diagram and the design of the controller that uses it is well known and documented in IEEE Std 1149.1 and therefore does not require further teaching. Each Tap Domain 510 in Tap Region 522 will have a Tap controller that operates according to this standard state diagram. The TCK and TMS operation of the standard Tap controller shown in FIG. 16 defines the third protocol of the present disclosure.

FIG. 17 illustrates a group of target devices 1702-1706 on a board or other substrate 1700, each target device including the Addressable Tap Domain Selection Circuit 514 and its associated 3 pin TCK, TDI/TDO, and TMS/RCK interface, as well as Tap Domain Region 522. The target devices could be packaged ICs or unpacked IC die. The 3 pin interface of each target device is coupled to an external controller 1708 via cable connector 1710 to provide access for test, debug, emulation, and trace operations. Each target device 1702-1706 may contain embedded core target circuits 1712-1716 which also are interfaced to the external controller 1708 via the 3 pin interface. Further, each core 1712-1716 may contain embedded core targets circuits 1718-1722 also interfaced to the external controller 1708 via the 3 pin interface. As indicated, the external controller 1708 may be realized by using an interface card 1724 in a personal computer 1726 to control the 3 pin interface communication with the targets 1702-1706, 1712-1716, 1718-1722 via a cable connection 1728. The 3 pin interface communicates to target circuits using the previously mentioned first, second, and third protocols.

Each target 1702-1706, 1712-1716, 1718-1722 of FIG. 17 has the previously mentioned local address to allow it to be individually addressed and instructed by the controller 1708 using the second protocol. Following the individual addressing and instructing of a target using the second protocol, the Tap Domains 510 within the target may be access by the controller 1708 using the third protocol to perform test, debug, emulation, and/or trace operations. Additionally, each target has the previously mentioned global address to allow all targets to be simultaneously addressed and instructed using the second protocol. The purpose of the global addressing is to allow all target devices to receive a global instruction. The global instruction may be an instruction that; (1) causes all targets to enter into a particular mode suitable for a test, emulation, debug, and/or trace operation, (2) causes all targets to enter into a mode to perform a global self test operation, (3) causes all targets to suspend functional operation, or (4) causes all targets to resume functional operation. Other types of global instructions may be conceived as well.

Figure 17A:
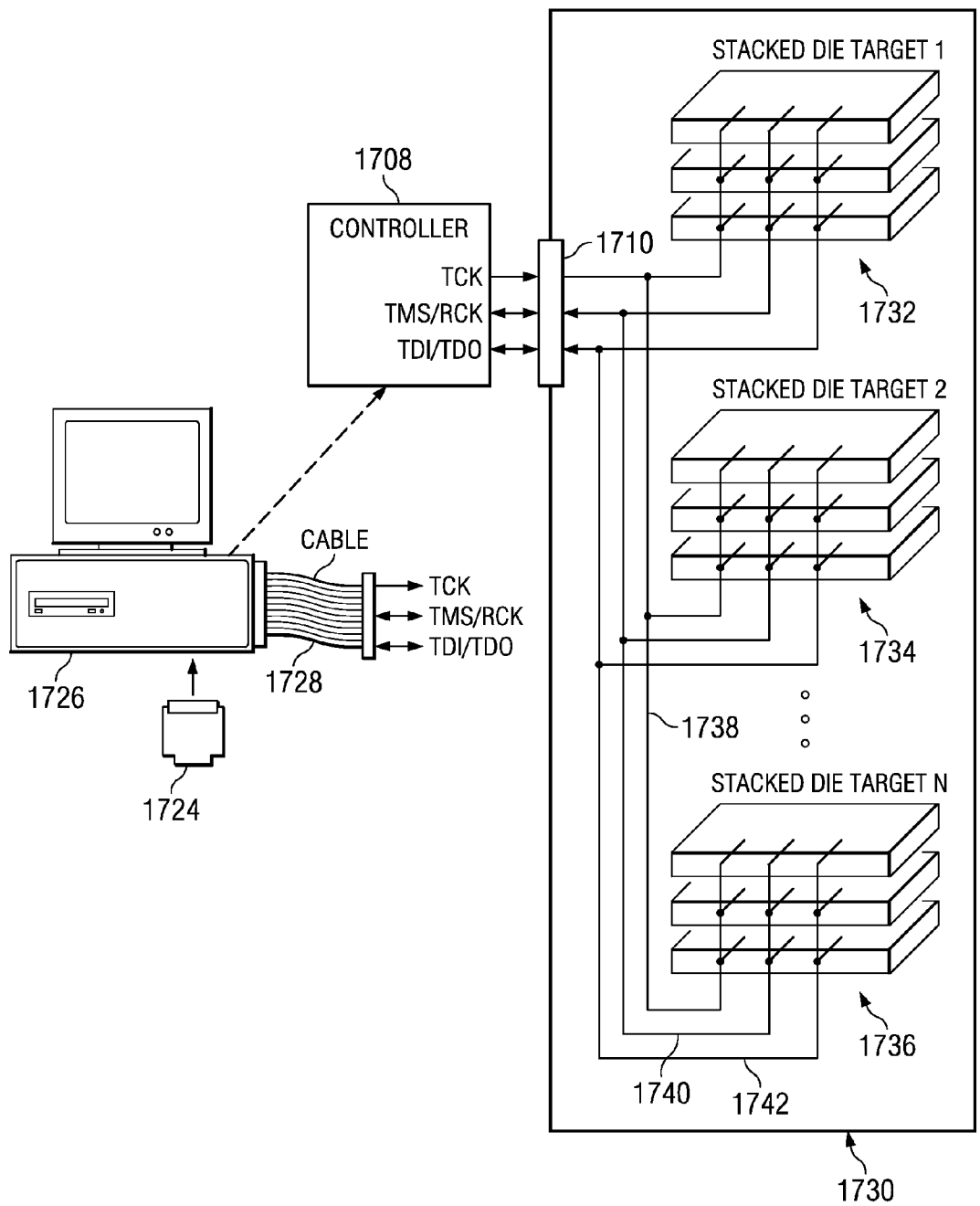
FIG. 17A illustrates the connection between an external controller and the circuitry of the present disclosure existing in stacked die circuits.

FIG. 17A illustrates an alternate configuration of FIG. 17 whereby a group of stacked die targets devices 1732-1736 exist on a board or other substrate 1730. Each die in the stacks 1732-1736 includes the Addressable Tap Domain Selection Circuit 514 and its associated 3 terminal TCK, TDI/TDO, and TMS/RCK interface, as well as Tap Domain Region 522. The TCK, TDI/TDO, and TCM/RCK terminals of each die in a stack are commonly connected to the TCK 1738, TMS/RCK 1740, and TDI/TDO 1742 signal interface to the external controller 1708, via cable connector 1710 to provide access for test, debug, emulation, and trace operations. Each die in the stacks may contain embedded core target circuits 1712-1716 and 1718-1722 as described in FIG. 17. The controller 1708 communicates to the stacked die targets using the previously mentioned first, second, and third protocols.

Each die in a stack 1732-1736 has the previously mentioned local address to allow it to be individually addressed and instructed by the controller 1708 using the second protocol. Following the individual die addressing and instructing, the Tap Domain 510 within the selected die may be accessed by the controller 1708 using the third protocol to perform test, debug, emulation, and/or trace operations. Additionally, each die in stacks 1732-1736 has the previously mentioned global address to allow all die in stacks 1732-1736 to be simultaneously addressed and instructed using the second protocol, for the reasons mentioned in regard to FIG. 17.

FIG. 18 illustrates a group of legacy target devices 1802-1806, each including the standard IEEE 1149.1 5 signal interface comprising TRST, TCK, TMS, TDI, and TDO terminals, but not the Addressable Tap Domain Selection Circuit 514. The term legacy means that the devices are pre-existing devices whose design is fixed and cannot be altered. As shown, each legacy target device may also include the RCK terminal. The legacy target devices could be ICs 1802-1806 on a board or other substrate 1800, embedded core circuits 1802-1806 within an IC 1800, or embedded core circuits 1802-1806 within a core circuit 1800.

As seen, a separate device 1808 exists between the legacy target devices 1802-1806 and the external controller 1708. This separate device 1808 implements the Addressable Tap Domain Selection Circuit 514 as shown and described in regard to FIG. 8 and operates according the previously described first, second, and third protocols. It also includes the previously described local and global addressing modes. The local address 1810 is shown, in this example, as being input to the separate device 1808 on externally accessible terminals of device 1808, which is one of the previously mentioned means for supplying the local address. The separate device 1808 serves to provide the interface between the 5 signal IEEE 1149.1 terminals, and optional RCK terminal, of each legacy target device and the 3 pin interface to the external controller 1708. The operation of the separate device 1808 in accessing the legacy device Tap Domains is the same as described in FIG. 8 where the Addressable Tap Domain Selection Circuit 514 was described accessing the Tap Domains 510 of Tap Region 522.

The arrangement shown in FIG. 18 could represent the legacy target devices 1802-1806 and separate device 1808 as being; (1) ICs/die on a board or substrate 1800, embedded core circuits within an IC 1800, or (3) embedded core circuits within a core circuit 1800. FIG. 18 advantageously illustrates how legacy devices designed using the IEEE 1149.1 interface, and optional RCK, can be interfaced to the 3 pin controller 1708 by providing the Addressable Tap Selection Circuit 514 as a separate circuit to serve as the interface between the legacy devices 1802-1806 and external controller 1708. The separate circuit 1808 could contain only the Addressable Tap Domain Selection Circuit 514 or it could contain the Addressable Tap Domain Selection Circuit 514 along with other circuits. Indeed, the separate circuit 1808 could be a larger functional IC/die or embeddable core circuit that includes the Addressable Tap Domain Selection Circuit 514 and its external terminal interfaces as a sub-circuit within the larger functional circuit.

Figure 19:
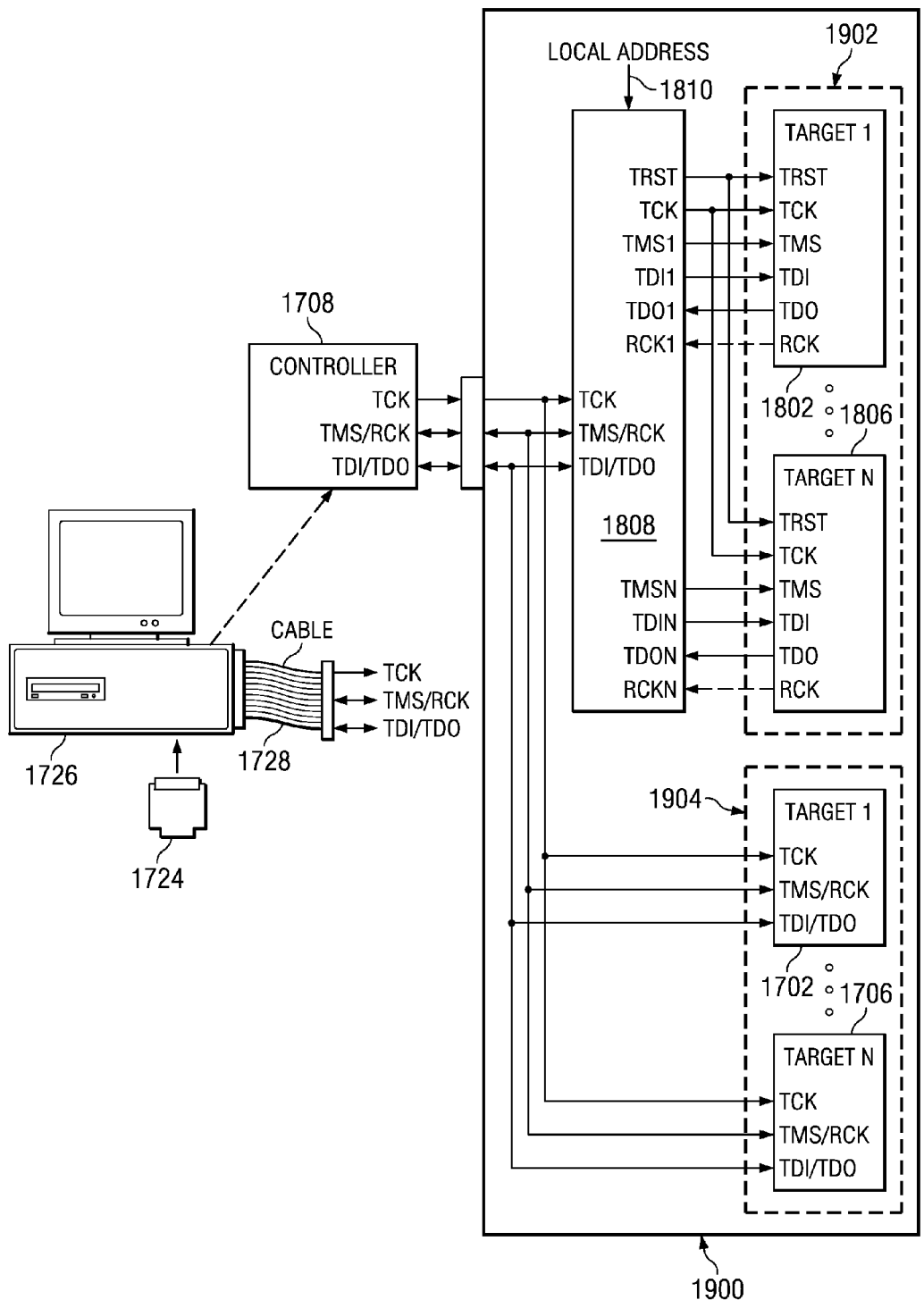
FIG. 19 illustrates the connection between an external controller and a circuit containing the present disclosure that is interfaced to standard legacy JTAG circuits in ICs or cores, and to ICs or cores that include the circuitry of the present disclosure.

FIG. 19 illustrates a group 1902 of IEEE 1149.1 legacy target devices 1802-1806 as described in FIG. 18, and a group 1904 of target devices 1702-1706 as described in FIG. 17. Each legacy target device 1803-1806 of group 1902 is interfaced to the external controller 1708 via the separate device 1808 as described in FIG. 18 whereas each target device 1702-1706 of group 1904 is interfaced to the external controller directly. This example is provided to illustrate how legacy devices 1802-1806 that are not designed according to the present disclosure and other devices 1702-1704 that are designed according to the present disclosure can both be accessed by an external controller 1708 by using separate device 1808 as the interface between the legacy devices and external controller.

FIG. 20 illustrates the TDI/TDO signal wire connection 2002 between the TDI/TDO terminal of an I/O circuit 802 of a controller 1708 and a TDI/TDO terminal of the I/O circuits 802 of the Addressable Tap Domain Selection Circuits 514 of target circuits 1-N. The controller will have to have the I/O circuit 802 in order to interface to and communicate with I/O circuits 802 of the target circuits 1-N via the TDI/TDO signal wire. Preferably, the output buffer 814 of the controller 1708 and the output buffers 814 of the target circuits will have approximately the same current sink/source drive strength. Also preferably the resistors 816 of the controller 1708 and target circuit I/O circuits 802 will have approximately the same resistance.

As seen in this example, the output buffer 814 of the controller's I/O circuit 802 is always enabled to output TDO data to the target circuits, while the output buffers 814 of the target circuit I/O circuits 802 are selectively enabled to and disabled from outputting TDO data to the controller 1708 by the output enable 1 (OE1) signal 822 from Tap Linking Circuit 812. As previously described, the TDI 824 signal of the target I/O circuit 802 is coupled to the Address Circuit 808, the Instruction Circuit 810, and the Tap Linking Circuit 812 of Addressable Tap Domain Selection Circuit 514, and the TDO 820 signal of the target I/O circuit 802 is coupled to the Tap Linking Circuit 812 of Addressable Tap Domain Selection Circuit 514. The TDI 824 signal of the controller's I/O circuit 802 is coupled to a circuit within the controller designed to receive serial data input signals from TDI/TDO signal wire 2002, and the TDO 820 signal of the controller's I/O circuit 802 is coupled to a circuit within the controller designed to transmit serial data output signals to TDI/TDI signal wire 2002.

During first protocol operations the TDI/TDO signal wire is not used and the output buffers of the target circuits are disabled by the OE1 signals 822.

During second protocol operations when the controller 1708 is inputting address and instruction signals to the target circuits 1-N, the output buffers 814 of the target circuits 1-N are disabled by OE1 822, allowing the output buffer 814 of the controller to be the sole driver of the TDI/TDO signal wire 2002. Thus during second protocols the I/O circuit 802 of target circuits 1-N operates as an input buffer on the TDI/TDO signal wire 2002.

During third protocol operations when the controller 1708 is not inputting and outputting data to a selected one or more Tap Domain in the Shift-DR or Shift-IR states, the output buffer 814 of the addressed and all other target circuits will be disabled by the OE1 signal 822. In this mode, the output buffer 814 of the controller is the sole driver of the TDI/TDO signal wire 2002.

During third protocol operations when the controller 1708 is inputting and outputting data to a selected one or more Tap Domain in the Shift-DR or Shift-IR states, the output buffer 814 of the addressed target circuit will be enabled by the OE1 signal 822. In this mode, both the output buffers 814 of the controller and addressed target circuit will be driving the TDI/TDO signal wire 2002. This mode of operation allows data to flow simultaneously between the controller 1708 and the addressed target circuit via the TDI/TDO signal wire during each TCK period.

If, during this simultaneous data flow mode, the output buffer 814 of the controller 1708 and the output buffer 814 of the addressed target circuit are both outputting the same logic level, the voltage on the TDI/TDO signal wire 2002 will driven to that full logic level. The data input circuits 818 of the controller 1708 and addressed target circuit will detect that full logic level and input that logic level to the controller 1708 and to the addressed target circuit via their respective TDI signals 824.

If, during this simultaneous data flow mode, the output buffer 814 of the controller 1708 and the output buffer 814 of the addressed target circuit are outputting opposite logic levels, the TDI/TDO signal wire 2002 will be driven to a mid point voltage level between the two opposite logic levels. The data input circuits 818 of the controller 1708 and addressed target circuit will detect that mid level voltage and, based on the logic level each was attempting to output, will input a logic level to the controller 1708 and to the addressed target circuit on their respective TDI signal 824 that is the opposite of logic level each was outputting.

When the output buffers 814 of the controller and addressed target circuit are driving opposite logic levels on TDI/TDO wire 2002, the resistors 816 serve to limit the current flow between the two output buffers 814 and to serve as voltage droppers to allow the mid point voltage level on TDI/TDO signal wire 2002 to be more easily detected by the data input circuit 818 as a voltage level that is distinctly different from the normal full high or low logic level voltages output from the output buffers 816. The operation of data input circuit 818 will be described later in regard to FIG. 22.

FIG. 21 illustrates the TMS/RCK signal wire connection 2102 between the TMS/RCK terminal of an I/O circuit 804 of a controller 1708 and the TMS/RCK terminal of the I/O circuits 804 of the Addressable Tap Domain Selection Circuits 514 of target circuits 1-N. When target circuits use Tap domains with RCKs, the controller will have to have the I/O circuit 804 in order to interface to and communicate with I/O circuits 804 of the target circuits 1-N via the TMS/RCK signal wire. As with the TDI/TDO I/O circuits 802 above, the output buffers 814 of the controller and target circuits will preferably have approximately the same current sink/source drive strength and the resistors 816 will have approximately the same resistance.

As seen in this example, the output buffer 814 of the controller is always enabled to output TMS signals to the target circuits, while the output buffers 814 of the target circuits are selectively enabled to and disabled from outputting RCK signals 826 to controller 1708 by the output enable 2 (OE2) signal 828. As previously described, the TMS 830 signal of the target I/O circuit 804 is coupled to the Tap Linking Circuit 812 and to the Reset, Address, & Instruction Controllers 806, and the RCK 826 signal of the target I/O circuit 804 is coupled to the Tap Linking Circuit 812 of Addressable Tap Domain Selection Circuit 514. The RCK 826 signal of the controller's I/O circuit 804 is coupled to a circuit within the controller designed to receive RCK input signals from the TMS/RCK signal wire 2102, and the TMS 830 signal of the controller's I/O circuit 804 is coupled to a circuit within the controller designed to transmit TMS output signals to the TMS/RCK signal wire 2102.

During first protocol operations when the controller 1708 is inputting soft or hard reset sequences to Hard and Soft Controller 1202, the TMS/RCK signal wire will be driven by the output buffer 814 of controller 1708 and may or may not be driven by the output buffer 814 of a target circuit 1-N. If the first protocol is performed following a power up or function reset of target circuits 1-N, the output buffers 814 of the target circuits will not be enabled by OE2 and therefore only output buffer 814 of controller 1708 drives the TMS/RCK signal wire 2102. Also, if a first protocol is performed following a second or third protocol where the OE2 signal is set low by instruction control signal 846, only the output buffer 814 of controller 1708 will be driving the TMS/RCK signal wire 2102. However, if a first protocol is performed following a second or third protocol where the OE2 signal is set high by an instruction, via instruction control signal 846, both the output buffer 814 of controller 1708 and the output buffer of the address target circuit will be driving the TMS/RCK signal wire 2102.

Following the input of a soft reset first protocol sequence, the OE2 will be forced low by the Soft Reset signal 1206 from the Hard and Soft Reset Controller 1202 going low. As previously mentioned, the Soft Reset signal 1206, when low, forces the Address and Instruction controller 1204 into the Home state 1402. In the Home state 1402, the Enable signal output 842 of the Address and Instruction controller 1204 is low, which forces the OE2 signal 828 low via And gate 848. Thus if the output buffer 814 of a target circuit was enabled prior to the input of a soft reset first protocol sequence, it will be disabled at the end of the soft reset protocol sequence.

Following the input of a hard reset first protocol sequence, the OE2 will be forced low by the Hard Reset signal 836 from the Hard and Soft Reset Controller 1202 going low. When Hard Reset signal 836 goes low, the instruction circuit 810 is reset to an instruction that sets the instruction control output signal 846 low which forces the OE2 output 828 of And gate 848 low. Also the Hard Reset signal going low will set the Soft Reset signal 1206 low, via And gate 1324 of FIG. 13, which sets the Enable signal 842 low and the OE2 output of And gate 848 low. Thus if the output buffer 814 of a target circuit was enabled prior to the input of a hard reset first protocol sequence, it will be disabled at the end of the soft reset protocol sequence.

During second protocol operations when the controller 1708 is inputting address and instruction signals to the target circuits 1-N, the output buffers 814 of the target circuits 1-N are disabled by OE2 828 being low, allowing the output buffer 814 of the controller to be the sole driver of the TMS/RCK signal wire 2102. Thus during second protocols the I/O circuits 804 of target circuits 1-N operate as an input buffers on the TMS/RCK signal wire 2102.

During third protocol operations when the controller 1708 is communicating to a selected one of more Tap Domains of target circuits that do not use RCKs, the output buffer 814 of the addressed and all other target circuits will be disabled by the OE2 signal 828 being low. In this mode, the output buffer 814 of the controller is the sole driver of the TMS/RCK signal wire 2102.

During third protocol operations when the controller 1708 is communicating to a selected one of more Tap Domains of target circuits that use RCKs, the output buffer 814 of the addressed target circuit will be enabled by its OE2 signal 828 being high and the output buffer 814 of all other target circuits will be disabled by their OE2 signals 828 being low. In this mode, the output buffer 814 of the controller and the output buffer 814 of the addressed target circuit will both be driving the TMS/RCK signal wire 2102. In this mode of operation, a TMS signal can flow from the controller 1708 to the addressed target circuit and an RCK signal can flow from the addressed target circuit to the controller 1708 simultaneously via TMS/RCK signal wire 2102 during each TCK period.

If, during this simultaneous TMS and RCK signal flow mode, the output buffer 814 of the controller 1708 and the output buffer 814 of the addressed target circuit are both outputting the same logic level, the voltage on the TMS/RCK signal wire 2102 will driven to that full logic level. The data input circuits 818 of the controller 1708 and addressed target circuit will detect that full logic level and input that logic level to the controller 1708 via its RCK 826 and to the addressed target circuit via its TMS signal 830. If, during this simultaneous data flow mode, the output buffer 814 of the controller 1708 and the output buffer 814 of the addressed target circuit are outputting opposite logic levels, the TMS/RCK signal wire 2102 will be driven to a mid point voltage level between the two opposite logic levels. The data input circuits 818 of the controller 1708 and addressed target circuit will detect that mid level voltage and, based on the logic level each was attempting to output, will input a logic level to the controller 1708 on its RCK 826 and to the addressed target circuit on its TMS 830 that is the opposite of logic level each was outputting.

When the output buffers 814 of the controller and addressed target circuit are driving opposite logic levels on TMS/RCK wire 2102, the resistors 816 serve to limit the current flow between the two output buffers 814 and to serve as voltage droppers to allow the mid point voltage level on TMS/RCK signal wire 2102 to be more easily detected by the data input circuit 818 as a voltage level that is distinctly different from the normal full high or low logic level voltages output from the output buffers 814.

Figure 22:
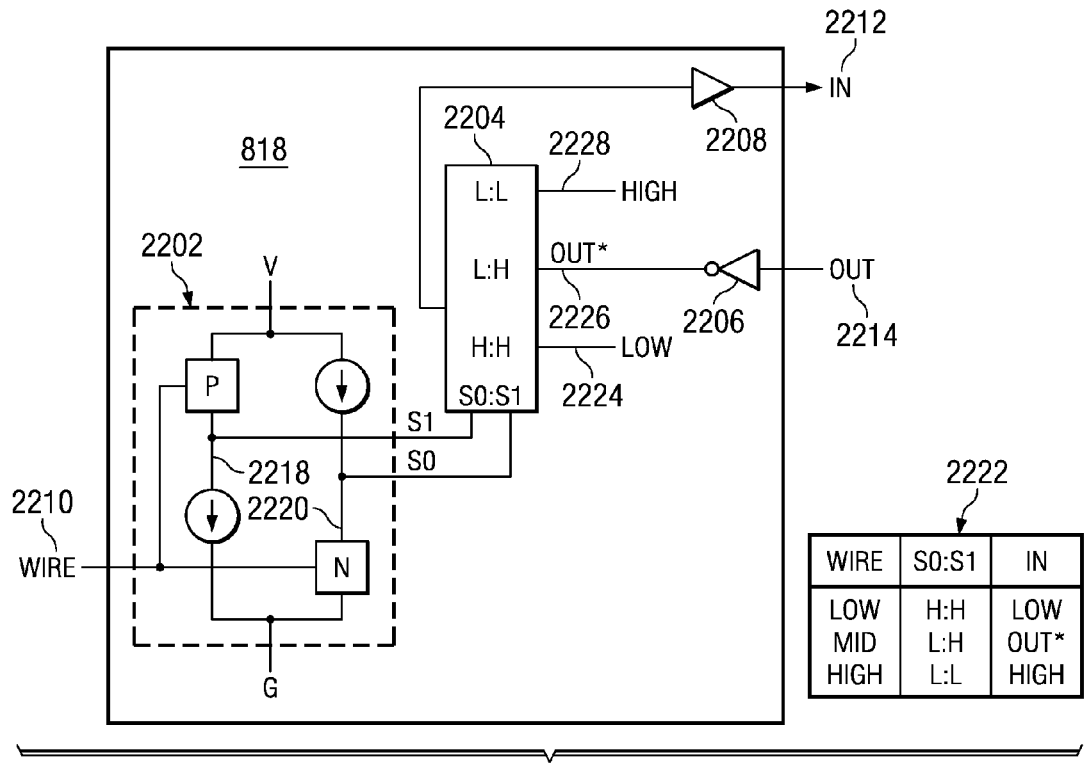
FIG. 22 illustrates the data input circuit of I/O buffers of the present disclosure.

FIG. 22 illustrates one example of how to design the data input circuit 818 of the I/O circuit 802 and 804. The data input circuit 818 includes a voltage comparator circuit 2202, a multiplexers 2204, an inverter 2206, and a buffer 2208. The voltage comparator circuit 2202 inputs voltages from its wire input 2210 and outputs digital control signals S0 and S1 to multiplexer 2204. The wire input 2210 for I/O circuit 802 is coupled to the TDI/TDO signal wire 2002 of FIG. 20 via TDI/TDO terminals of the controller 1708 and target circuits 1-N. The wire input 2210 for I/O circuit 804 is coupled to the TMS/RCK signal wire 2102 of FIG. 21 via TMS/RCK terminals of controller 1708 and target circuits 1-N.

As seen, the first voltage (V) to ground (G) leg 2218 of voltage comparator circuit 2202 comprises a series P-channel transistor and current source and the second voltage to ground leg 2220 comprises a series N-channel transistor and current source. As seen, S1 is connected at a point between the P-channel transistor and current source of the first leg 2218 and S0 is connected at a point between the N-channel transistor and current source of the second leg 2220. The gates of the transistors are connected to wire input 2210 to allow voltages on the wire signal 2210 to turn the transistors on and off.

The operation of the voltage comparator circuit 2202 and multiplexer 2204 is shown in table 2222 and described herein. If the voltage on wire input 2210 is at a low level (logic zero), the S0 and S1 outputs are set high, which causes the multiplexer 2204 to select its low input 2224 and output the low input to In signal 2212 via buffer 2208. If the voltage on wire input 2210 is at a mid level (mid point voltage), the S0 is set low and the S1 is set high, which causes the multiplexer 2204 to select its Out* input 2226 (inverted Out signal 2214) and output the Out* input to In 2212 via and buffer 2208. If the voltage on wire connection 2210 is high (logic one), the S0 and S1 outputs are set low, which causes the multiplexer 2204 to select its high input 2228 and output the high input to In 2212 via and buffer 2208.

For I/O circuits 802, the In signal 2212 is connected to the TDI signal 824 of the controller 1708 and Addressable Tap Domain Selection Circuits 514 of target circuits 1-N of FIG. 20, and the Out signal 2214 is connected to the TDO signal 820 of the controller 1708 and Addressable Tap Domain Selection Circuits 514 of target circuits 1-N of FIG. 20.

For I/O circuits 804, the In signal 2212 is connected to the RCK signal 826 of the controller 1708 and to the TMS signal 830 of the Addressable Tap Domain Selection Circuits 514 of target circuits 1-N of FIG. 21. The Out signal 2214 is connected to the TMS signal 830 of the controller 1708 and to the RCK signal 826 of the Addressable Tap Domain Selection Circuits 514 of target circuits 1-N of FIG. 21.

Figure 23A:
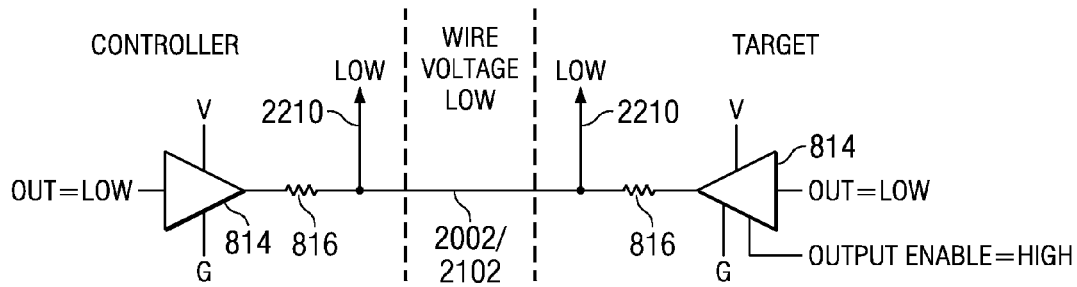

FIG. 23A illustrates the case where the output buffers 814 of the controller 1708 and an addressed target circuit are both outputting logic lows on TDI/TDO 2002 or TMS/RCK 2102 signal wires. In this case the signal wire 2002/2102 is low and the wire input 2210 to the data input circuits 818 is low. This causes the data input circuit 818 of the controller 1708 to input a low to the controller on In signal 2212 and the data input circuit 818 of the addressed target circuit to input a low to the target circuit on In signal 2212.

Figure 23B:
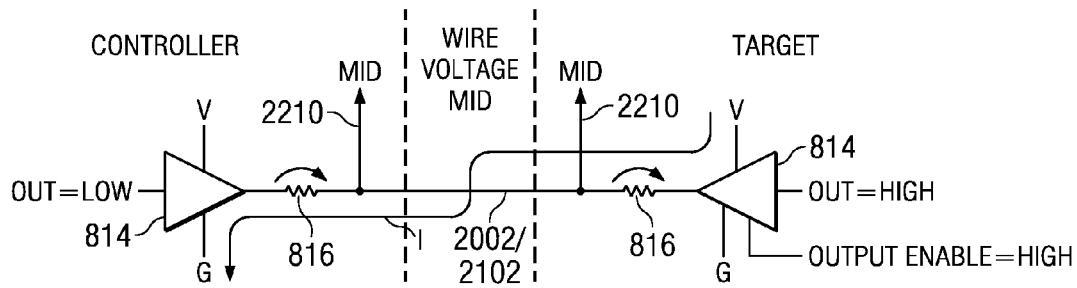

FIG. 23B illustrates the case where the output buffer 814 of the controller 1708 is outputting a low on signal wire 2002/2102 and the output buffer 814 of an addressed target circuit is outputting a high on signal wire 2002/2102. In this case a current path exists from the high voltage output (V) from the target circuit to the low voltage output (G) from the controller. The resistors 816 limit the current flow and the voltage drops across them produce a distinctly detectable mid point voltage level on the signal wire 2002/2102. The mid point voltage level on the signal wire 2002/2102 is input to the data input circuits 818 of the controller and target circuit via wire inputs 2210.

Since the data input circuit 818 of the controller 1708 knows the controller was outputting a logic low, it responds to the mid point voltage by inputting a logic high to the controller on In signal 2212, which is the only logic level that can be output from the target circuit to cause the mid point voltage on signal wire 2002/2102. Also since the data input circuit 818 of the target circuit knows the target circuit was outputting a logic high, it responds to the mid point voltage by inputting a logic low to the target circuit on In signal 2212, which is the only logic level that can be output from the controller to cause the mid point voltage on signal wire 2002/2102.

FIG. 23C illustrates the case where the output buffer 814 of the controller 1708 is outputting a high on signal wire 2002/2102 and the output buffer 814 of an addressed target circuit is outputting a low on signal wire 2002/2102. In this case a current path exists from the high voltage output (V) from the controller to the low voltage output (G) from the addressed target circuit. Again the resistors 816 limit the current flow and the voltage drops across them produce a distinctly detectable mid point voltage level on the signal wire 2002/2102. The mid point voltage level on the signal wire 2002/2102 is input to the data input circuits 818 of the controller and target circuit via wire inputs 2210.

Since the data input circuit 818 of the controller 1708 knows the controller was outputting a logic high, it responds to the mid point voltage by inputting a logic low to the controller on In signal 2212, which is the only logic level that can be output from the target circuit to cause the mid point voltage on signal wire 2002/2102. Also since the data input circuit 818 of the target circuit knows the target circuit was outputting a logic low, it responds to the mid point voltage by inputting a logic high to the target circuit on In signal 2212, which is the only logic level that can be output from the controller to cause the mid point voltage on signal wire 2002/2102.

FIG. 23D illustrates the case where the output buffers 814 of the controller 1708 and an addressed target circuit are both outputting logic high on signal wire 2002/2102. In this case the signal wire 2002/2102 is high and the wire input 2210 to the data input circuits 818 is high. This causes the data input circuit 818 of the controller 1708 to input a high to the controller on In signal 2212 and the data input circuit 818 of the addressed target circuit to input a high to the target circuit on In signal 2212.

FIG. 24 illustrates timing waveforms 2402 for the four cases (A,B,C,D) in which simultaneous data communication occurs between the I/O circuit 802/804 of controller 1708 and the I/O circuit 802/804 of an Addressable Tap Domain Selection Circuit 514 of an addressed target circuit via a TDI/TDO or TMS/RCK signal wire 2002/2102. In this example, the output enable 1 or 2 (OE1/OE2) signal 822/828 of the target circuit is set to enable output buffer 814. Each case A-D is indicated in the timing diagram by vertical dotted line boxes.

Case A shows the controller and the target circuit outputting lows from their buffers 814. In response, the wire 2002/2102 is low and both the controller and target circuit input lows via the In signal 2212 from their data input circuits 818.

Case B shows the controller outputting a low from its buffer 814 and the target circuit outputting a high from its buffer 814. In response, the wire 2002/2102 is at a mid voltage level causing the controller to input a high from the In signal 2212 of its data input circuit 818, while the target circuit inputs a low from the In signal 2212 of its data input circuit 818.

Case C shows the controller outputting a high from its buffer 814 and the target circuit outputting a low from its buffer 814. In response, the wire 2002/2102 is at a mid voltage level causing the controller to input a low from the In signal 2212 of its data input circuit 818, while the target circuit inputs a high from the In signal 2212 of its data input circuit 818.

Case D shows the controller and the target circuit outputting high from their buffers 814. In response, the wire 2002/2102 is high and both the controller and target circuit input highs via the In signal 2212 from their data input circuits 818.

Figure 25:
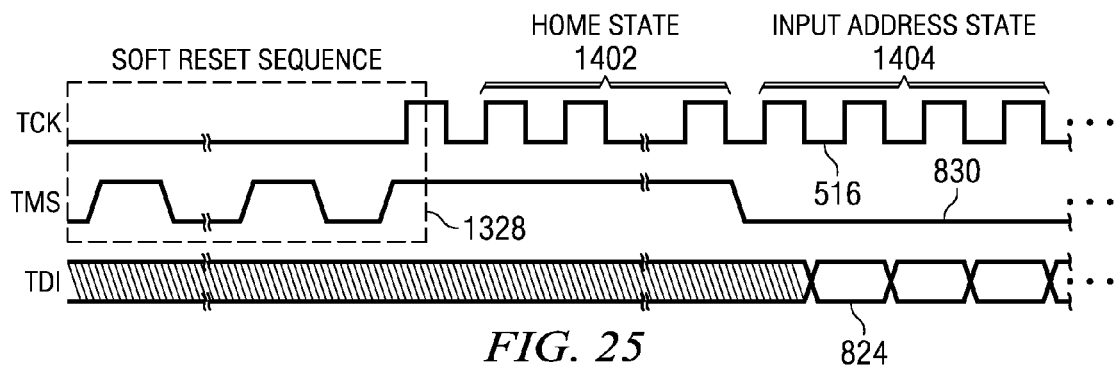
FIGS. 25-28 illustrate different sequences of performing first and second protocols of the present disclosure.

FIG. 25 illustrates a timing diagram of the operation of the present disclosure performing a first protocol Soft Reset Sequence 1328 followed by a second protocol showing entry into the Home state 1402 followed by entry into the Input Address state 1404.

Figure 26:
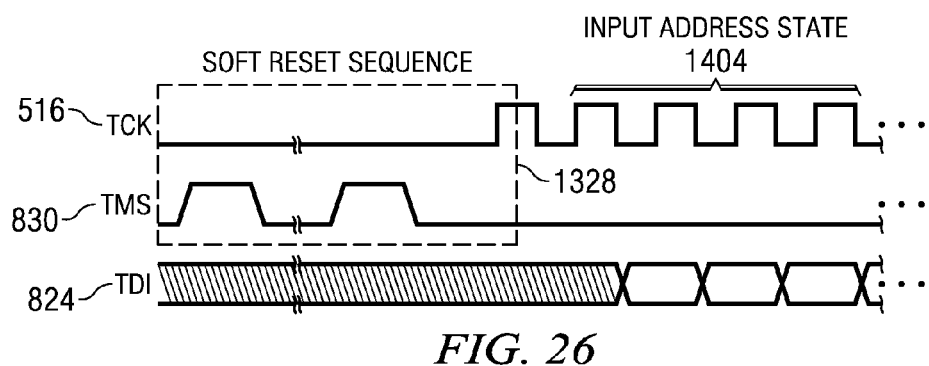

FIG. 26 illustrates a timing diagram of the operation of the present disclosure performing a first protocol Soft Reset Sequence 1328 followed by a second protocol that immediately enters the Input Address state 1404.

Figure 27:
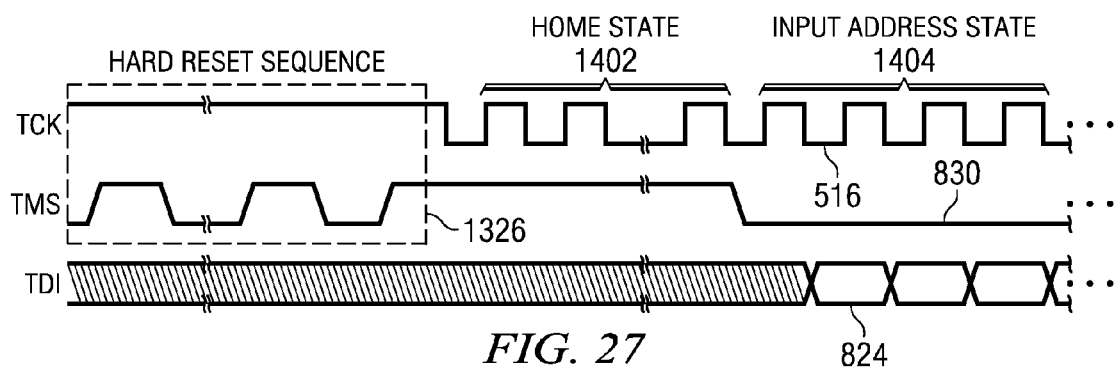
Figure 28:
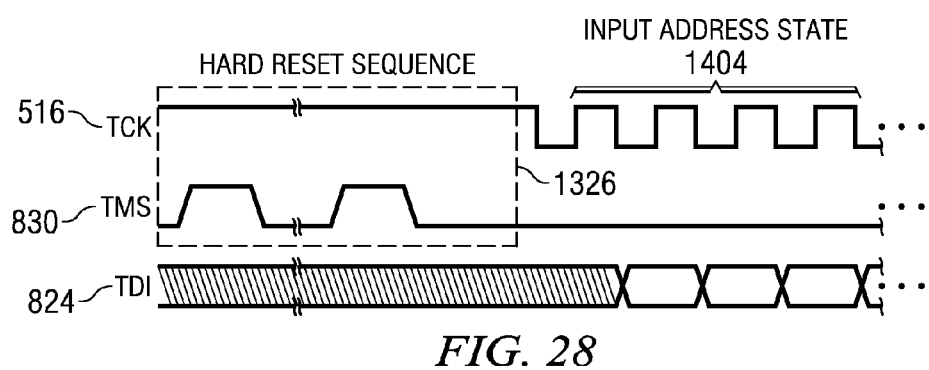

FIG. 27 illustrates a timing diagram of the operation of the present disclosure performing a first protocol Hard Reset Sequence 1326 followed by a second protocol showing entry into the Home state 1402 followed by entry into the Input Address state 1404.

FIG. 26 illustrates a timing diagram of the operation of the present disclosure performing a first protocol Hard Reset Sequence 1326 followed by a second protocol that immediately enters the Input Address state 1404.

Figure 29:
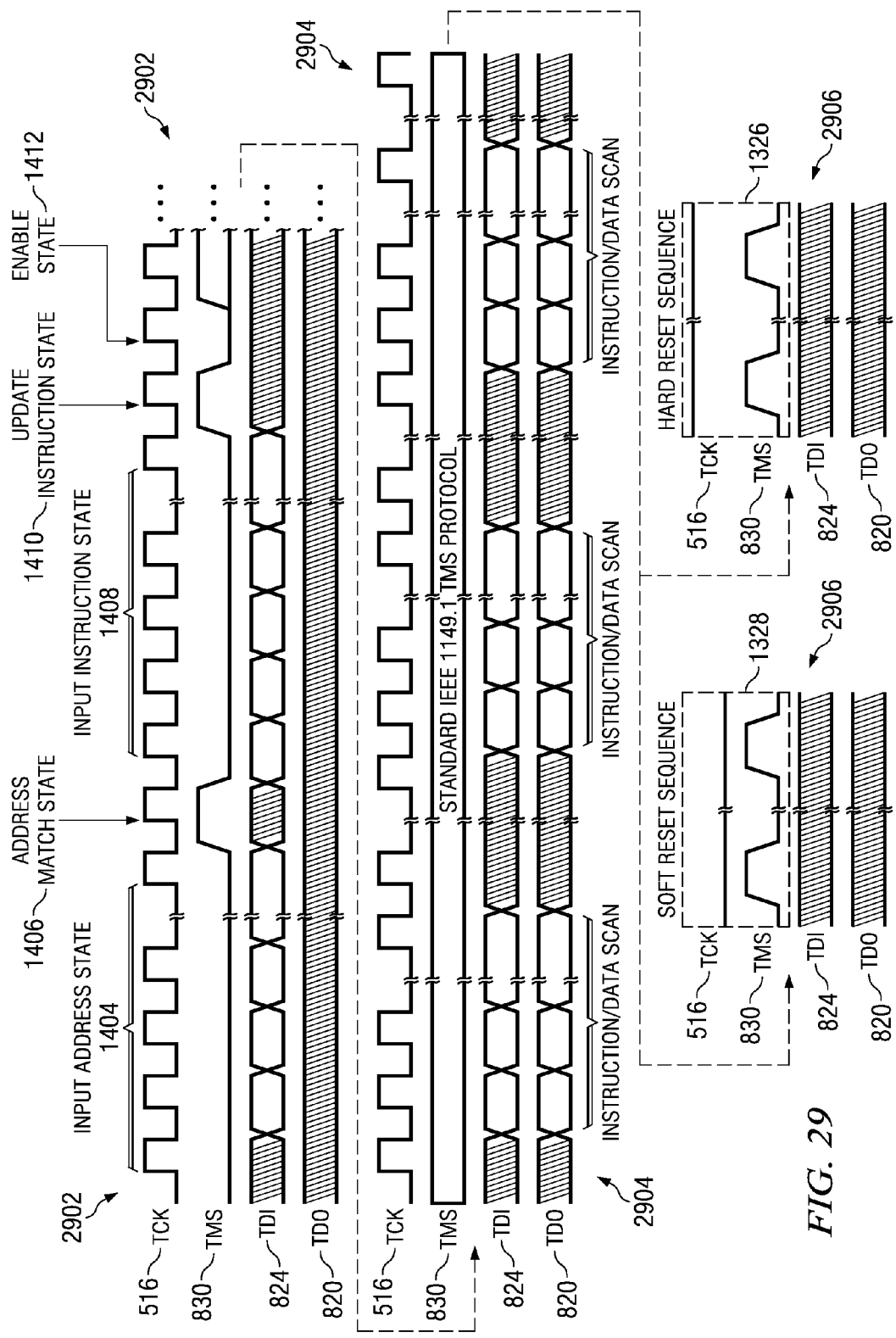
FIG. 29 illustrates the sequence of performing a second protocol, then a third protocol, then a first protocol according to the present disclosure.

FIG. 29 illustrates a timing diagram of the operation of the present disclosure performing a full second protocol sequence 2902 of inputting an address 1404, matching the address 1406, inputting an instruction 1408, updating the instruction 1410, and entering the enable state 1412, followed by performing a third protocol sequence 2904 to access the Tap domain(s) 510 selected by the instruction using the standard IEEE 1149.1 TMS protocol, followed by performing a first protocol sequence 2906 to input either a Soft Reset sequence 1328 or a Hard reset sequence 1326 to terminate the operation.

As seen, the second protocol 2902 uses the TCK 516, TMS 830, and TDI 824 signals, but not the TDO 820 signal. The third protocol 2904 uses the TCK 516, TMS 830, TDI 824, and TDO 820 signals according to the Tap protocol defined in standard IEEE 1149.1. The first protocols 2906 (1328 and 1326) use only the TCK 516 and TMS 830 signals. The timing diagram of FIG. 29 illustrates in detail the present disclosure performing the previously described protocols A-D 712-718 sequences discussed early in regard to FIG. 7B.

Figure 30:
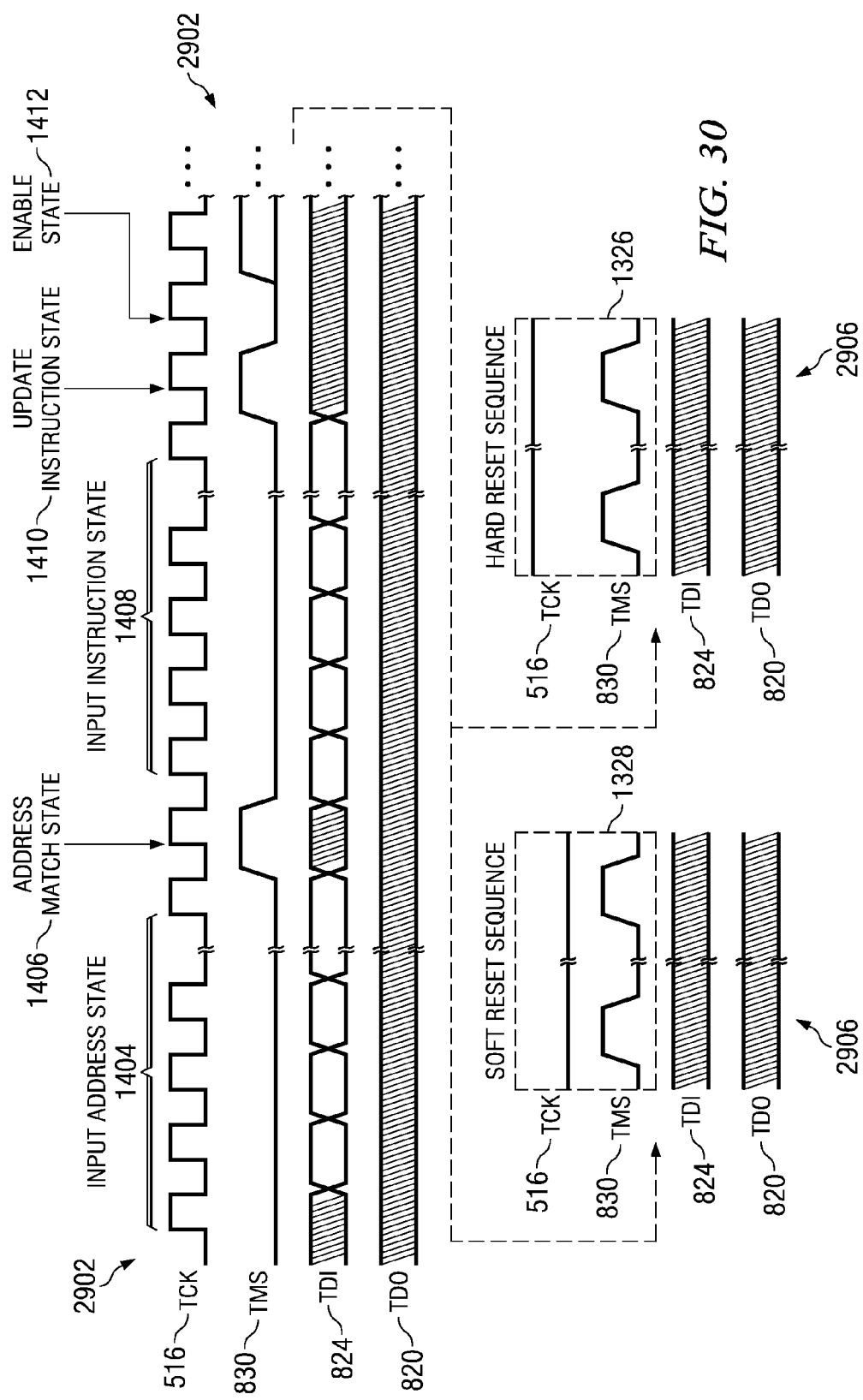
FIG. 30 illustrates the sequence of performing a second protocol, then a first protocol according to the present disclosure.

FIG. 30 illustrates a timing diagram of the operation of the present disclosure performing a full second protocol sequence 2902 of inputting an address 1404, matching the address 1406, inputting an instruction 1408, updating the instruction 1410, and entering the enable state 1412, followed by performing a first protocol sequence 2906 to input either a Soft Reset sequence 1328 or a Hard reset sequence 1326 to terminate the operation.

As seen, the second protocol 2902 uses the TCK 516, TMS 830, and TDI 824 signals, but not the TDO 820 signal. The first protocols 2906 (1328 and 1326) use only the TCK 516 and TMS 830 signals. The timing diagram of FIG. 30 illustrates in detail the present disclosure performing the previously described protocols E-H 720-726 sequences discussed early in regard to FIG. 7B.

While the description of the disclosure to this point has shown that the disclosure includes an Addressable Tap Domain Selection Circuit 514 capable of selecting one or more of a plurality of Tap Domains 510 within a Tap Region 522 (FIGS. 6 and 8) using a reduced number of interface signals, it is possible to simplify the disclosure when access to only one JTAG circuit Tap Domain is required. A reduction of interface signals is achieved in the simplified version of the disclosure.

Figure 1:
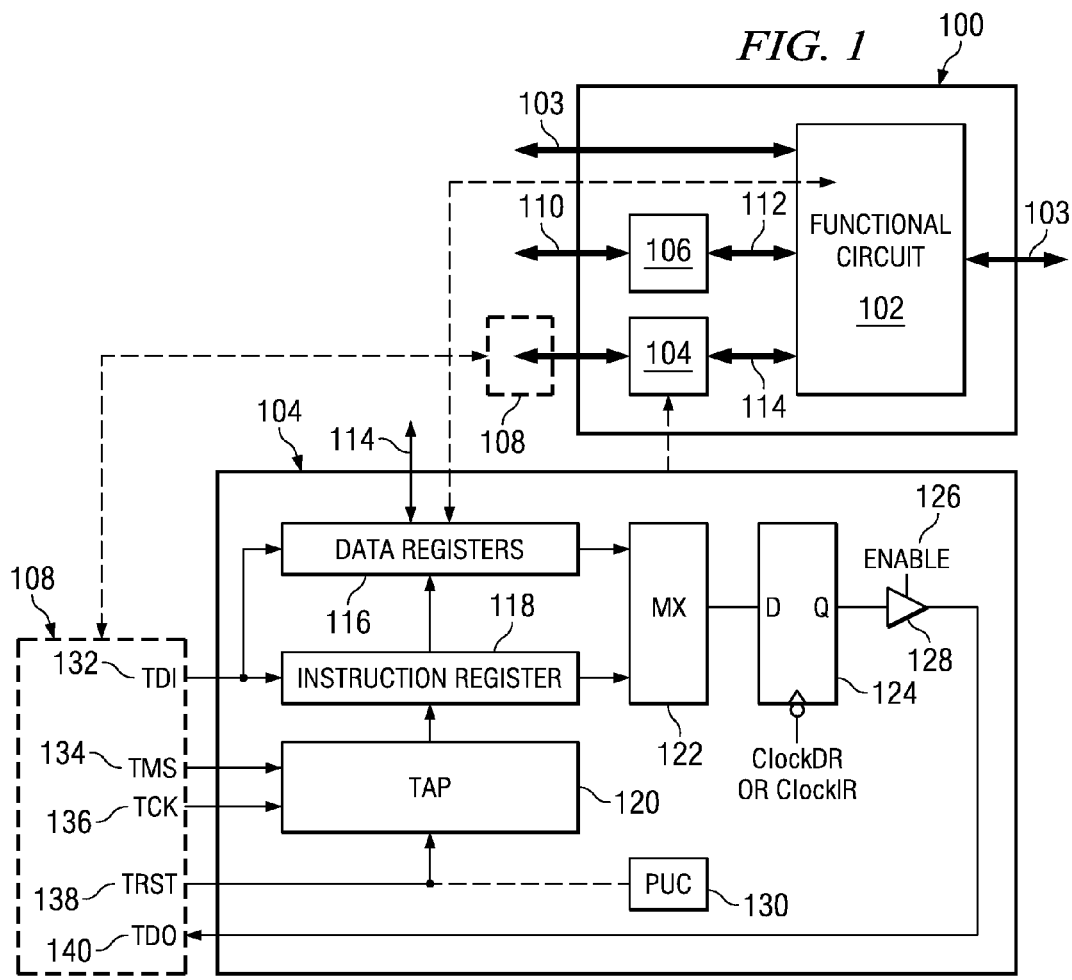
FIG. 1 illustrates an IC or core with a standard JTAG circuit Tap Domain.
Figure 31:
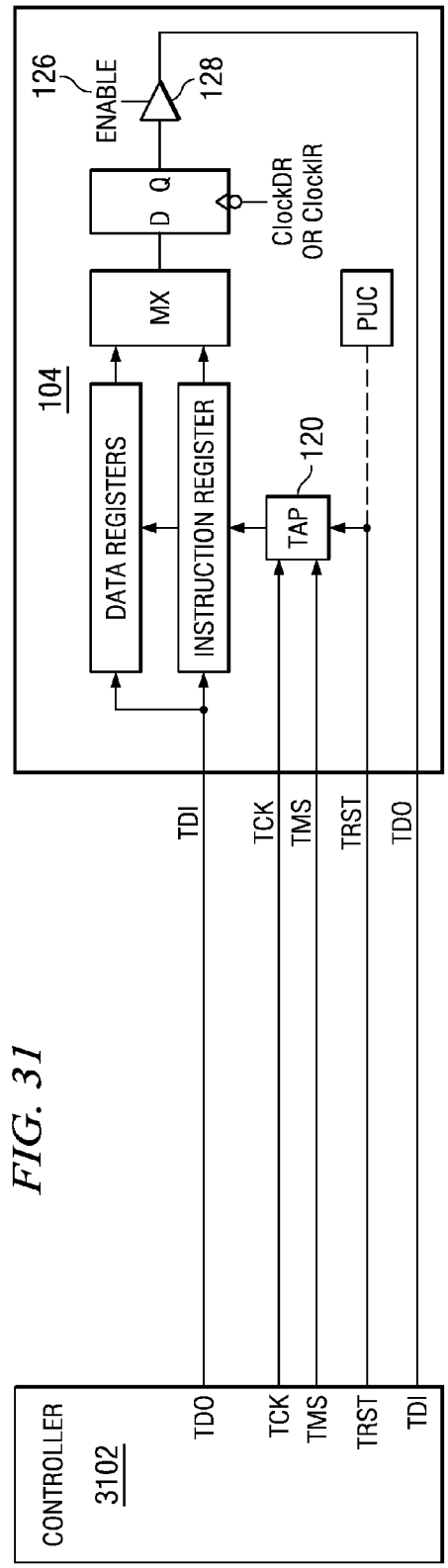
FIG. 31 illustrates an interface between an external controller and a standard JTAG circuit within an IC or core.

FIG. 31 illustrates a connected controller 3102 accessing the conventional JTAG circuit 104 of FIG. 1 using the 5 IEEE 1149.1 standard signals TDI, TDO, TMS, TCK, and TRST. The JTAG circuit 104 could be used in an IC or core for controlling test, debug, emulation, trace, boundary scan, or other operations of the IC or core.

Figure 32:
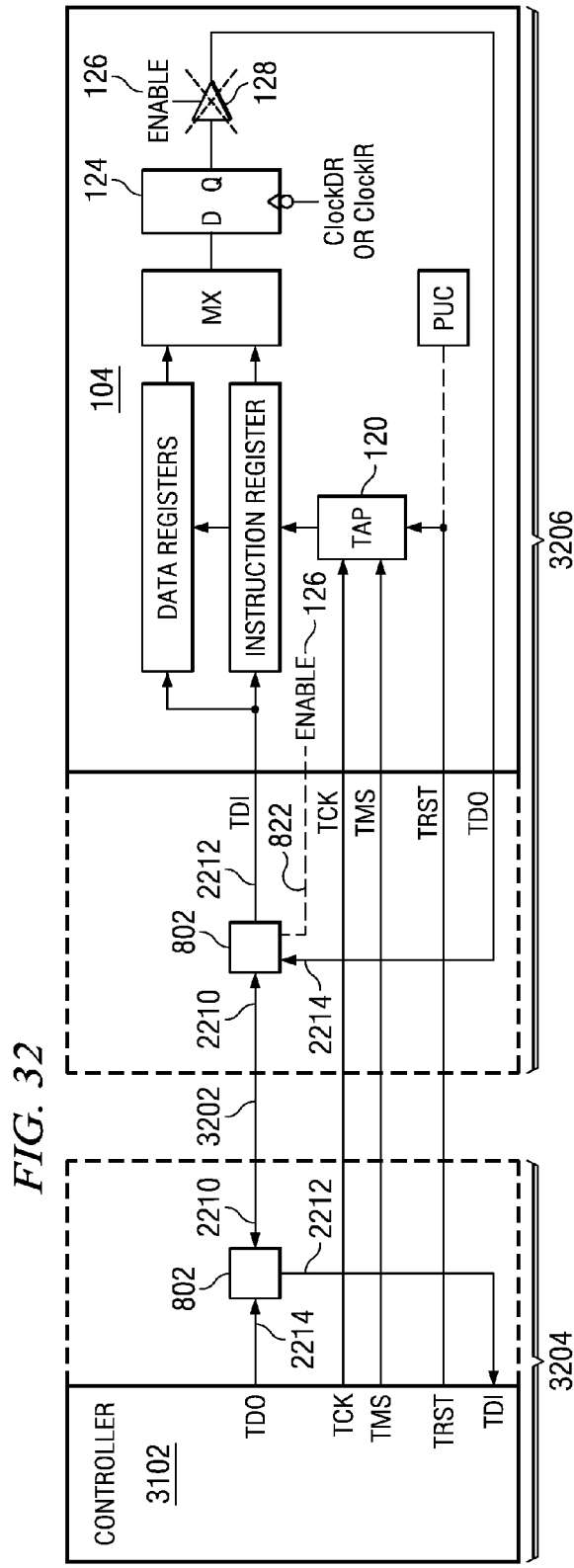
FIG. 32 illustrates a reduced interface between an external controller and a standard JTAG circuit within an IC or core according to the present disclosure.

FIG. 32 illustrates I/O circuits 802 of the present disclosure being used to reduce the signal interface between the connected controller 3102 and JTAG circuit 104 from 5 to 4 signals. One I/O circuit 802 is connected to the controller's TDO output via Out signal 2214, to the controllers TDI input via In signal 2212, and to the TDI/TDO signal wire 3202 via Wire signal 2210. The other I/O circuit 802 is connected to the JTAG circuit's TDO output via Out signal 2214, to the JTAG circuit's TDI input via In signal 2212, and to the TDI/TDO signal wire 3202 via Wire signal 2210.

As seen in FIG. 32, the I/O circuit 802 associated with the controller can exist as a separate circuit from the controller 3102 or the I/O circuit 802 may be integrated with the controller 3102 to form a new controller 3204. Preferably, but not necessarily, the output buffer 814 of the I/O buffer associated with the controller 3102 will be enabled all the time by setting its output enable signal 822 high, which allows the TDI/TDO wire 3202 to a always be driven to a valid signal level.

Also as seen in FIG. 32, the I/O circuit 802 associated with the JTAG circuit 104 can exist as a separate circuit from the JTAG circuit 104 or the I/O circuit 802 may be integrated with the JTAG circuit 104 to form a new JTAG circuit 3206. If the I/O circuit 802 associated with the JTAG circuit is a separate circuit, its output buffer 814 will be enabled, via output enable signal 822, all the time since their is no signal available from the JTAG circuit 104 to act as an enable or disable signal to the output buffer 814. If the I/O circuit 802 associated with the JTAG circuit 104 is integrated with the JTAG circuit 104 to form new JTAG circuit 3206, the output enable 822 of the I/O circuit 802 will be connected to the JTAG's Enable signal 126 so that the output buffer 814 can be enabled during TDI and TDO shift operations and disabled during non shift operations.

The Enable signal 126 is a standard signal output from Tap controller 120 during data and instruction shift operations. The Enable signal 126 controls the enable and disable state of the JTAG circuit's TDO tristate output buffer 128. If the I/O circuit 802 is integrated with JTAG circuit 104 to form new JTAG circuit 3206 it is preferred that the TDO tristate buffer 128 be removed, as indicated by crossed dashed lines, so that the TDO signal path formed between flip flop 124 and Out signal 2214 of I/O circuit 802 does not enter into a tristate (floating) state when shift operations are not being performed.

Figure 3:
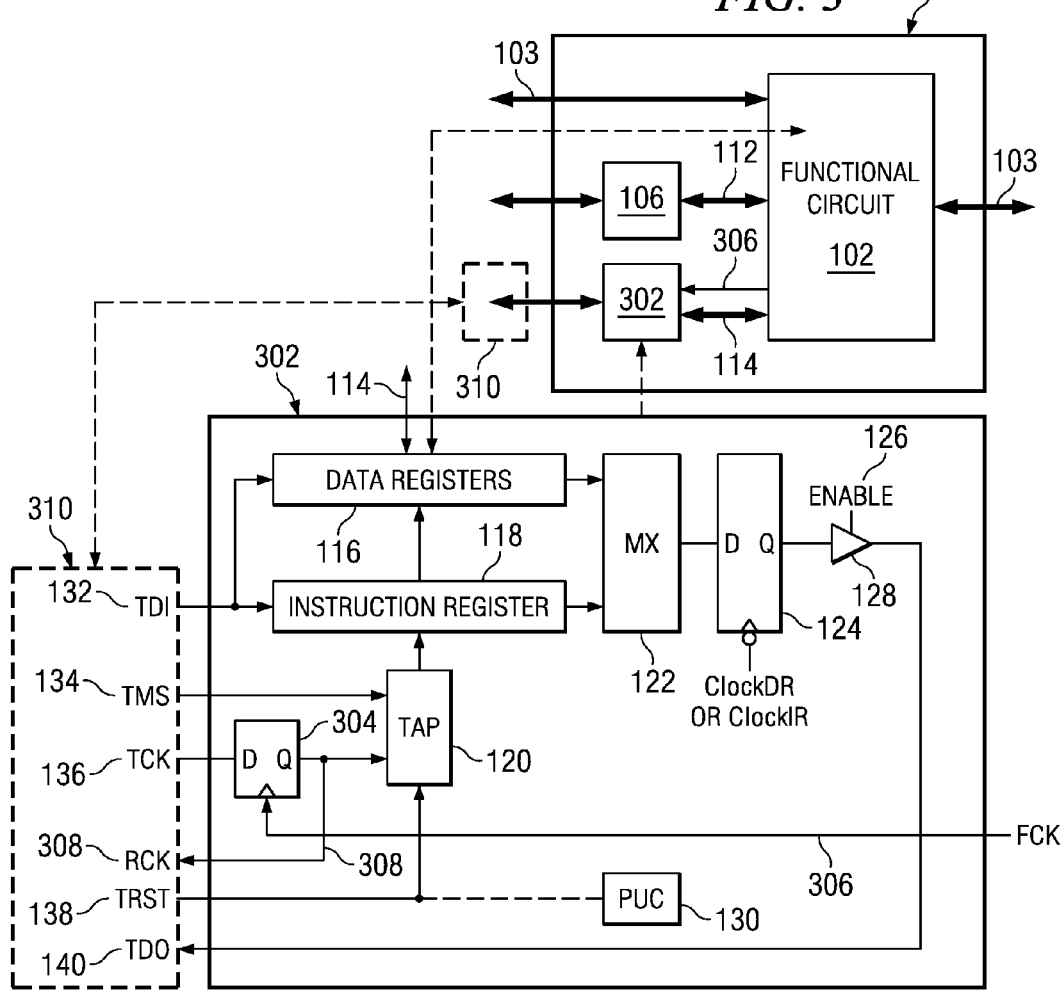
FIG. 3 illustrates an IC or core with a non-standard JTAG circuit Tap Domain.
Figure 33:
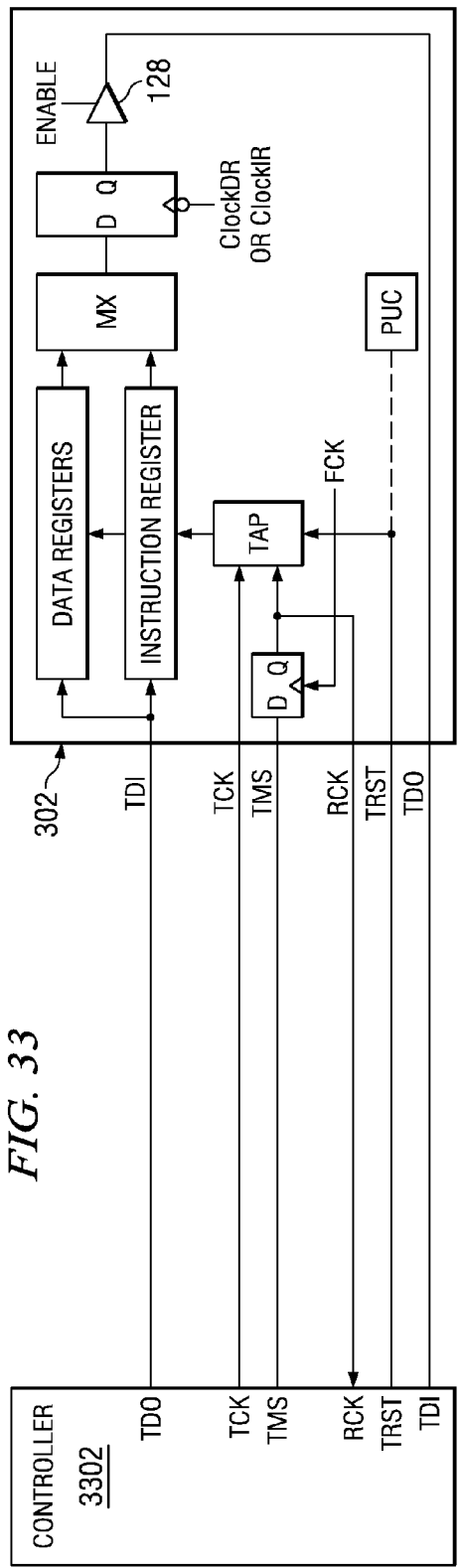
FIG. 33 illustrates a reduced interface between an external controller and a non-standard JTAG circuit within an IC or core according to the present disclosure.

FIG. 33 illustrates a connected controller 3302 accessing the JTAG circuit 302 of FIG. 3 using the 5 IEEE 1149.1 standard signals TDI, TDO, TMS, TCK, and TRST plus the non-standard RCK signal. The JTAG circuit 302 could be used in an IC or core for controlling test, debug, emulation, trace, boundary scan, or other operations of the IC or core.

Figure 34:
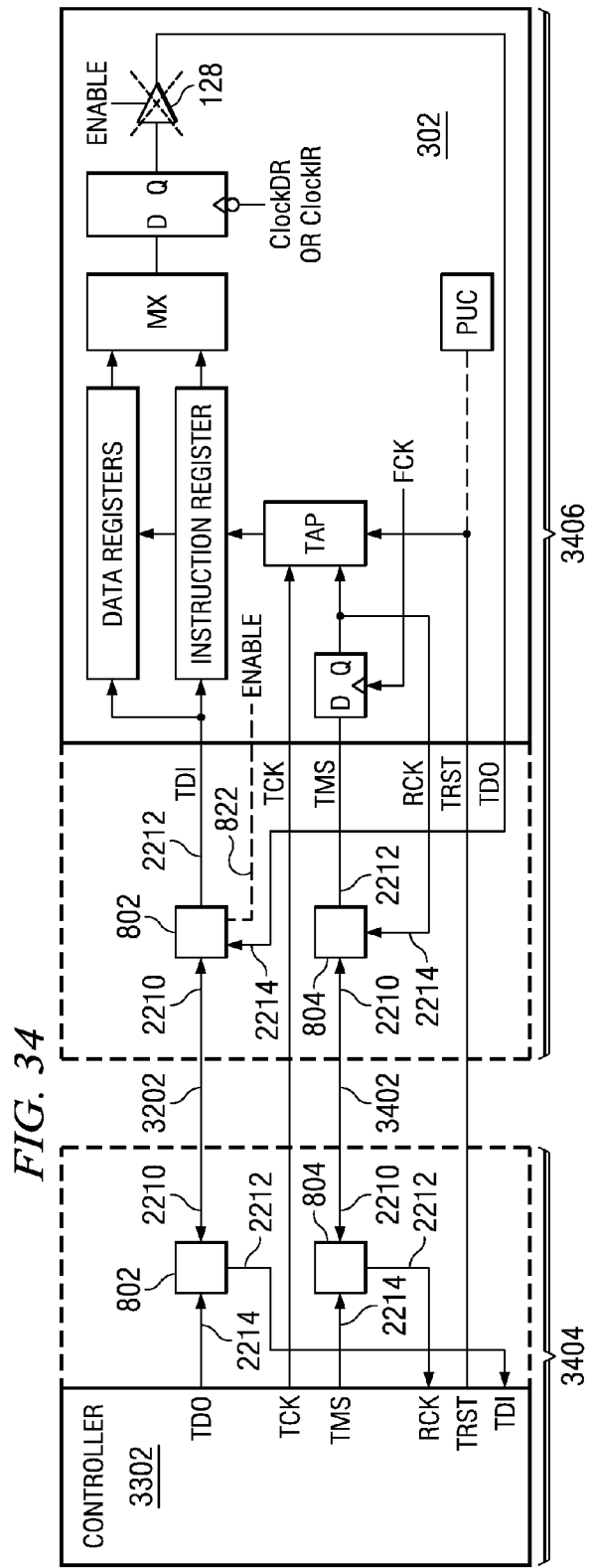

FIG. 34 illustrates I/O circuits 802 and 804 of the present disclosure being used to reduce the signal interface between the connected controller 3302 and JTAG circuit 302 from 6 to 4 signals. The connection and operation of I/O circuits 802 associated with controller 3302 and JTAG circuit 302 are the same as described previously in FIG. 32 in the following separate and integrated implementation descriptions of I/O circuit 804. One I/O circuit 804 is connected to the controller's TMS output via Out signal 2214, to the controllers RCK input via In signal 2212, and to the TMS/RCK signal wire 3402 via Wire signal 2210. The other I/O circuit 804 is connected to the JTAG circuit's RCK output via Out signal 2214, to the JTAG circuit's TMS input via In signal 2212, and to the TMS/RCK signal wire 3402 via Wire signal 2210.

As seen in FIG. 34, the I/O circuit 804 associated with the controller can exist as a separate circuit from the controller 3302 or the I/O circuit 804 may be integrated with the controller 3302 to form a new controller 3404. Preferably, but not necessarily, the output buffer 814 of the I/O buffer associated with the controller 3302 will be enabled all the time by setting its output enable signal 822 high, which allows the TMS/RCK wire 3402 to a always be driven to a valid signal level.

Also as seen in FIG. 34, the I/O circuit 804 associated with the JTAG circuit 302 can exist as a separate circuit from the JTAG circuit 302 or the I/O circuit 804 may be integrated with the JTAG circuit 302 to form a new JTAG circuit 3406. Regardless of whether I/O circuit 804 is a separate circuit or integrated with JTAG circuit 302, its output buffer 814 will be enabled, by setting its output enable signal 822 high, all the time since the RCK signal of JTAG circuit 302 must always be output to the controller 3302 during test, debug, emulation, trace, and/or other operations.

From the above examples shown in FIG. 31-34, it is clear that the I/O circuits 802-804 of the present disclosure can be used to provide a method of reducing the interface signals between a controller 3102, 3204, 3302, and 3404 and a JTAG circuit 104, 3206, 302, and 3406. While the access approach described in FIGS. 31-34 is a point-to-point access between a controller and a connected JTAG circuit, i.e. it does not provide the multiple JTAG circuit Tap Domain selecting features as described earlier in the present disclosure, it does offer a reduced signal interfacing approach which is simple and can be realized with a minimum of additional circuitry.

FIG. 35 illustrates an IC or core 3504 containing the emulation, trace, and/or debug circuit 106 of FIG. 1 coupled internally to a functional circuit 102 of the IC or core via bus 112 and externally to an emulation, trace, and/or debug interface 3506 of a controller 3502 via bus 110. The bus 110 consists of input and output connections for allowing signals to flow between circuit 3506 and 106 during an emulation, trace, and/or debug operation. In this example, 8 connections are used on bus 110.

The signals could be control signals, data signals, triggering signals, protocol signals used in message communications, and/or other signals used during an I/O operation of an emulation, trace, and/or debug operation. To increase the bandwidth of signal flow between the IC/core 3504 and controller 3502 it is advantageous to have as many input and output signals on bus 110 as possible. However, only so many IC terminals may be used on bus 110, since the IC's functional input and output terminals 103 take priority and therefore will consume most of the available IC input and output terminals.

FIG. 36 illustrates how the controller 3502 and IC/core 3504 of FIG. 35 can be adapted with I/O circuits 802 of the present disclosure to reduce the number of signal connections between the controller and IC/core by one half without reducing the signaling bandwidth.

As seen in FIG. 36, controller circuit 3602 differs from controller circuit 3502 of FIG. 35 in that the input and output signals of bus 110 to emulation, trace, and debug circuit 3506 are interfaced to I/O circuits 802, via the I/O circuit's input 2214 and output 2212. If desired, circuit 3506 may optionally be modified, as seen in dotted line, to allow inputting control to the 802 I/O circuit's output enable signal 822, otherwise the output enable 822 input of I/O circuit 802 will be fixed to always enable the output buffer 814 of I/O circuit 802.

Similarly, the IC/core circuit 3604 differs from IC/core circuit 3504 in that the input and output signals of bus 110 to emulation, trace, and debug circuit 106 are interfaced to I/O circuits 802, via the I/O circuit's input 2214 and output 2212. If desired, circuit 106 may optionally be modified, as seen in dotted line, to allow inputting control to the 802 I/O circuit's output enable signal 822, otherwise the output enable 822 input of I/O circuit 802 will be fixed to always enable the output buffer 814 of I/O circuit 802.

As seen in FIG. 36, the number of bus 3606 connections, via wire terminals 2210 of the I/O circuits 802 of circuits 3602 and 3604, is reduced by one half of that shown in bus 110 of FIG. 35. Thus, the present disclosure provides a way of reducing the number of required emulation, debug, and/or trace signal connections between circuits 3602 and circuits 3604 of FIG. 36 on bus 3606 by one half that used in the prior art of FIG. 35.

The following FIGS. 37-40 are provided to illustrate how the I/O circuits 802 (or 804) can be used to reduce the functional signal connections between functional circuits of an IC or core circuit.

FIG. 37 illustrates ICs or cores 3702 and 3704 each containing the functional circuit 102 of FIG. 1. At least some of the functional circuits 102 inputs and outputs are coupled to each other via functional bus 103 of FIG. 1. The bus 103 consists of input and output connections for allowing signals to flow between functional circuits 102 during functional operation. In this example, 8 connections are used on bus 103. The signals could be data bus signals, address bus signals, or control bus signals used during functional communicating between functional circuits 102.

Figure 38:
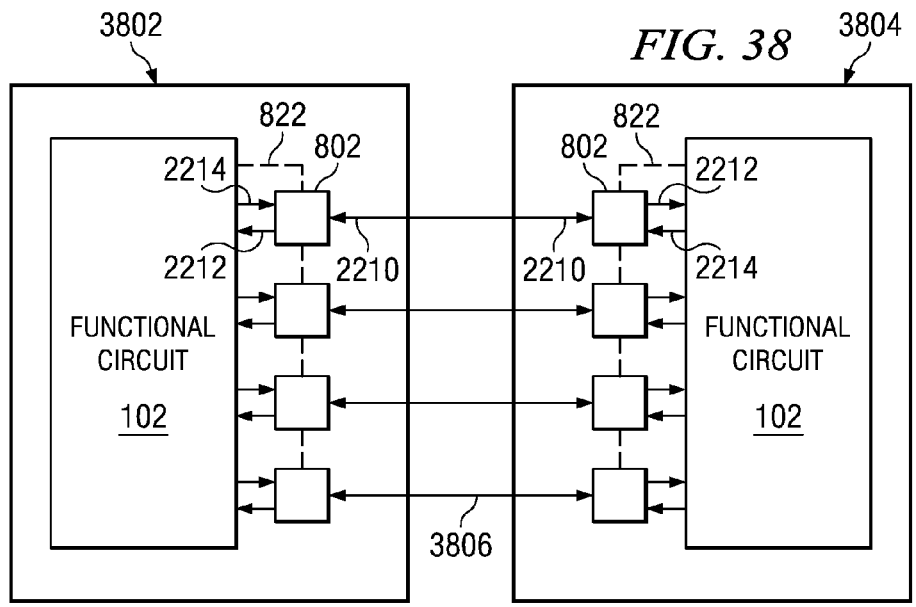
FIG. 38 illustrates a reduced functional interface between first and second functional circuits of an IC or core according to the present disclosure.

FIG. 38 illustrates how the functional circuits 102 of ICs or cores 3702 and 3704 can be adapted with I/O circuits 802 of the present disclosure to reduce the number of signal connections on functional bus 103 between the functional circuits 102. As seen, the functional bus 3806 between the adapted ICs or cores 3802 and 3804 require only one half the connections required by functional bus 103 of FIG. 37. Also functional bus 3806 maintains the signaling bandwidth of functional bus 103 of FIG. 37.

As seen in FIG. 38, IC or core circuits 3802 and 3804 differ from IC or core circuits 3702 and 3704 of FIG. 37 in that the input and output signals of bus 103 to functional circuits 102 are interfaced to I/O circuits 802, via the I/O circuit's input 2214 and output 2212. Also as seen, functional circuits 102 in IC or core circuits 3802 and 3804 may optionally be modified, as seen in dotted line, to allow inputting control to the 802 I/O circuit's output enable signal 822, otherwise the output enable 822 input of I/O circuit 802 will be fixed to always enable the output buffer 814 of I/O circuit 802.

As seen in FIG. 38, the number of bus 3806 connections, via wire terminals 2210 of the I/O circuits 802 of circuits 3802 and 3804, is reduced by one half of that shown in bus 103 of FIG. 37. Thus, the present disclosure provides a way of reducing the number of required functional signal connections between IC or core circuits 3802 and 3804 of FIG. 38 on bus 3806 by one half that used in the prior art functional bus 103 of FIG. 37.

Figure 39:
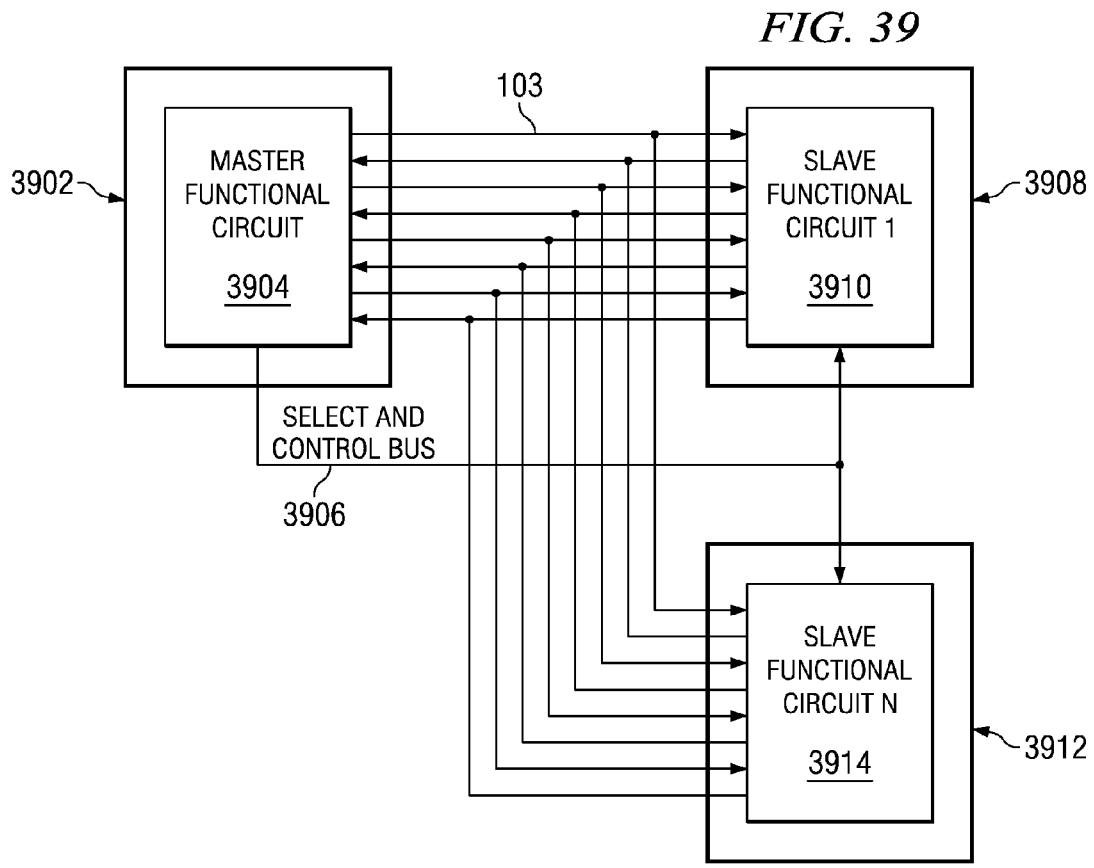
FIG. 39 illustrates a functional interface between a master functional circuit in a first IC or core and slave functional circuits in second and third ICs or cores.

FIG. 39 illustrates conventional ICs 3902, 3908, 3912 on a board/substrate or core circuits 3902, 3908, 3912 within an IC being connected functionally together via functional bus 103 and select and control bus 3906. IC/core 3902 contains a master functional circuit 3904, such as a processor or DSP, that controls communication to slave functional circuits 3910 and 3914, such as memories or other types of input and output circuits, in IC/cores 3908 and 3912 via buses 103 and 3906. In this example, the select and control bus 3906 from the master functional circuit functions as a bus that selects a functional slave circuit 3910 or 3914 then inputs control to cause the selected slave circuit to input data from the master circuit or to output data to the master circuit via bus 103. The functional bus 103 in this example is 8 signals wide.

Figure 40:
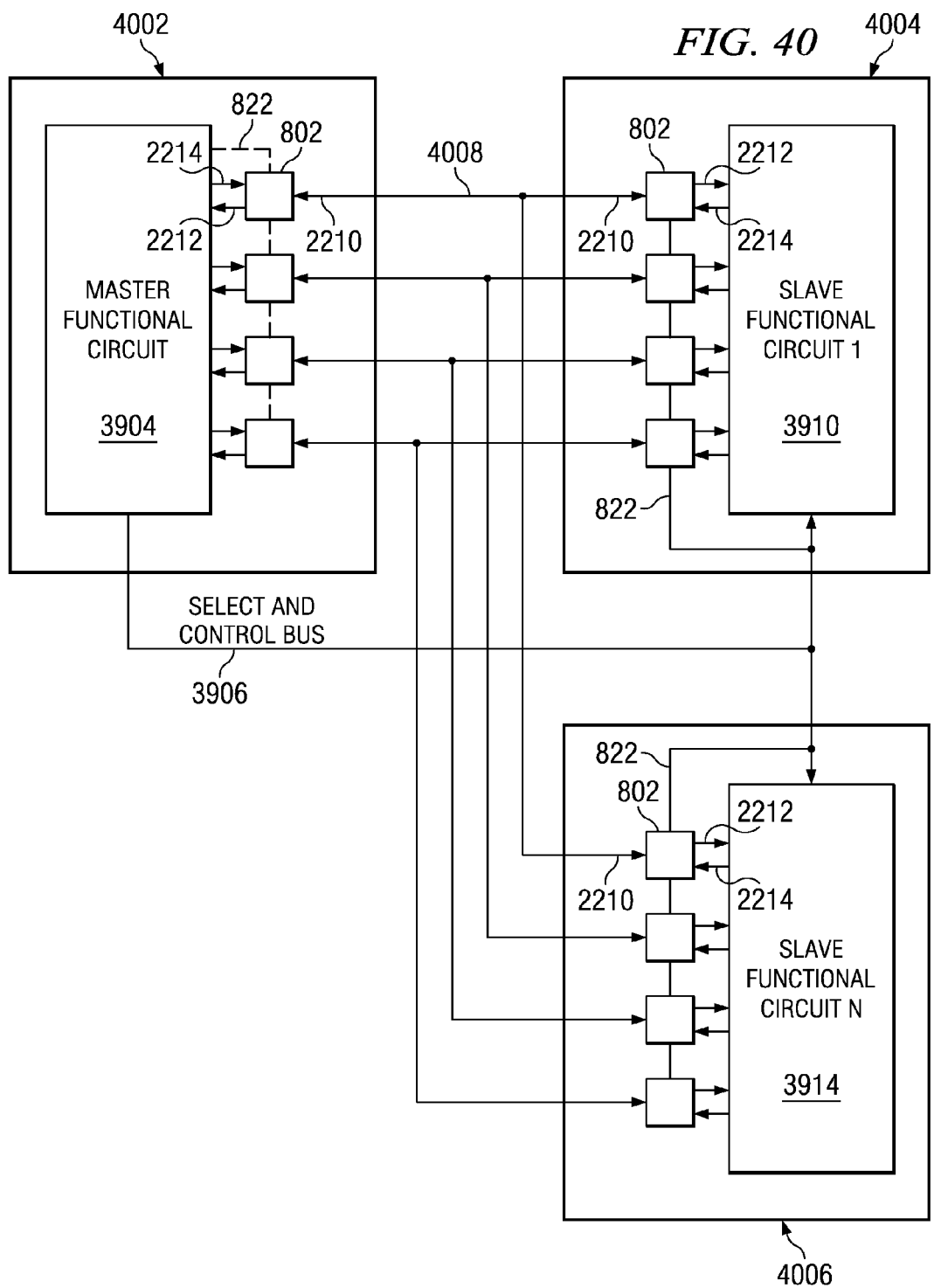
FIG. 40 illustrates a reduced functional interface between a master functional circuit in a first IC or core and slave functional circuits in second and third ICs or cores according to the present disclosure.

FIG. 40 illustrates how the functional circuits 3904, 3910, 3914 can be adapted with I/O circuits 802 of the present disclosure to reduce the number of signal connections on functional bus 103 between the functional circuits. As seen, the functional bus 4008 between the adapted ICs or cores 4002, 4004, 4006 require only one half the connections required by functional bus 103 of FIG. 39. Also functional bus 4008 maintains the signaling bandwidth of functional bus 103 of FIG. 39.

As seen in FIG. 40, IC or core circuits 4002-4006 differ from IC or core circuits 3902, 3908, and 3912 of FIG. 39 in that the input and output signals of bus 103 to functional circuits 3904, 3910, 3914 are interfaced to I/O circuits 802, via the I/O circuit's input 2214 and output 2212. Also as seen, the master functional circuit 3904 of IC/core circuit 4002 may optionally be modified, as seen in dotted line, to allow inputting control to the 802 I/O circuit's output enable signal 822, otherwise the output enable 822 input of I/O circuit 802 will be fixed to always enable the output buffer 814 of I/O circuit 802. Providing the ability to disable the output buffer 814 of I/O circuits 802 connected to master functional circuit 2904 in IC/core circuit 4002 allows for the output buffers 814 of a selected slave functional circuit's I/O circuits 802, say slave circuit 3910, to be enabled to drive the bus 4008 to communicate data to another one or more of the slave functional circuits, say slave circuit 3914.

As seen in FIG. 40, the number of bus 4008 connections, via wire terminals 2210 of the I/O circuits 802 of circuits 4002, 4004, 4008, is reduced by one half of that shown in bus 103 of FIG. 39. Thus, the present disclosure provides a way of reducing the number of required functional signal connections between IC or core circuits 4004-4006 of FIG. 40 on bus 4008 by one half that used in the prior art functional bus 103 of FIG. 39.

While the preceding description has shown and described the Addressable Tap Domain Selection Circuit 514 as having a 3 pin interface consisting of TCK, TMS/RCK, and TDI/TDO signals, the Addressable Tap Domain Selection Circuit 514 may be designed to use the standard IEEE 1149.1 TDI, TDO, TMS, and TCK signals, plus the non-standard RCK signal.

Figure 41:
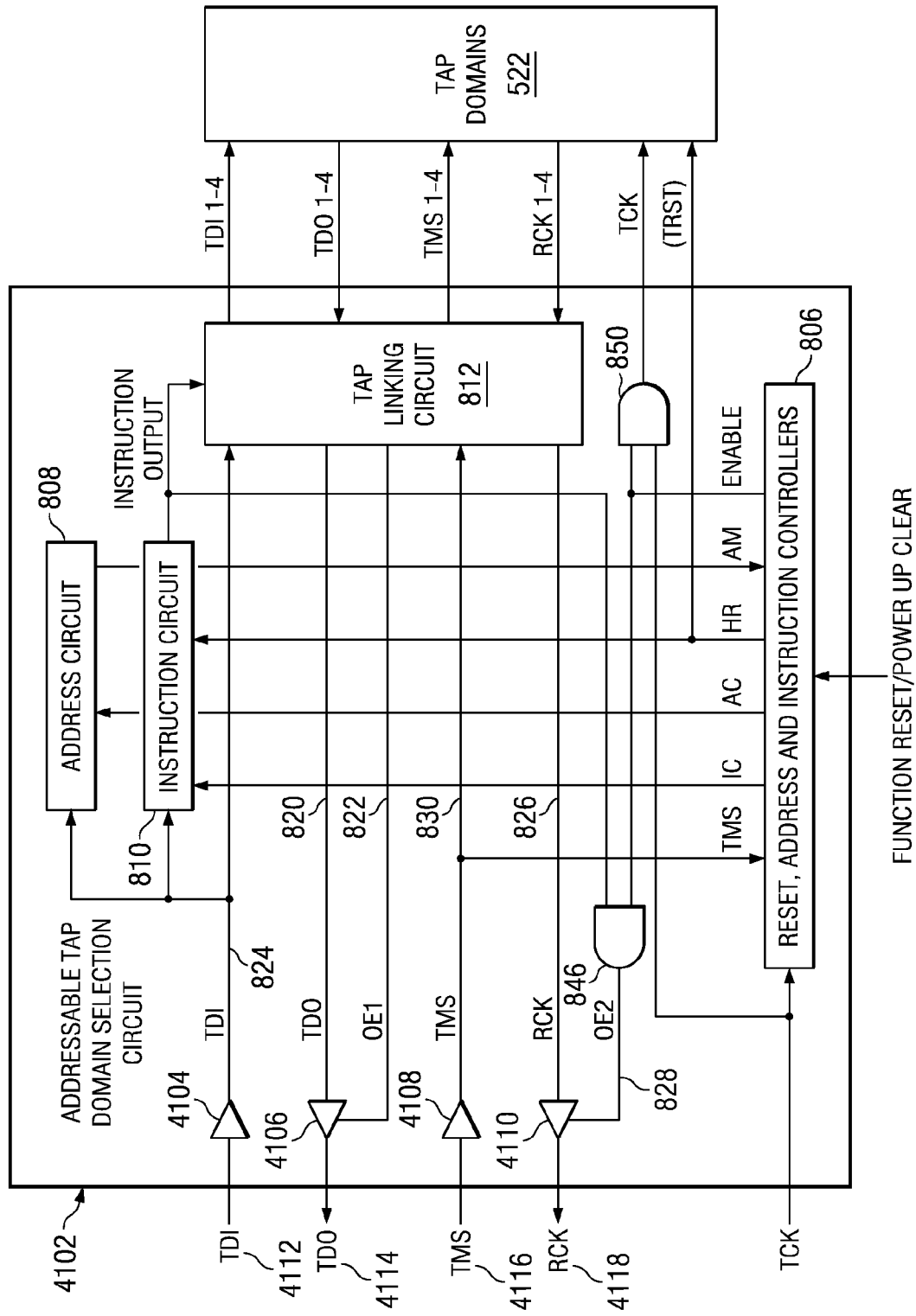
FIG. 41 illustrates an Addressable Tap Domain Selection circuit similar to that of FIG. 8 with the TDI, TDO, TMS, and RCK signals coupled via buffers to externally accessible signal terminals.

FIG. 41 illustrates an Addressable Tap Domain Selection circuit 4102 that has been designed in an IC or core to use the standard IEEE 1149.1 interface signals TDI, TDO, TMS, TCK, and non-standard RCK signal. The only difference between the Addressable Tap Domain Selection circuit 4102 and the Addressable Tap Domain Selection circuit 514 of FIG. 8 is that the I/O circuits 802 and 804 have been removed and the TDI 824, TDO 820, TMS 830, and RCK 826 signals have been coupled, via buffers 4104-4110, to externally accessible signal terminals TDI 4112, TDO 4114, TMS 4116, and RCK 4118, respectively.

The operation of Addressable Tap Domain Selection circuit 4102, in response to the first, second, and third protocols, is identical to that previously described with Addressable Tap Domain Selection circuit 514. For example, the first protocol uses TCK and TMS 830 as previously described for Hard and Soft resets, the second protocol uses TCK, TMS 830, and TDI 824 as previously described for loading address and instruction, and the third protocol uses TCK, TMS 830, TDI 824, and TDO 820 as previously described to access Tap domains. The only difference is that is that TDI 824 is coupled to a TDI input terminal 4112 instead of I/O circuit 802, TDO 820 is coupled to a TDO output terminal 4114 instead of I/O circuit 802, and TMS 830 is coupled to a TMS input terminal 4116 instead of I/O circuit 804. Also the RCK 826 is coupled to RCK output terminal 4118 instead of I/O circuit 804.

As seen, the control input of output buffer 4106 is coupled to OE1 822 to enable TDO output during shift operations and to disable TDO output during non-shift operations during third protocol (JTAG) operations. Also, the control input of output buffer 4110 is coupled to OE2 enable or disable RCK outputs during third protocol (JTAG) operations.

Figure 42:
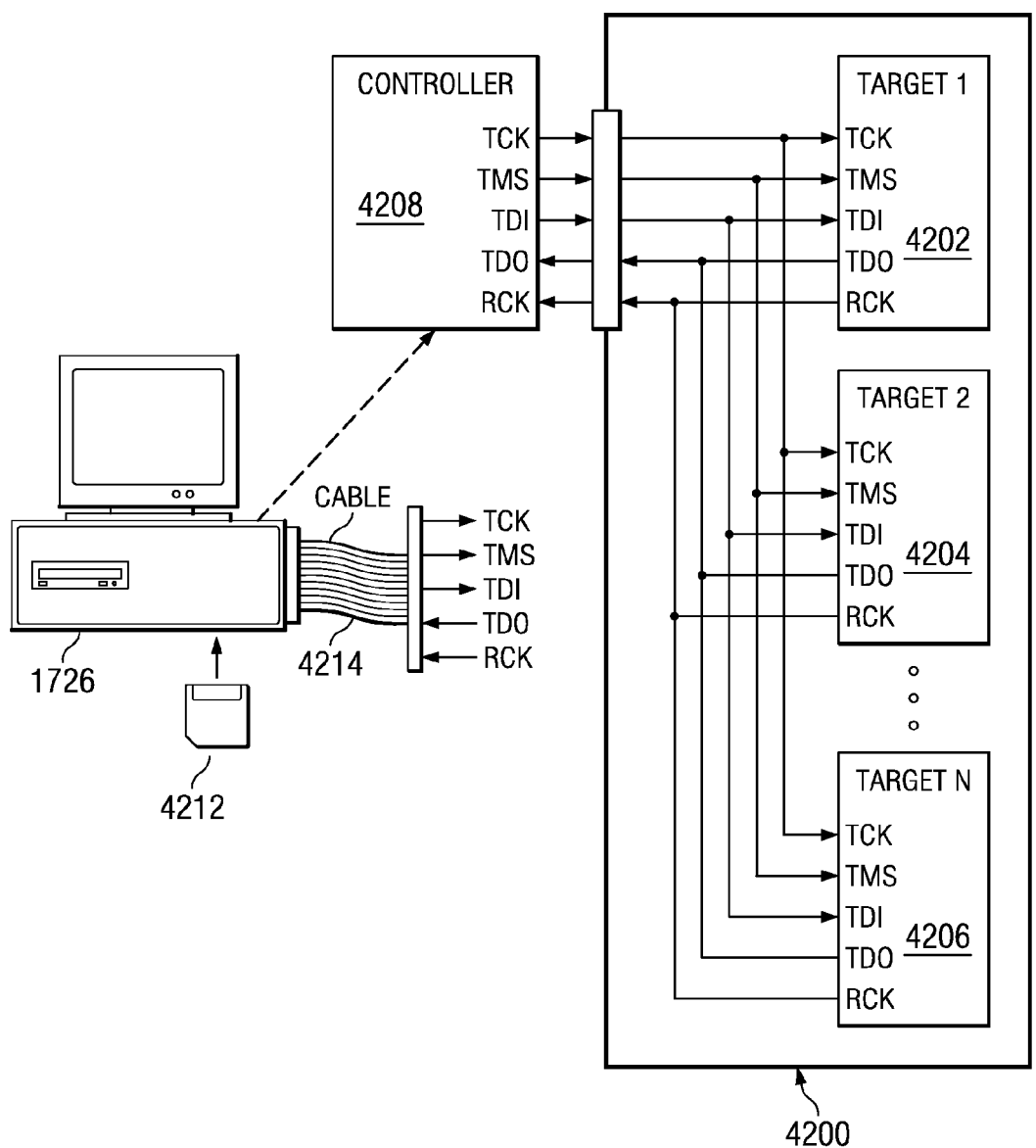
FIG. 42 illustrates a group of target devices on a board or other substrate, each target device including the Addressable Tap Domain Selection Circuit and its associated 5 pin TCK, TDI, TDO, TMS, and RCK interface, as well as Tap Domain Region.

FIG. 42 illustrates a group of target devices 4202-4206 on a board or other substrate 4200, each target device including the Addressable Tap Domain Selection Circuit 4102 and its associated 5 pin TCK, TDI, TDO, TMS, and RCK interface, as well as Tap Domain Region 522. The target devices could be packaged ICs or unpackaged IC die. The 5 pin interface of each target device is coupled to an external controller 4208 via cable connector 4210 to provide access for test, debug, emulation, and trace operations. Each target device 4202-4206 may contain embedded core target circuits as described in FIG. 17, which also are interfaced to the external controller 4208 via the 5 pin interface. As indicated, the external controller 4208 may be realized by using an interface card 4212 in a personal computer 1726 to control the 5 pin interface communication with the targets 4202-4206 via a cable connection 4214. The 5 pin interface communicates to target circuits using the previously mentioned first, second, and third protocols.

Each target 4202-4206 has the previously mentioned local address to allow it to be individually addressed and instructed by the controller 4208 using the second protocol. Following the individual addressing and instructing of a target using the second protocol, the Tap Domains 510 within the target may be accessed by the controller 4208 using the third protocol to perform test, debug, emulation, and/or trace operations. Additionally, each target has the previously mentioned global address to allow all targets to be simultaneously addressed and instructed using the second protocol for the purposes previously mentioned in regard to FIG. 17.

When a target is selected for a third protocol (JTAG) communication to one or more of its Tap Domains, its TDO 4114 terminal will be enabled by OE1 to output TDO 820 data from the Tap Domain(s) during the 1149.1 Shift-IR and Shift-DR states as previously mentioned. During third protocol (JTAG) operations to Tap Domains with RCK signals, the RCK 4118 terminal will be enabled by OE2 to output RCK 826 signals to the controller 4208. During third protocol (JTAG) operations to Tap Domains without RCK signals, the RCK 4118 terminal will be disabled by OE2 to not output RCK 826 signals to the controller 4208.

Only the addressed target circuit will be enabled to output on its TDO 4114 and RCK 4118 terminals. The TDO 4114 and RCK 4118 terminals of non-addressed target circuits will be disabled, via control signals OE1 and OE2 to buffers 4106 and 4110, so that only the addressed target device is enabled to drive the TDO and RCK signal connections to the controller 4208.

Figure 43:
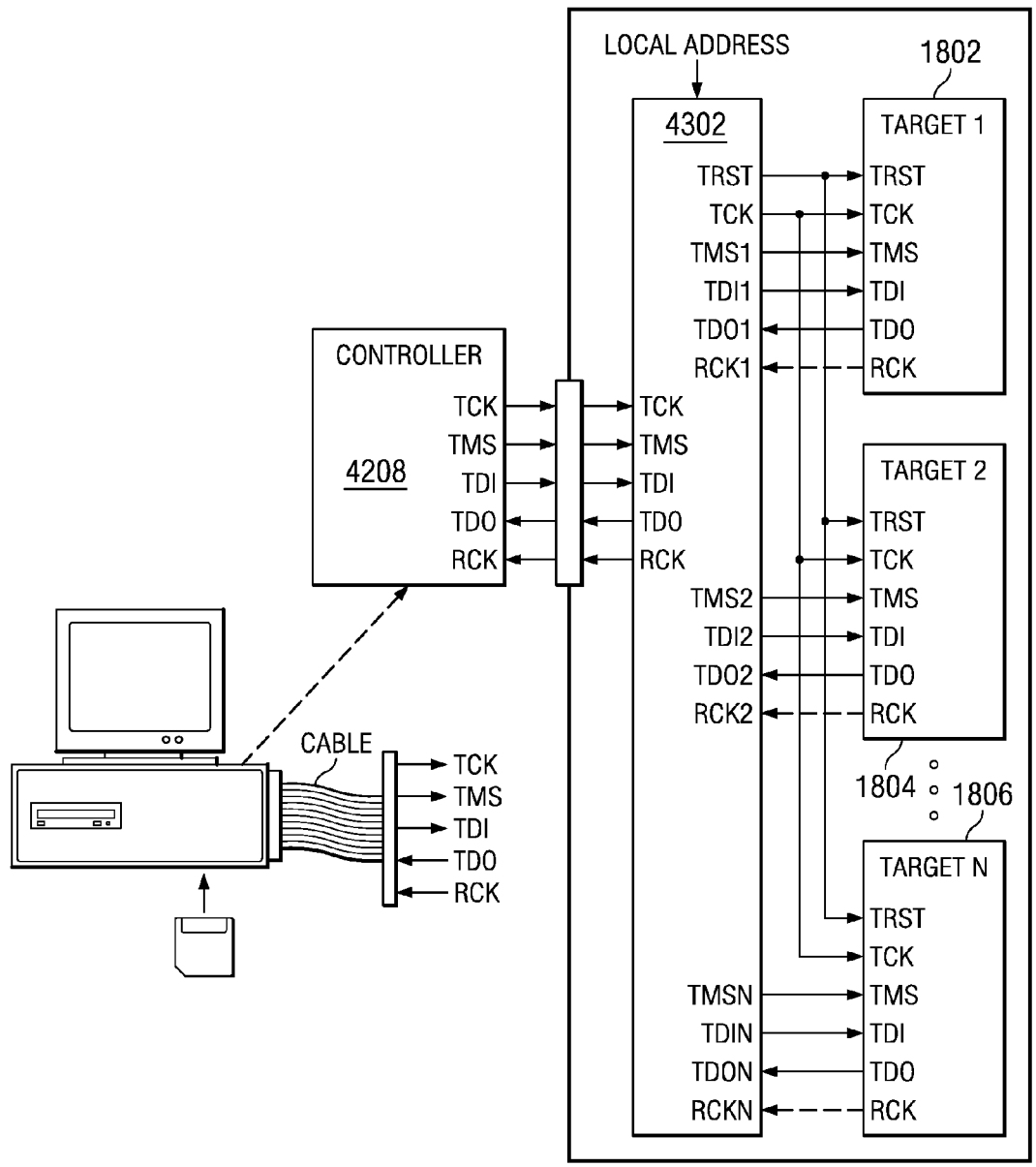
FIG. 43 illustrates the legacy target devices of FIG. 18, each including the standard IEEE 1149.1 TRST, TCK, TMS, TDI, and TDO terminals, and optionally the non-standard RCK terminal.

FIG. 43 illustrates the legacy target devices 1802-1806 of FIG. 18, each including the standard IEEE 1149.1 TRST, TCK, TMS, TDI, and TDO terminals, and optionally the non-standard RCK terminal. The legacy target devices could be ICs 1802-1806 on a board or other substrate 4300, embedded core circuits 1802-1806 within an IC 4300, or embedded core circuits 1802-1806 within a core circuit 4300.

As seen, a separate device 4302 exists between the legacy target devices 1802-1806 and the external controller 4208. This separate device 4302 implements the Addressable Tap Domain Selection Circuit 4102 of FIG. 41 and operates according the previously described first, second, and third protocols. It also includes the previously described local and global addressing modes. The local address is shown, in this example, as being input to the separate device 4302 on externally accessible terminals of device 4302. The separate device 4302 serves to provide the interface between the JTAG plus RCK interface of each legacy target device and the 5 signal interface to the external controller 4208. The operation of the separate device 4302 in accessing the legacy device Tap Domains is the same as described in FIG. 41 where the Addressable Tap Domain Selection Circuit 4102 was described accessing the Tap Domains 510 of Tap Region 522.

The arrangement shown in FIG. 43 could represent the legacy target devices 1802-1806 and separate device 4302 as being; (1) ICs/die on a board or substrate 4300, embedded core circuits within an IC 4300, or (3) embedded core circuits within a core circuit 4300. FIG. 43 advantageously illustrates how legacy devices designed using the conventional IEEE 1149.1 interface and optional RCK can be interfaced to the 5 signal controller 4208 by providing the Addressable Tap Selection Circuit 4102 as a separate circuit to serve as the interface between the legacy devices 1802-1806 and external controller 4208. As described for separate circuit 1808 of FIG. 18, the separate circuit 4302 could contain only the Addressable Tap Domain Selection Circuit 4102 or it could contain the Addressable Tap Domain Selection Circuit 4102 along with other circuits.

There may be instances where it may be desirable to select between using a 5 signal interface to an Addressable Tap Domain Selection circuit as shown FIG. 41 and a 3 signal interface to an Addressable Tap Domain Selection circuit as shown in FIG. 8. For example, for test operations it may be advantageous to use the 5 signal interface to enable standard JTAG communication from pre-existing JTAG controllers and testers designed to operate according to the standard JTAG interface and optional non-standard RCK signal. On the other hand, it may be advantageous to use the 3 signal interface during debug, emulation, and trace operations so that unused signals of the 5 signal interface may be used for other purposes.

Figure 44:
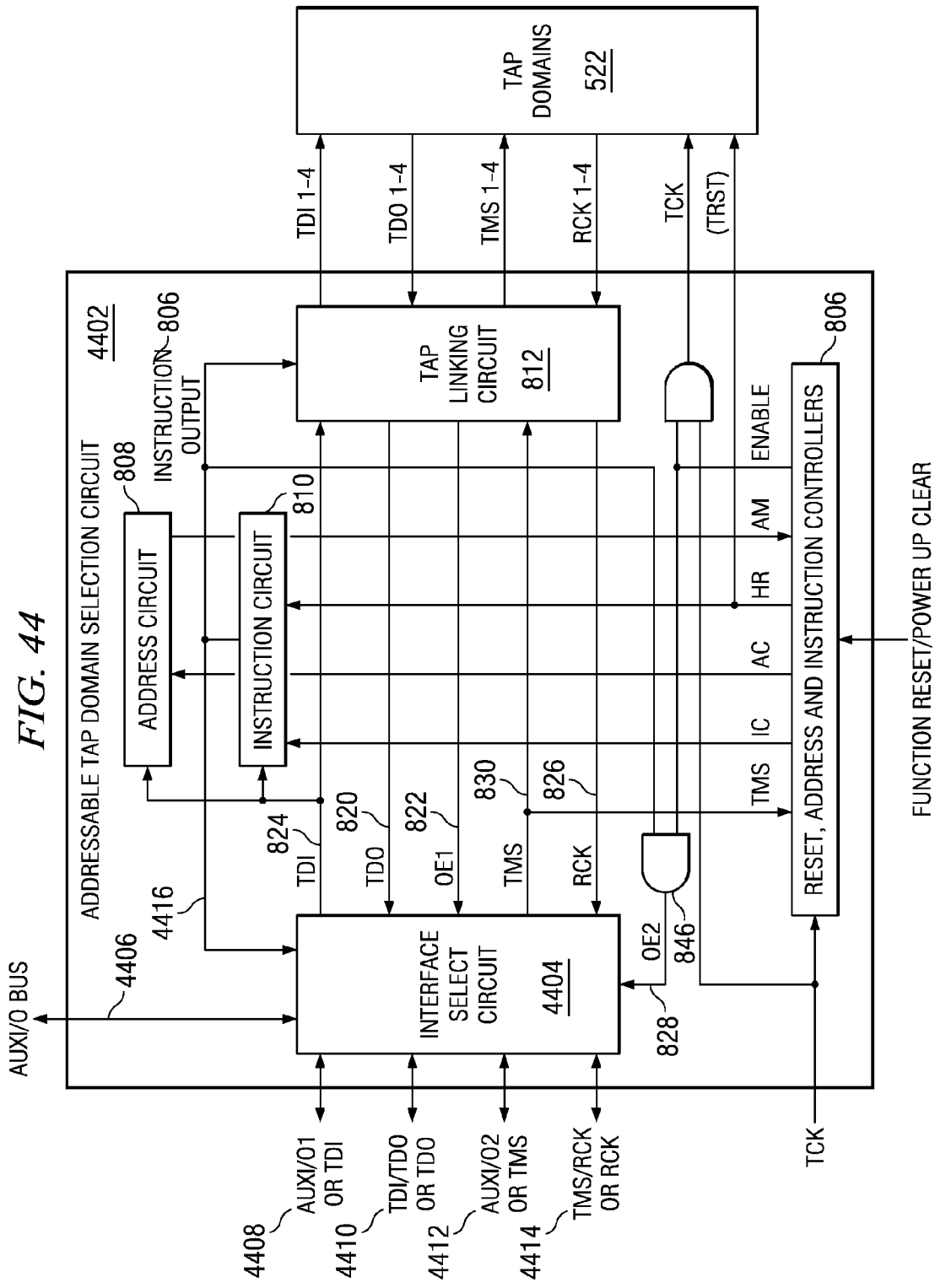
FIG. 44 illustrates an Addressable Tap Domain Selection circuit that has been designed in an IC or core to selectively use either the 5 signal interface of FIG. 41 or the 3 signal interface of FIG. 8.

FIG. 44 illustrates an Addressable Tap Domain Selection circuit 4402 that has been designed in an IC or core to selectively use either the 5 signal interface of FIG. 41 or the 3 signal interface of FIG. 8. The Addressable Tap Domain Selection circuit 4402 is the same as that described in FIGS. 8 and 41 with the exception that an Interface Select Circuit 4404 has been substituted for the I/O circuits 802 and 804 of FIG. 8 and the input and output buffers 4104-4110 of FIG. 41. The Interface Select Circuit 4404 has input terminals for receiving control 4416 from the instruction output bus, TDO signal 820, OE1 signal 822, RCK signal 826, and OE2 signal 828. The Interface Select Circuit 4404 has output terminals for outputting TDI signal 824 and TMS signal 830. The Interface Select Circuit 4404 has input and output terminals for an auxiliary I/O bus (AUXI/O) 4406. The interface Select circuit 4404 has I/O terminals for an "AUXI/O1 or TDI" signal 4408, "TDI/TDO or TDO" signal 4410, "AUXI/O2 or TMS" signal 4412, and "TMS/RCK or RCK" signal 4414.

The function of the Interface Select Circuit 4402 is to respond to control inputs 4416 from the instruction register output bus to operate as either a 5 signal interface or as a 3 signal interface to the Addressable Tap Domain Selection Circuit 4402.

If 5 signal interface operation is selected, the "AUXI/O1 or TDI" signal 4408 will operate as TDI 4112 of FIG. 41, the "TDI/TDO or TDO" signal 4410 will operate as TDO signal 4114 of FIG. 41, the "AUXI/O2 or TMS" signal 4412 will operate as TMS signal 4116 of FIG. 41, and the "TMS/RCK or RCK" signal 4414 will operate as RCK signal 4118 of FIG. 41.

If 3 signal interface operation is selected, the "AUXI/O1 or TDI" signal 4408 will operate as an auxiliary input or output signal, the "TDI/TDO or TDO" signal 4410 will operate as TDI/TDO signal 520 of FIG. 8, the "AUXI/O2 or TMS" signal 4412 will operate as an auxiliary input or output signal, and the "TMS/RCK or RCK" signal 4414 will operate as TMS/RCK signal 518 of FIG. 8.

When the instruction register 810 is reset, at power up or following a hard reset first protocol, it will output control 4416 to select either the 3 or 5 signal interface to the Addressable Tap Domain Selection circuit 4402. Since the IEEE 1149.1 standard requires that its interface be enabled to operate following a reset or power up event, the 5 signal interface is preferably the interface selected by the instruction register 810 following reset or power up. However, while the 5 signal interface is preferred for consistency to the IEEE 1149.1 standard, users of the present disclosure may select the 3 signal interface at reset/power up as well.

Figure 45:
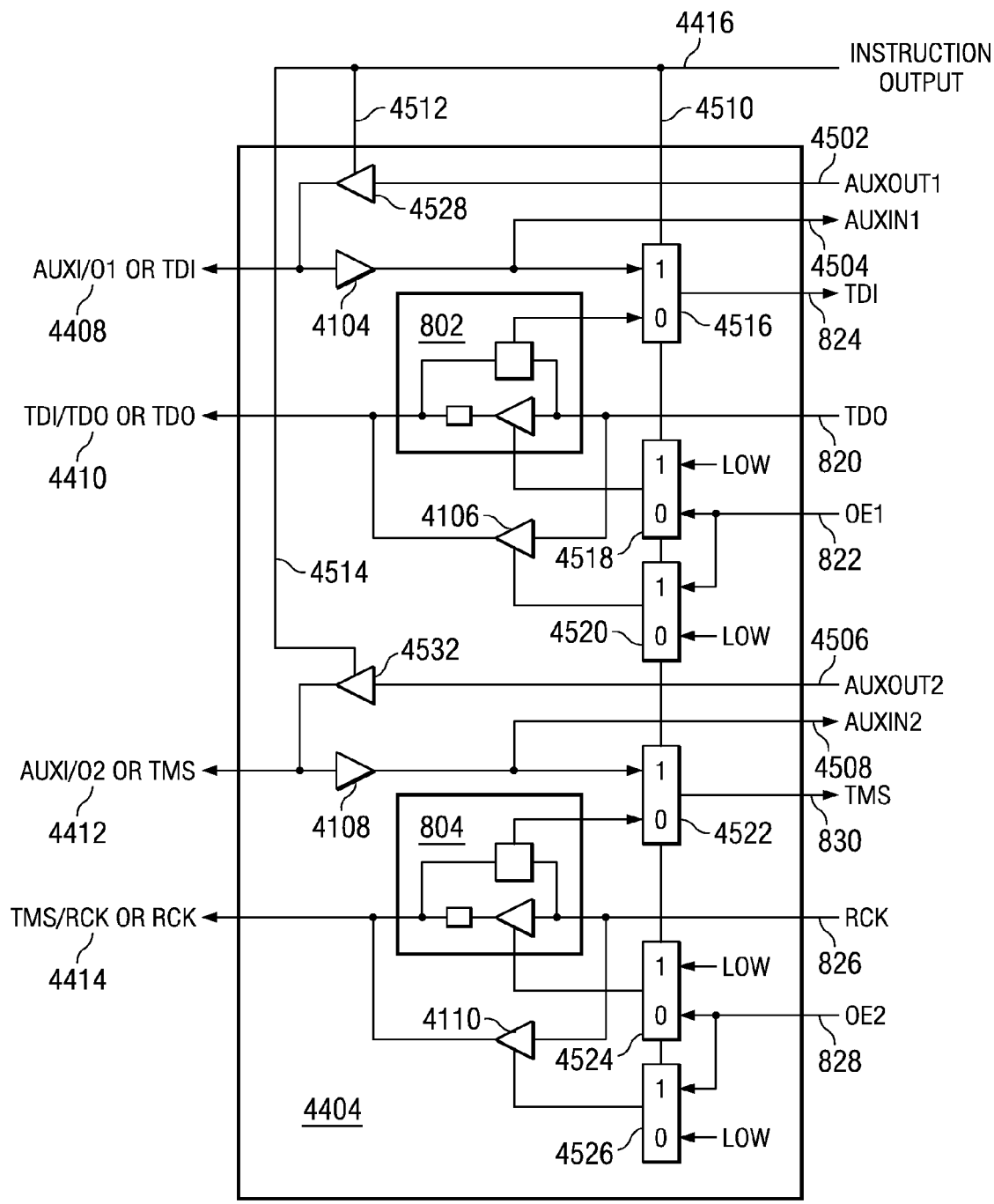
FIG. 45 illustrates an example design of the Interface Select Circuit of FIG. 44.

FIG. 45 illustrates an example of how the Interface Select Circuit 4404 may be designed. The Interface Select Circuit includes I/O circuits 802 and 804 of FIG. 8, TDO output buffer 4106 and TMS output buffer 4110 of FIG. 41, multiplexers 4516-4526, I/O buffers 4528 and 4104, and I/O buffers 4532 and 4108.

TDO 820 is coupled to an input of I/O circuit 802 and to the input of buffer 4106. "TDI/TDO or TDO" 4410 is coupled to an output of I/O circuit 802 and to the output of buffer 4106. TDI 824 is coupled, via multiplexer 4516, to either an output of I/O circuit 802 or to the output of buffer 4104. "AUXI/O1 or TDI" 4408 is coupled to the input of buffer 4104 and to the output of buffer 4528. OE1 822 is coupled to the control input of buffer 814 of I/O circuit 802 via multiplexer 4518 and to the control input of buffer 4106 via multiplexer 4520.

RCK 826 is coupled to an input of I/O circuit 804 and to the input of buffer 4110. "TMS/RCK or RCK" 4414 is coupled to an output of I/O circuit 804 and to the output of buffer 4110. TMS 830 is coupled, via multiplexer 4522, to either an output of I/O circuit 804 or buffer 4108. "AUXI/O2 or TMS" 4412 is coupled to the input of buffer 4108 and to the output of buffer 4532. OE2 828 is coupled to the control input of buffer 814 of I/O circuit 804 via multiplexer 4524 and to the control input of buffer 4110 via multiplexer 4526.

The output of buffer 4104 is coupled to an auxiliary input 1 (AUXIN1) signal 4504. The input of buffer 4528 is coupled to an auxiliary output 1 (AUXOUT1) signal 4502. The output of buffer 4528 is coupled to "AUXI/O1 or TDI" 4408. The control input of buffer 4528 is coupled to control signal 4512 from instruction control bus 4416.

The output of buffer 4532 is coupled to an auxiliary input 2 (AUXIN2) signal 4508. The input of buffer 4532 is coupled to an auxiliary output 2 (AUXOUT2) signal 4506. The output of buffer 4532 is coupled to "AUXI/O2 or TMS" 4412. The control input of buffer 4532 is coupled to control signal 4514 from instruction control bus 4416.

The select input of multiplexers 4516-4526 is coupled to control signal 4510 from instruction control bus 4416. A low on control signal 4510 enables the 3 signal interface mode of Interface Select Circuit 4404, and a high on control signal 4510 enables the 5 signal interface mode of Interface Select Circuit 4404.

While control signal 4510 is high, multiplexer 4516 couples TDO 824 to the output of buffer 4104, multiplexer 4518 couples OE1 822 to the control input of buffer 4106, multiplexer 4520 couples a low (disable) signal to the control input of I/O circuit 802, multiplexer 4522 couples TMS 830 to the output of buffer 4108, multiplexer 4524 couples OE2 828 to the control input of buffer 4110, and multiplexer 4526 couples a low (disable) signal to the control input of I/O circuit 804. In this mode, the Interface Select Circuit 4404 enables the 5 signal interface to operate the Addressable Tap Domain Selection Circuit 4402 as described in FIG. 41. That is to say the "AUXI/O1 or TDI" 4408 signal operates as the TDI signal 4112 of FIG. 41, the "TDI/TDO or TDO" 4410 signal operates as the TDO 4114 signal of FIG. 41, the "AUXI/O2 or TMS" signal 4412 operates as the TMS signal 4116 of FIG. 41, and the "TMS/RCK or RCK" 4414 signal operates as the RCK 4118 signal of FIG. 41.

While control signal 4510 is low, multiplexer 4516 couples TDO 824 to the output of I/O circuit 802, multiplexer 4518 couples OE1 822 to the control input of I/O circuit 802, multiplexer 4520 couples a low (disable) signal to the control input of buffer 4106, multiplexer 4522 couples TMS 830 to the output of I/O circuit 804, multiplexer 4524 couples OE2 828 to the control input of I/O circuit 804, and multiplexer 4526 couples a low (disable) signal to the control input of buffer 4110. In this mode, the Interface Select Circuit 4404 enables the 3 signal interface to operate the Addressable Tap Domain Selection Circuit 4402 as described in FIG. 8. That is to say the "TDI/TDO or TDO" 4410 signal operates as the TDI/TDO 520 signal of FIG. 8 and the "TMS/RCK or RCK" 4414 signal operates as the TMS/RCK 518 signal of FIG. 8.

While control signal 4510 is low, selecting the 3 signal interface mode of operation, the "AUXI/O1 or TDI" signal 4408 can be used as an input, if control signal 4512 is set to disable buffer 4528, to transmit a signal to the AUXIN1 signal 4504 output. Alternately, if control signal 4512 is set to enable buffer 4528, the "AUXI/O1 or TDI" signal 4408 can be used as an output to transmit a signal from the AUXOUT1 signal 4502 input.

While control signal 4510 is low, selecting the 3 signal interface mode of operation, the "AUXI/O2 or TMS" signal 4412 can be used as an input, if control signal 4514 is set to disable buffer 4532, to transmit a signal to the AUXIN2 signal 4508 output. Alternately, if control signal 4514 is set to enable buffer 4532, the "AUXI/O2 or TMS" signal 4412 can be used as an output to transmit a signal from the AUXOUT2 signal 4506 input.

Figure 46:
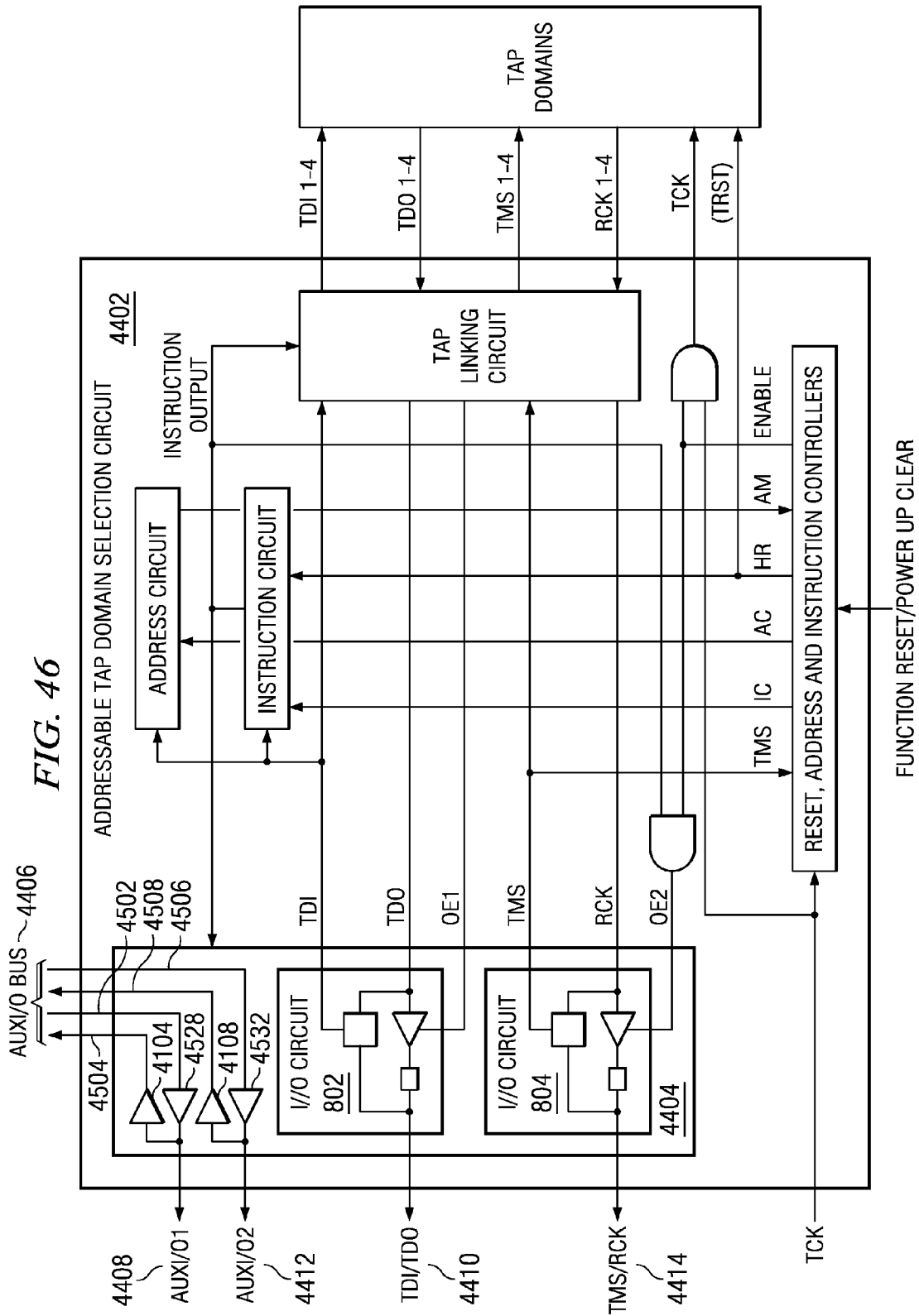
FIG. 46 illustrates an example of the configuration of the Interface Select Circuit when it is in the 3 signal interface mode.

FIG. 46 illustrates an example of the configuration of the Interface Select Circuit 4404 when it is in the 3 signal interface mode. In this mode, the Interface Select Circuit 4404 is configured to access the Addressable Tap Domain Selection Circuit 4402 using the 3 signals "TDI/TDO or TDO" 4410 (named simply TDI/TDO), "TMS/RCK or RCK" 4414 (named simply TMS/RCK), and TCK 516 as described in FIG. 8. Since "AUXI/O1 or TDI" 4408 (named simply AUXI/O1) and "AUXI/O2 or TMS" 4412 (named simply AUXI/O2) are not used as interface signals, they are shown being used for auxiliary input or output signals to AUXI/O bus 4406. As seen in FIGS. 45 and 46, AUXI/O1 4408 can be programmed by instruction control input 4512 of control bus 4416 to be an output for AUXOUT1 4502 or an input for AUXIN1 4504. Likewise, AUXI/O2 4412 can be programmed by instruction control input 4514 of control bus 4416 to be an output for AUXOUT2 4506 or an input for AUXIN2 4508. The AUXIN1 4504, AUXOUT1 4502, AUXIN2 4508, and AUXOUT2 4506 signals may be data signals, control signals, interrupt signals, triggering signals, or other types of signals that may be necessary to during test, debug, emulation, and/or trace operations using the 3 signal interface.

Figure 47:
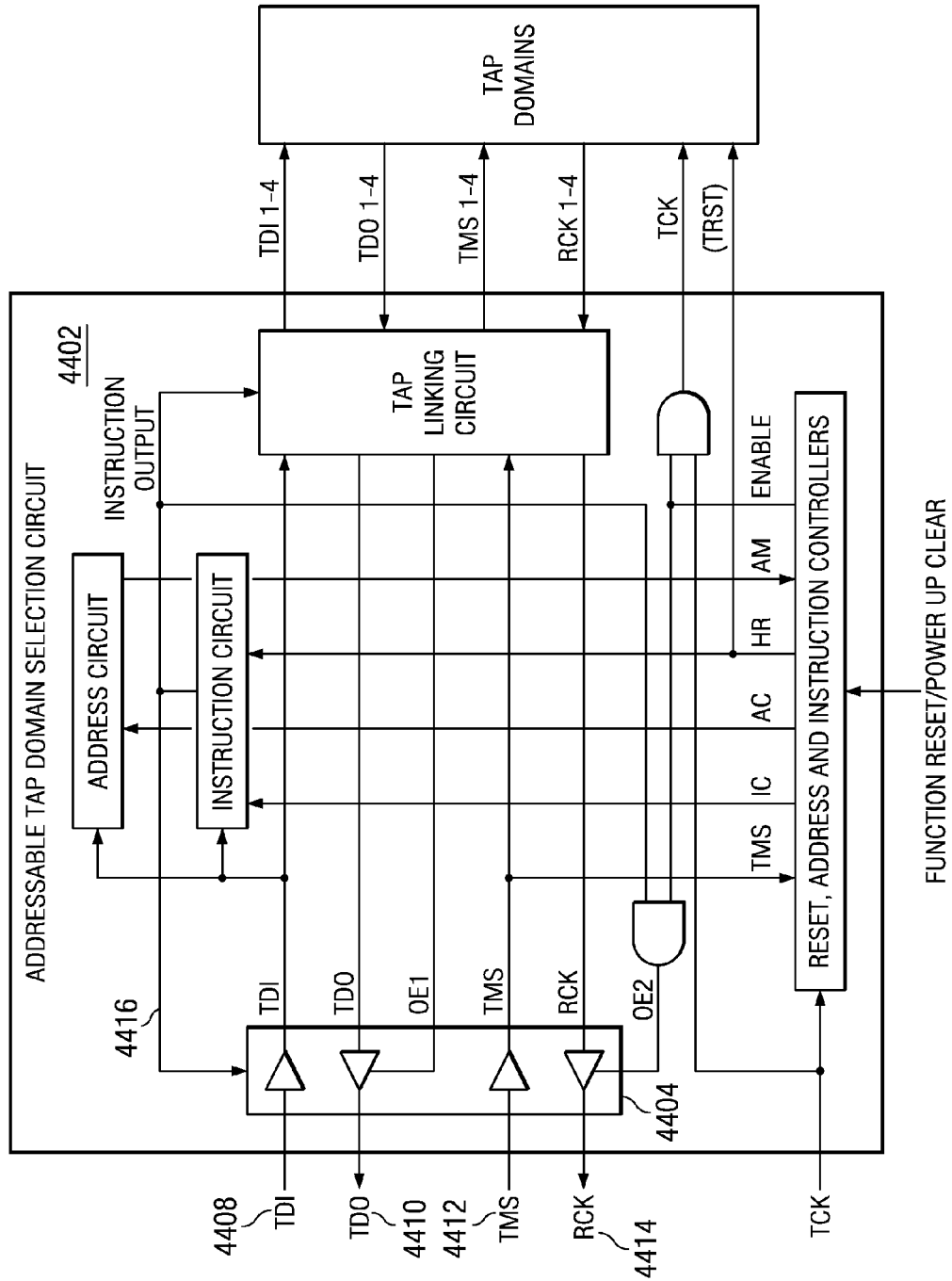
FIG. 47 illustrates an example of the configuration of the Interface Select Circuit when it is in the 5 signal interface mode.

FIG. 47 illustrates an example of the configuration of the Interface Select Circuit 4404 when it is in the 5 signal interface mode. In this mode, the Interface Select Circuit 4404 is configured to access the Addressable Tap Domain Selection Circuit 4402 using the 5 signals "AUXI/O1 or TDI" 4408 (named simply TDI), "TDI/TDO or TDO" 4410 (named simply TDO), "AUXI/O2 or TMS" 4412 (named simply TMS), "TMS/RCK or RCK" 4414 (named simply RCK), and TCK as described in FIG. 41. As seen, since "AUXI/O1 or TDI" 4408 (named simply TDI) and "AUXI/O2 or TMS" 4412 (named simply TMS) are used as interface signals, they cannot be used for auxiliary I/O signals as they were in FIG. 45.

Figure 48:
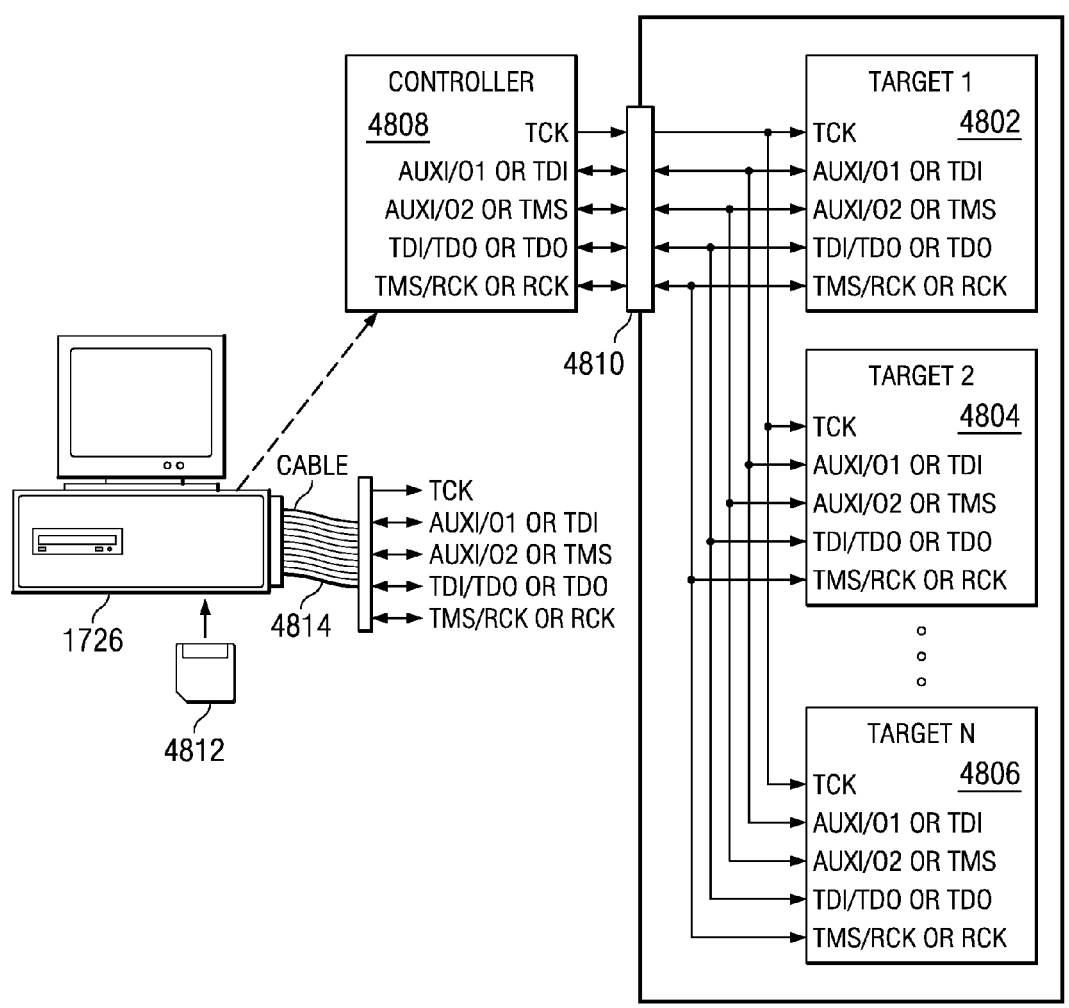
FIG. 48 illustrates a group of target devices on a board or other substrate, each target device including the Addressable Tap Domain Selection Circuit of FIG. 44 and its selectable 3 or 5 pin interface.

FIG. 48 illustrates a group of target devices 4204-4208 on a board or other substrate 4800, each target device including the Addressable Tap Domain Selection Circuit 4402 of FIG. 44 and its selectable 3 or 5 pin interface, as well as Tap Domain Region 522. The selectable 3/5 pin interface of each target device is coupled to an external controller 4808 via cable connector 4810 to provide access for test, debug, emulation, trace, and/or auxiliary I/O operations. Each target device 4802-4806 may contain embedded core target circuits as described in FIG. 17, which also are interfaced to the external controller 4808 via the selectable 3/5 pin interface. As indicated, the external controller 4808 may be realized by using an interface card 4812 in a personal computer 1726 to control the selectable 3/5 pin interface communication with the targets 4802-4806 via a cable connection 4814. The interface card 4812 is designed to communicate to the targets using either the 3 or 5 pin interface. The PC 1726 contains software for controlling the card 4812 to access the targets using either the 3 and 5 pin interface, and to switch the targets from operating in the 3 pin interface mode to the 5 pin interface mode, and from operating in the 5 pin interface mode to the 3 pin interface mode. The card 4814 is designed to interface with the auxiliary I/O signals of target circuits when the 3 pin interface mode is selected, and the PC 1726 contains software for comprehending auxiliary I/O signaling from the targets.

Each target 4802-4806 has the previously mentioned local address to allow it to be individually addressed and instructed by the controller 4808 using the second protocol in either the 3 or 5 pin interface modes. Following the individual addressing and instructing of a target using the second protocol, the Tap Domains 510 within the target may be accessed by the controller 4808 using the third protocol in either the 3 or 5 pin interface mode to perform test, debug, emulation, trace, and/or auxiliary I/O operations. Additionally, each target has the previously mentioned global address to allow all targets to be simultaneously addressed and instructed using the second protocol in either the 3 or 5 pin interface mode for the purposes previously mentioned in regard to FIG. 17.

The controller 4808 may selectively switch the target circuits 4802-4806 from operating in either the 3 or 5 pin interface mode by issuing a global address to all targets, then loading an instruction into all targets that cause all targets to switch from their current interface mode to the other interface mode. For example, if all targets are operating in the 5 pin interface mode they can be switched to the 3 pin interface mode by the controller issuing a global address followed by an instruction that selects the 3 pin interface mode of the targets. Likewise, if all targets are operating in the 3 pin interface mode they can be switched to the 5 pin interface mode by the controller issuing a global address followed by an instruction that selects the 5 pin interface mode of the targets.

Figure 49:
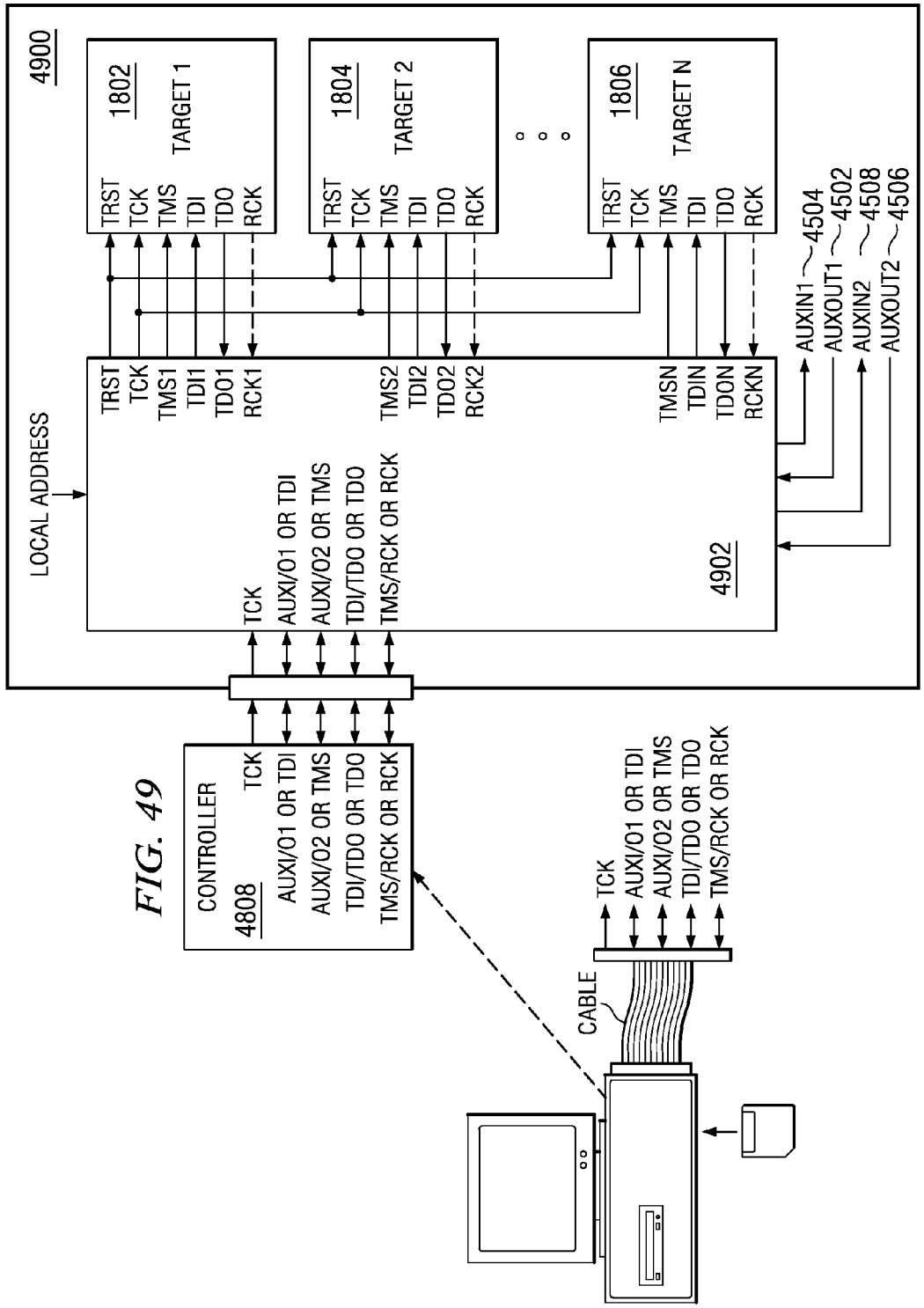
FIG. 49 illustrates the legacy target devices of FIG. 18, each including the standard IEEE 1149.1 TRST, TCK, TMS, TDI, and TDO terminals, and optionally the non-standard RCK terminal and the Addressable Tap Domain Selection Circuit of FIG. 44 operating in either the 3 or 5 signal interface mode.

FIG. 49 illustrates the legacy target devices 1802-1806 of FIG. 18, each including the standard IEEE 1149.1 TRST, TCK, TMS, TDI, and TDO terminals, and optionally the non-standard RCK terminal. The legacy target devices could be ICs 1802-1806 on a board or other substrate 4900, embedded core circuits 1802-1806 within an IC 4900, or embedded core circuits 1802-1806 within a core circuit 4900.

As seen, a separate device 4902 exists between the legacy target devices 1802-1806 and the external controller 4808. This separate device 4902 implements the Addressable Tap Domain Selection Circuit 4402 of FIG. 44 and operates in either the 3 or 5 signal interface mode according the previously described first, second, and third protocols. It also includes the previously described local and global addressing modes. The local address is shown, in this example, as being input to the separate device 4902 on externally accessible terminals of device 4902. The separate device 4902 serves to provide the interface between the standard IEEE 1149.1 (plus optional RCK) interface of each legacy target device and the selectable 3 or 5 signal interface to the external controller 4808. The operation of the separate device 4902 in accessing the legacy device Tap Domains is the same as described in FIGS. 44-47 where the Addressable Tap Domain Selection Circuit 4402 was described accessing the Tap Domains 510 of Tap Region 522.

The arrangement shown in FIG. 49 could represent the legacy target devices 1802-1806 and separate device 4902 as being; (1) ICs/die on a board or substrate 4900, embedded core circuits within an IC 4900, or (3) embedded core circuits within a core circuit 4900. FIG. 49 advantageously illustrates how legacy devices designed using the conventional IEEE 1149.1 interface and optional RCK can be interfaced to the selectable 3 or 5 signal interface controller 4808 by providing the Addressable Tap Selection Circuit 4402 as a separate circuit to serve as the interface between the legacy devices 1802-1806 and external controller 4808. As described for separate circuits 1808 and 4302 of FIGS. 18 and 432, the separate circuit 4902 could contain only the Addressable Tap Domain Selection Circuit 4402 or it could contain the Addressable Tap Domain Selection Circuit 4402 along with other circuits.

As seen in FIG. 49, the Addressable Tap Selection Circuit 4402 of separate circuit 4902 has terminals for connecting to auxiliary I/O signals 4502-4508. Thus when separate circuit 4902 is set to operate in the 3 signal interface mode, the "AUXI/O1 or TDI" signal 4408 and the "AUXI/O2 or TMS" signal 4412 can be used for communicating auxiliary I/O signals between a further circuit on assembly 4900 and the controller 4808. The further circuit could be one or more of the target circuits 1802-1806, or a circuit separate from target circuits 1802-1806. The further circuit could also be a circuit contained within separate circuit 4902.

Although the present disclosure has been described in detail, it should be understood that various changes, substitutions and alterations may be made without departing from the spirit and scope of the disclosure as defined by the appended claims.

What is claimed is:

1. An integrated circuit comprising:
  A. plural TAP domains, each domain having a TDI input terminal, a TDO output terminal, a TCK input terminal, a TMS input terminal, and a RCK output terminal; and
  B. a TAP domain selection circuit, the selection circuit having a separate set of outputs and at least one input for each TAP domain, each set including a TDI output connected to a TDI input terminal, a TDO input connected to a TDO output terminal, a TCK output connected to a TCK input terminal, a TMS output connected to a TMS input terminal, and a RCK input connected to a RCK output terminal, the selection circuit including an interface select circuit including:
    i. an instruction control bus input;
    ii. a RCK input lead coupled to the RCK output of each set;
    iii. an Output Enable 2 input lead;
    iv. a TMS/RCK or RCK lead;

v. an I/O circuit having an input connected to the RCK input lead, a control input, and an output connected to the TMS/RCK or RCK lead;
vi. a first buffer having an input connected to the RCK input lead, a control input, and an output connected to the TMS/RCK or RCK lead;
vii. a first multiplexer having an input connected to the Output Enable 2 input lead, an input connected to a fixed logic state, a control input connected to the instruction control bus input, and an output connected to the control input of the I/O circuit; and
viii. a second multiplexer having an input connected to the Output Enable 2 input lead, an input connected to a fixed logic state, a control input connected to the instruction control bus input, and an output connected to the control input of the first buffer.

2. The integrated circuit of claim 1 in which the input connected to a fixed logic state of the first multiplexer is connected to a low logic state.

3. The integrated circuit of claim 1 in which the input connected to a fixed logic state of the second multiplexer is connected to a low logic state.

* * * * *